United States Patent
Kang et al.

(10) Patent No.: US 12,017,453 B2
(45) Date of Patent: Jun. 25, 2024

(54) INKJET PRINTING DEVICE, METHOD FOR PRINTING BIPOLAR ELEMENTS, AND METHOD FOR MANUFACTURING DISPLAY DEVICE

(71) Applicant: Samsung Display Co., LTD., Yongin-si (KR)

(72) Inventors: Jong Hyuk Kang, Suwon-si (KR); Jin Oh Kwag, Yongin-si (KR); Won Hee Nam, Hwaseong-si (KR); Suk Beom You, Anyang-si (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 122 days.

(21) Appl. No.: 17/802,897

(22) PCT Filed: Jun. 8, 2020

(86) PCT No.: PCT/KR2020/007391
§ 371 (c)(1),
(2) Date: Aug. 26, 2022

(87) PCT Pub. No.: WO2021/172662
PCT Pub. Date: Sep. 2, 2021

(65) Prior Publication Data
US 2023/0145433 A1    May 11, 2023

(30) Foreign Application Priority Data
Feb. 26, 2020 (KR) .................. 10-2020-0023612

(51) Int. Cl.
*B41J 2/045* (2006.01)
*B41J 2/11* (2006.01)
(Continued)

(52) U.S. Cl.
CPC ............. *B41J 2/04593* (2013.01); *B41J 2/11* (2013.01); *B41J 2/14* (2013.01); *B41J 2/17596* (2013.01); *B41J 2002/14491* (2013.01)

(58) Field of Classification Search
CPC .......... B41J 2/04541; B41J 2002/14491; B41J 2/14; B41J 2/11; B41J 2/04561;
(Continued)

(56) References Cited

U.S. PATENT DOCUMENTS 9,168,737 B1    10/2015 Oi
2018/0138157 A1*    5/2018 Im ....................... H01L 25/0753

FOREIGN PATENT DOCUMENTS

EP    3 270 424    1/2018
JP    4344270    10/2009
(Continued)

OTHER PUBLICATIONS

International Search Report, with English translation, corresponding to International Application No. PCT/KR2020/007391, dated Nov. 25, 2020.
(Continued)

*Primary Examiner* — Jannelle M Lebron
(74) *Attorney, Agent, or Firm* — KILE PARK REED & HOUTTEMAN PLLC

(57) ABSTRACT

Provided are an inkjet printing device, a method for printing bipolar elements, and a method for manufacturing a display device. The inkjet printing device includes an inkjet head disposed above a stage and including a plurality of nozzles through which ink including bipolar elements each having areas doped with partially different polarities is discharged; an actuator disposed in the inkjet head and adjusting an amount of droplet of the ink discharged through the plurality of nozzles; and at least one sensing part disposed in the
(Continued)

inkjet head and measuring a number of bipolar elements discharged through the plurality of nozzles.

22 Claims, 38 Drawing Sheets

(51) Int. Cl.
*B41J 2/14* (2006.01)
*B41J 2/175* (2006.01)

(58) Field of Classification Search
CPC ...... B41J 2202/09; B41J 2/125; B41J 29/393; B41J 2/04586; B41J 2/0456; B41J 2/1433; B41J 2/06; B41J 2/01; B41J 2/085; B41J 2/04535; B41J 2/14072
See application file for complete search history.

(56) References Cited

FOREIGN PATENT DOCUMENTS

| | | |
|---|---|---|
| JP | 2010-36548 | 2/2010 |
| KR | 10-2006-0034870 | 4/2006 |
| KR | 10-2009-0110176 | 10/2009 |
| KR | 10-2017-0109719 | 10/2017 |
| KR | 10-2020-0079378 | 7/2020 |
| WO | 2019/117850 | 6/2019 |

OTHER PUBLICATIONS

Written Opinion, with English translation, corresponding to International Application No. PCT/KR2020/007391, dated Nov. 25, 2020.

Extended European Search Report for European Application No. 20921486.5, dated Feb. 12, 2024.

* cited by examiner

INKJET PRINTING DEVICE, METHOD FOR PRINTING BIPOLAR ELEMENTS, AND METHOD FOR MANUFACTURING DISPLAY DEVICE

CROSS REFERENCE TO RELATED APPLICATION(S)

This application is a national entry of International Application No. PCT/KR2020/007391, filed on Jun. 8, 2020, which claims under 35 U.S.C. §§ 119(a) and 365(b) priority to and benefits of Korean Patent Application No. 10-2020-0023612, filed on Feb. 26, 2020, in the Korean Intellectual Property Office (KIPO), the entire contents of which are incorporated herein by reference.

BACKGROUND

1. Technical Field

The disclosure relates to an inkjet printing device, a method for printing bipolar elements, and a method for manufacturing a display device.

2. Description of the Related Art

The importance of display devices has steadily increased with the development of multimedia technology. In response thereto, various types of display devices such as an organic light emitting display (OLED), a liquid crystal display (LCD), and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

Aspects of the disclosure provide an inkjet printing device including a uniform number of bipolar elements per unit droplet of a discharged ink.

Aspects of the disclosure also provide a method for printing bipolar elements capable of keeping the number of bipolar elements dispersed in a unit droplet constant using an inkjet printing device, and a method for manufacturing a display device including light emitting elements.

It should be noted that aspects of the disclosure are not limited thereto and other aspects, which are not mentioned herein, will be apparent to those of ordinary skill in the art from the following description.

SUMMARY

According to an embodiment of the disclosure, an inkjet printing device may include an inkjet head positioned above a stage and including a plurality of nozzles through which ink including bipolar elements having areas doped with partially different polarities is discharged, an actuator disposed on the inkjet head and adjusting an amount of droplet of the ink discharged through the plurality of nozzles; and at least one sensing part disposed on the inkjet head and measuring a number of bipolar elements discharged through the plurality of nozzles.

The inkjet head may include a base part, a discharge part disposed on the base part, and an inner pipe to which the ink is supplied. The plurality of nozzles may be disposed on the discharge part, the ink may be supplied to and may flow in the inner pipe, and the ink may be discharged through the plurality of nozzles.

The at least one sensing part may include a first sensor measuring a magnetic force in the ink generated due to movement of the bipolar elements, and a second sensor transferring a signal based on the number of the bipolar elements calculated from the magnetic force measured by the first sensor to the actuator.

The actuator may receive the signal based on the number of bipolar elements measured by the at least one sensing part and adjust the amount of droplet of the ink discharged through the plurality of nozzles.

The at least one sensing part may be disposed at an inlet of the inner pipe to which the ink is supplied.

The inlet of the inner pipe may have a first portion and a second portion, a diameter of the first portion may be smaller than a diameter of the second portion, and the at least one sensing part may be disposed on the first portion of the inlet of the inner pipe.

The inkjet printing device may further include a sub-actuator disposed on the inkjet head and adjusting a diameter of the inner pipe. The sub-actuator may increase a flow velocity of the ink in the inner pipe.

The at least one sensing part may be disposed between an inlet of the inner pipe and the plurality of nozzles.

The at least one sensing part may be disposed on the discharge part.

The at least one sensing part may further include a light emitting part irradiating the bipolar elements with light.

The base part of the inkjet head may include a transparent material.

According to an embodiment of the disclosure, a method for printing bipolar elements, may include preparing ink in which a plurality of bipolar elements are dispersed, supplying the ink to an inkjet head, discharging the ink from the inkjet head, measuring a number of the plurality of bipolar elements in the discharged ink, and adjusting an amount of droplet of the discharged ink from the inkjet head in case that the number of the plurality of bipolar elements in the discharged ink exceeds a reference value.

The measuring of the number of the plurality of bipolar elements in the discharged ink may be performed by at least one sensing part disposed on the inkjet head, and the at least one sensing part may measure a magnetic force in the ink generated due to movement of the plurality of bipolar elements.

The adjusting of the amount of droplet of the discharged ink may include sensing a change in the number of the plurality of bipolar elements by the at least one sensing part, and adjusting the amount of droplet of the discharged ink per unit process based on the change in the number of the plurality of bipolar elements.

The ink discharged from the inkjet head may be provided onto a target substrate, and the method for printing bipolar elements may further include seating the plurality of bipolar elements on the target substrate.

A plurality of areas may be defined on the target substrate, and the amount of droplet of the discharged ink may be adjusted so that the numbers of the plurality of bipolar elements provided onto the areas may be uniform based on the sensed change in the number of the plurality of bipolar elements.

The measuring of the number of the plurality of bipolar elements in the discharged ink may be performed using an inkjet printing device. The inkjet printing device may include the inkjet head positioned above a stage and including a plurality of nozzles through which the ink including the plurality of bipolar elements having areas doped with partially different polarities is discharged, an actuator disposed on the inkjet head and adjusting the amount of droplet of the discharged ink through the plurality of nozzle. The at least one sensing part may measure the number of the plurality of bipolar elements discharged through the plurality of nozzles.

The actuator may adjust the amount of droplet of the ink discharged through the plurality of nozzles based on a change in the number of the plurality of bipolar elements measured by the at least one sensing part.

According to an embodiment of the disclosure, a method for manufacturing a display device may include preparing a target substrate including a plurality of areas divided from each other and having a first electrode and a second electrode, each of the first electrode and the second electrode disposed in one of the plurality of areas, discharging ink onto the plurality of areas while controlling an amount of droplet of the discharged ink based on a number of light emitting elements dispersed in the ink, and seating the light emitting elements on one of the first electrode and the second electrode.

The method may further include measuring the number of light emitting elements in the discharged ink, and controlling the number of light emitting elements in the discharged ink by adjusting the amount of droplet of the discharged ink in case that the number of the light emitting elements in the discharged ink exceeds a reference value.

The light emitting element may include a first semiconductor layer doped with a first polarity, a second semiconductor layer doped with a second polarity different from the first polarity, and an active layer disposed between the first semiconductor layer and the second semiconductor layer.

The measuring of the number of light emitting elements in the discharged ink may include measuring a magnetic force in the ink due to movement of the light emitting elements.

The details of other embodiments are included in the detailed description and the accompanying drawings.

The inkjet printing device according to an embodiment includes the sensing part capable of measuring the number of bipolar elements in the discharged ink. The sensing part may measure the number of bipolar elements included per unit volume of the ink flowing in the inkjet head through various methods. The sensing part may also sense a change in the number of bipolar elements while discharging the ink, and may feed the sensed change back to adjust the droplets of the ink discharged through the nozzle, thereby controlling the number of bipolar elements jetted onto the target substrate.

Accordingly, in the method for printing bipolar elements using the inkjet printing device according to an embodiment, the number of bipolar elements discharged to a unit space may be uniformly maintained, and in the display device including the light emitting elements manufactured using the inkjet printing device, light emission reliability for each pixel may be improved.

The effects according to the embodiments are not limited by the contents described above, and more various effects are included in this disclosure.

DETAILED DESCRIPTION OF THE EMBODIMENTS

Figure 1:
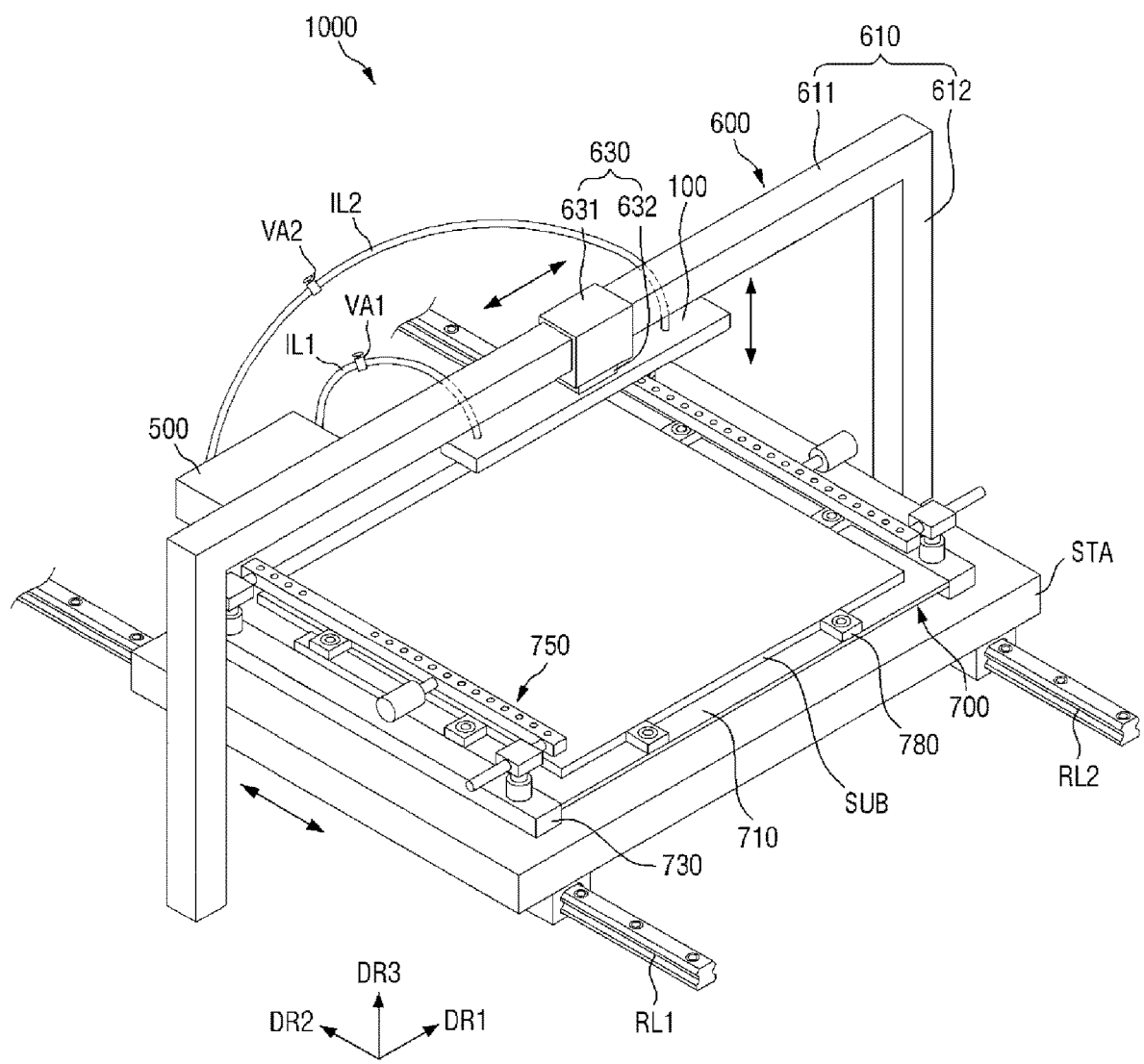
FIG. 1 is a perspective view of an inkjet printing device according to an embodiment.

The disclosure will now be described more fully hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

Figure 2:
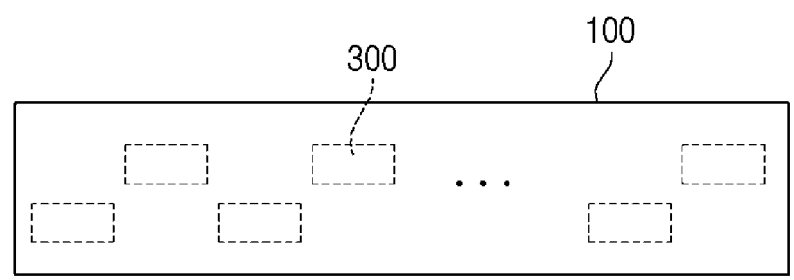
FIG. 2 is a schematic bottom view of a print head unit according to an embodiment.
Figure 2:
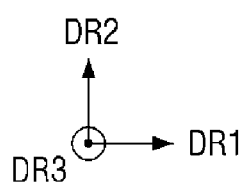
Figure 3:
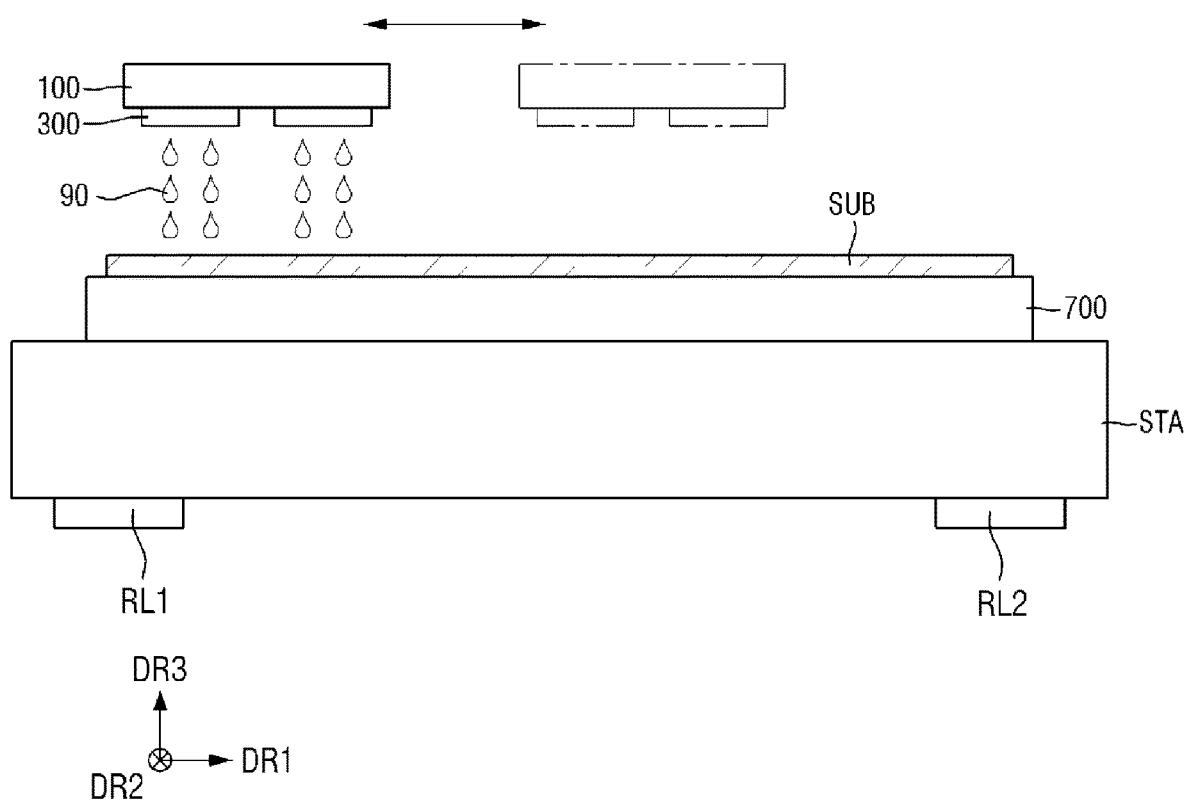
FIG. 3 is a schematic view illustrating an operation of the print head unit according to an embodiment.
Figure 4:
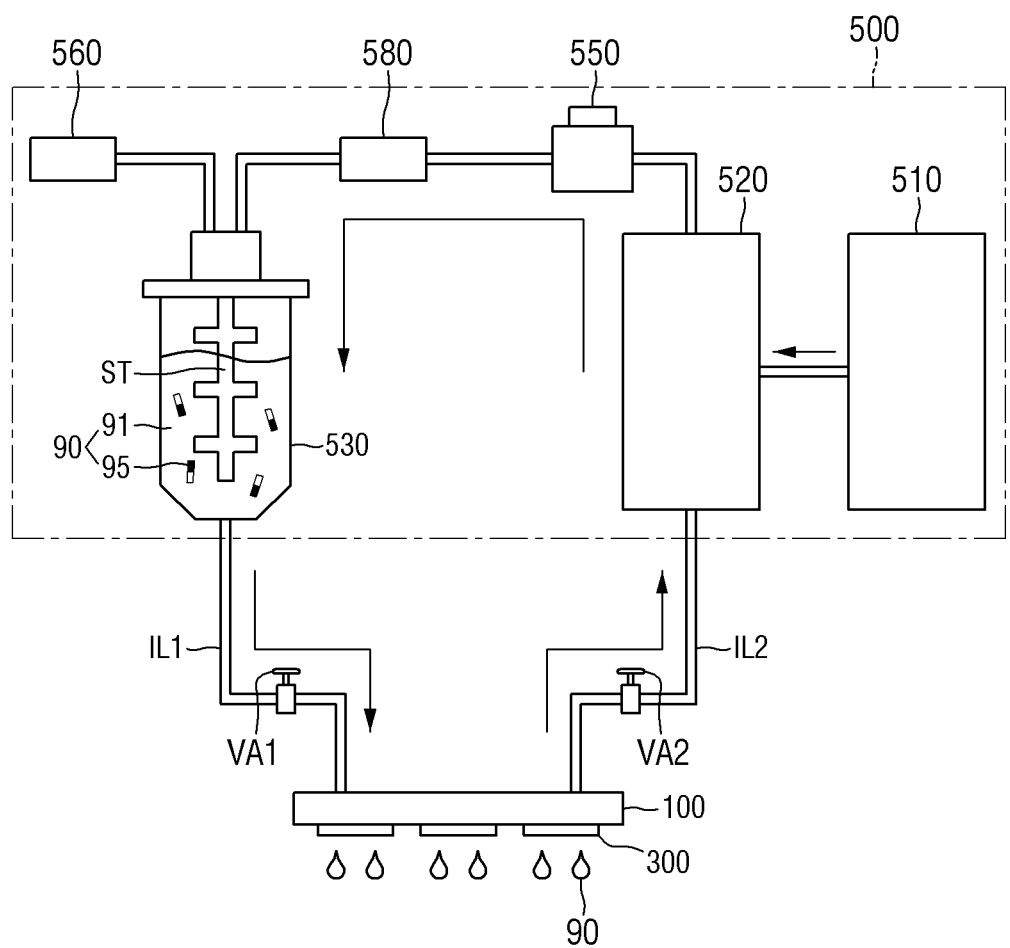
FIG. 4 is a schematic view illustrating an ink circulation unit and the print head unit according to an embodiment.

FIG. 1 is a perspective view of an inkjet printing device according to an embodiment. FIG. 2 is a schematic bottom view of a print head unit according to an embodiment. FIG. 3 is a schematic view illustrating an operation of the print head unit according to an embodiment. FIG. 4 is a schematic view illustrating an ink circulation unit and the print head unit according to an embodiment. FIG. 3 illustrates shapes of a print head unit 100 and the probe device 700 disposed on a stage STA in a front view according to an embodiment.

Referring to FIGS. 1 to 4, an inkjet printing device 1000 according to an embodiment may include a print head unit 100 including multiple inkjet heads 300. The inkjet printing device 1000 may further include a stage STA, an ink circulation unit 500, a probe device 700, and a base frame 600.

In FIG. 1, a first direction DR1, a second direction DR2, and a third direction DR3 are defined. The first direction DR1 and the second direction DR2 may be directions disposed on the same plane and may be perpendicular to each other, and the third direction DR3 may be a direction perpendicular to each of the first direction DR1 and the second direction DR2. It may be understood that the first direction DR1 may refer to a transverse direction in the drawing, the second direction DR2 may refer to a longitudinal direction in the drawing, and the third direction DR3 may refer to an upward or downward direction in the drawing.

The inkjet printing device 1000 may jet predetermined (or selectable) ink 90 onto a target substrate SUB using the print head unit 100. An electric field may be generated on the target substrate SUB onto which the ink 90 is jetted, by the probe device 700, and particles such as bipolar elements included in the ink 90 may be aligned on the target substrate SUB.

The target substrate SUB may be provided on the probe device 700, the probe device 700 may form the electric field on the target substrate SUB, and the electric field may be transferred to the ink 90 jetted onto the target substrate SUB. Particles such as bipolar elements 95 included in the ink 90 may have a shape extending in a direction, and may be aligned so that the direction in which they extend is directed to one direction by the electric field.

The inkjet printing device 1000 according to an embodiment may include an inkjet head 300 and a sensing part 400 (see FIG. 5) disposed in the inkjet head 300. The inkjet head 300 may jet, discharge, or print the ink 90 including the bipolar elements 95 on the target substrate SUB, and the sensing part 400 may detect the number of bipolar elements 95 in the ink 90 jetted or discharged from (or through) the inkjet head 300. The inkjet printing device 1000 may sense a change in the number of bipolar elements 95 in the discharged ink 90, and may feed the sensed change back to the inkjet head 300 to adjust droplets discharged from the inkjet head 300 so that the number of bipolar elements 95 discharged in a unit space may be uniformly maintained. Hereinafter, the inkjet printing device 1000 will be described in detail with reference to the drawings.

The stage STA may provide an area in which the probe device 700 is disposed. The inkjet printing device 1000 may include a first rail RL1 and a second rail RL2 extending in the second direction DR2, and the stage STA may be disposed on the first rail RL1 and the second rail RL2. The stage STA may move in the second direction DR2 on the first rail RL1 and the second rail RL2 through a separate moving member. The probe device 700 may move in the second direction DR2 together with the stage STA, and the ink 90 may be jetted onto the probe device 700 while the probe device 700 passes through the print head unit 100. However, the disclosure is not limited thereto. A structure in which the stage STA moves has been illustrated in the drawing, but in some embodiments, the stage STA may be fixed and the print head unit 100 may move. The print head unit 100 may be mounted on a frame disposed above the first rail RL1 and the second rail RL2.

The print head unit 100 may include multiple inkjet heads 300 and may be disposed on the base frame 600. The print head unit 100 may jet the predetermined (or selectable) ink 90 onto the target substrate SUB provided on the probe device 700 using the inkjet heads 300 connected to a separate ink storage part.

The base frame 600 may include a support part 610 and a moving unit 630. The support part 610 may include a first support part 611 extending in the first direction DR1, which is a horizontal direction, and a second support part 612 connected to the first support part 611 and extending in the third direction DR3, which is a vertical direction. An extension direction of the first support part 611 may be the first direction DR1, which may be a long side direction of the probe device 700. The print head unit 100 may be disposed on the moving unit 630 mounted on the first support part 611.

The moving unit 630 may include a moving part 631 which is mounted on the first support part 611 and may move in one direction and a fixing part 632 which is disposed on a lower surface of the moving part 631 and on which the print head unit 100 is disposed. The moving part 631 may move in the first direction DR1 on the first support part 611, and the print head unit 100 may be fixed to the fixing part 632 and may move in the first direction DR1 together with the moving part 631.

The print head unit 100 may be disposed on the base frame 600, and may jet the ink 90 provided from an ink reservoir onto the target substrate SUB through the inkjet head 300. The print head unit 100 may be spaced apart from the stage STA passing through the base frame 600 by a distance. A distance by which the print head unit 100 is spaced apart from the stage STA may be adjusted by adjusting a height of the second support part 612 of the base frame 600. The distance between the print head unit 100 and the stage STA spaced apart from each other may be adjusted in a range in which the print head unit 100 has a certain distance from the target substrate SUB in case that the probe device 700 and the target substrate SUB are disposed on the stage STA, such that a space required for a printing process may be secured.

According to an embodiment, the print head unit 100 may include an inkjet head 300 including multiple nozzles 350. The inkjet head 300 may be disposed on a lower surface of the print head unit 100.

The inkjet heads 300 may be disposed to be spaced apart from each other in a direction, and may be arranged in q row or multiple rows. It has been illustrated in the drawing that the inkjet heads 300 are arranged in two rows and the inkjet heads 300 of the respective rows are arranged to be misaligned with each other. However, the disclosure is not limited thereto, and the inkjet heads 300 may be arranged in more than two rows and may be arranged to overlap each other without being misaligned with each other. In an embodiment, the inkjet head 300 may have a rectangular shape, but a shape of the inkjet head 300 is not particularly limited.

At least one inkjet head 300, for example, two inkjet heads 300 may form one pack to be disposed adjacent to each other. However, the number of inkjet heads 300 included in one pack is not limited thereto, and for example, the number of inkjet heads 300 included in one pack may be 1 to 5. It has been illustrated in the drawing that only six inkjet heads 300 are arranged in the print head unit 100, but this is for schematically illustrating the print head unit 100, and the number of inkjet heads 300 is not limited thereto.

The inkjet head 300 disposed in the print head unit 100 may jet the ink 90 onto the target substrate SUB disposed on the stage STA. According to an embodiment, the print head unit 100 may move along the first support part 611 in a direction, and the inkjet head 300 may move in the direction to jet the ink 90 onto the target substrate SUB.

The print head unit 100 may move in the first direction DR1 in which the first support part 611 extends, and the inkjet head 300 may jet the ink 90 onto the target substrate SUB while moving in the first direction DR1.

In an embodiment, the ink 90 may include a solvent 91 and multiple bipolar elements 95 included in the solvent 91. In an embodiment, the ink 90 may be provided in a solution or colloidal state. For example, the solvent 91 may include acetone, water, alcohol, toluene, propylene glycol (PG) or propylene glycol methyl acetate (PGMA), triethylene glycol monobutyl ether (TGBE), diethylene glycol monophenyl ether (DGPE), an amide-based solvent, a dicarbonyl-based solvent, diethylene glycol dibenzoate, a tricarbonyl-based solvent, triethyl citrate, a phthalate-based solvent, benzyl butyl phthalate, bis(2-ethylhexyl) phthalate, bis(2-ethylhexyl) isophthalate, ethyl phthalyl ethyl glycolate, or the like, but is not limited thereto. The bipolar elements 95 may be included in a state in which they are dispersed in the solvent 91, and may be supplied to and discharged from the print head unit 100.

In some embodiments, a width of the target substrate SUB measured in the first direction DR1 may be greater than a width of the print head unit 100. The print head unit 100 may jet the ink 90 onto the target substrate SUB while moving in the first direction DR1. In case that multiple target substrates SUB are provided on the probe device 700, the print head unit 100 may jet the ink 90 onto each of the target substrates SUB while moving in the first direction DR1.

However, the disclosure is not limited thereto, and the print head unit 100 may be positioned outside the first rail RL1 and the second rail RL2, and may move in the first direction DR1 and jet the ink 90 onto the target substrate SUB. While the stage STA moves in the second direction DR2 to be positioned below the base frame 600, the print head unit 100 may move between the first rail RL1 and the second rail RL2 and jet the ink 90 through the inkjet head 300. An operation of such an inkjet head 300 is not limited thereto, and may be variously modified as long as it may implement a similar process.

The inkjet printing device 1000 may further include the ink circulation unit 500. The ink circulation unit 500 may supply the ink 90 to the print head unit 100, and the inkjet head 300 may discharge the supplied ink 90. The ink 90 may be circulated between the ink circulation unit 500 and the inkjet head 300, and some of the ink 90 supplied to the inkjet head 300 may be discharged from the inkjet head 300, and the remainder of the ink 90 may be supplied back to the ink circulation unit 500.

The ink circulation unit 500 may be connected to the inkjet head 300 through a first connection pipe IL1 and a second connection pipe IL2. For example, the ink circulation unit 500 may supply the ink 90 to the inkjet head 300 through the first connection pipe ILL and a flow rate of the supplied ink 90 may be adjusted by a first valve VA1. The ink circulation unit 500 may be supplied with the remainder of the ink 90 remaining after being discharged from the inkjet head 300, through the second connection pipe IL2. A flow rate of the ink 90 supplied to the ink circulation unit 500 through the second connection pipe IL2 may be adjusted by a second valve VA2. As the ink 90 circulates through the ink circulation unit 500, a deviation in the number of bipolar elements 95 included in the ink 90 discharged from the inkjet head 300 may be minimized.

The ink circulation unit 500 may be mounted on the base frame 600, but is not limited thereto. The ink circulation unit 500 may be provided in the inkjet printing device 1000, but a position or a shape thereof is not particularly limited. For example, the ink circulation unit 500 may be disposed on a separate device, and may be variously disposed as long as it is connected to the inkjet head 300.

In some embodiments, the ink circulation unit 500 may include a first ink storage part 510, a second ink storage part 520, a third ink storage part 530, a pressure pump 550, a compressor 560, and a flow meter 580 In the ink circulation unit 500, the second ink storage part 520, the pressure pump 550, and the third ink storage part 530 may be connected to the inkjet head 300, and may form one ink circulation system.

The first ink storage part 510 may be a storage part in which the manufactured ink 90 is prepared. The ink 90 including the solvent 91 and the bipolar elements 95 may be prepared in the first ink storage part 510 of the ink circulation unit 500, and may be supplied to the ink circulation system.

The second ink storage part 520 may be connected to the first ink storage part 510 to be supplied with the prepared ink 90. The second ink storage part 520 may be supplied with the ink 90 remaining after being discharged from the inkjet head 300 through the second connection pipe IL12. The second ink storage part 520 may be connected between the third ink storage part 530, the inkjet head 300, and the first ink storage part 510 to form the ink circulation system. In case that the second ink storage part 520 is omitted, an excessive amount of ink 90 may be supplied to the third ink storage part 530, such that the bipolar elements 95 may not be uniformly dispersed. The ink circulation unit 500 may further include the second ink storage part 520 to prevent the excessive amount of ink 90 from being supplied to the third ink storage part 530. In an embodiment, the second ink storage part 520 may serve as a buffer storage part in which some of the ink 90 circulated in the ink circulation system is stored.

The ink 90 supplied to the second ink storage part 520 may be supplied to the third ink storage part 530 by the pressure pump 550. The pressure pump 550 may be a pump transferring power to a fluid so that the ink 90 in the ink circulation system may be circulated. The ink 90 supplied to the second ink storage part 520 may be supplied to the third ink storage part 530 by the pressure pump 550. The flow meter 580 may be provided between the pressure pump 550 and the third ink storage part 530, and may measure a flow rate of the ink 90 supplied to the third ink storage part 530. The pressure pump 550 may adjust a flow rate of the ink 90 supplied to the third ink storage part 530 according to the flow rate of the ink 90 measured by the flow meter 580.

The ink circulation unit 500 may further include the compressor 560, and the compressor 560 may adjust a pressure in the third ink storage part 530. The compressor 560 may remove gas from the third ink storage part 530 so that an inner portion of the third ink storage part 530 becomes a vacuum state, or may introduce an external inert gas into the third ink storage part 530 so that the third ink storage part 530 has a predetermined (or selectable) pressure. However, the disclosure is not limited thereto, and the compressor 560 of the ink circulation unit 500 may also be omitted.

The third ink storage part 530 may be connected to the second ink storage part 520 through the pressure pump 550 to be supplied with the ink 90. The third ink storage part 530 may supply the ink 90 to the inkjet head 300 through the first connection pipe IL1. In an embodiment, the third ink storage part 530 may include a stirrer ST, and the stirrer ST may disperse the bipolar elements 95 in the ink 90. The ink 90 supplied to the third ink storage part 530 may maintain a state in which the bipolar elements 95 do not sink and are dispersed as the stirrer ST rotates. For example, the stirrer ST of the third ink storage part 530 may prevent a phenomenon in which the bipolar elements 95 sink to a lower portion of the third ink storage part 530, such that the number of bipolar elements 95 in the ink 90 discharged through the inkjet head 300 decreases. The third ink storage part 530 may supply the ink 90 in which the bipolar elements 95 are uniformly dispersed to the inkjet head 300, and the inkjet head 300 may discharge the ink 90 including a predetermined (or selectable) number or more of the bipolar element 95.

In the inkjet printing device 1000, unit droplets of the ink 90 discharged from the inkjet head 300 may be required to be constant, and the number of bipolar elements 95 dispersed in the unit droplets may need to be uniformly controlled. While the ink 90 is discharged from the inkjet head 300 by the ink circulation system, in case that the number of bipolar elements 95 per unit droplet of the ink 90 is not uniform, reliability of the inkjet printing device 1000 may decrease. According to an embodiment, the inkjet printing device 1000 may include at least one sensing part 400 (see FIG. 5) disposed in the inkjet head 300, and may measure the number of bipolar elements 95 in the ink 90 discharged from the inkjet head 300. The inkjet printing device 1000 may sense a change in the number of bipolar elements 95 in the ink 90, and may feed the sensed change back to the inkjet head 300 to uniformly maintain the number of bipolar elements 95 discharged in a unit space. Hereinafter, the inkjet head 300 and the sensing part 400 will be described in more detail.

Figure 5:
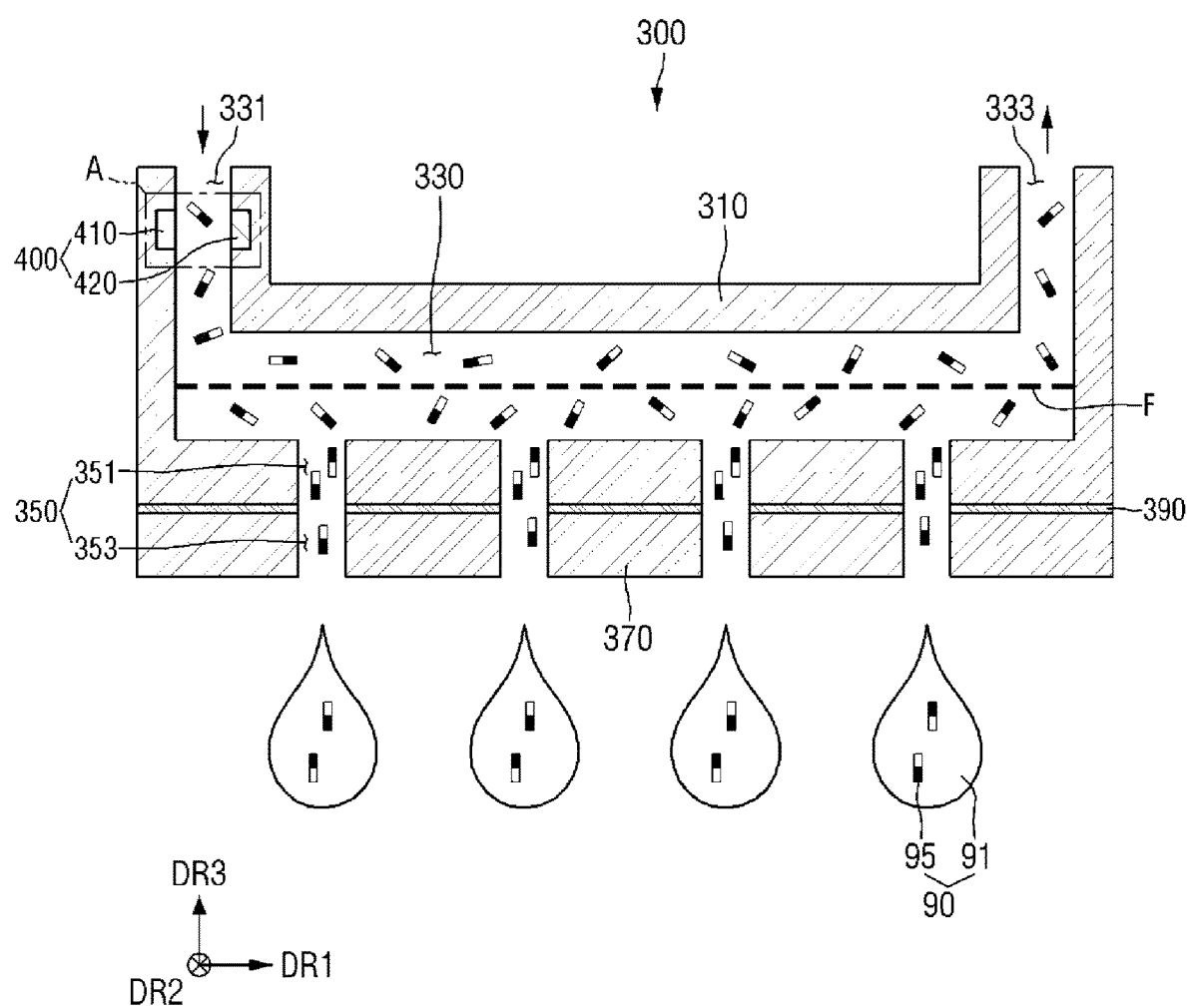
FIG. 5 is a schematic cross-sectional view of an inkjet head according to an embodiment.

FIG. 5 is a schematic cross-sectional view of an inkjet head according to an embodiment.

Referring to FIG. 5, the inkjet head 300 may include multiple nozzles 350 and may discharge the ink 90 through the nozzles 350. The ink 90 discharged from (or through) the nozzles 350 may be jetted onto the target substrate SUB provided on the stage STA or the probe device 700. The nozzles 350 may be disposed on a bottom surface of the inkjet head 300 and may be arranged in a direction in which the inkjet head 300 extends.

The inkjet head 300 may include a base part 310, an inner pipe 330, and multiple nozzles 350. The inkjet head 300 may further include a discharge part 370 and an actuator 390. In some embodiments, the sensing part 400 may be disposed on the inkjet head 300.

The base part 310 may constitute a body of the inkjet head 300. The base part 310 may be attached to the print head unit 100. The base part 310 may have a shape extending in the first direction DR1 and the second direction DR2, as described above with reference to FIG. 2. However, the disclosure is not limited thereto, and the base part 310 may also have other shapes, such as a circular or polygonal shape.

The discharge part 370 may be a portion of the base part 310 of the inkjet head 300 in which the nozzles 350 are disposed. It has been illustrated in the drawing that a discharge part 370 connected to the base part 310 and another discharge part 370 spaced apart from the discharge part 370 are disposed, and the nozzles 350 are formed between these discharge parts 370. However, substantially, the discharge parts 370 may be not spaced apart from each other and may be an integrated member, and the nozzles 350 may be formed in the shape of holes penetrating through the discharge part 370. For example, the discharge parts 370 may be not disposed to be spaced apart from each other, and may be formed as a single member. However, the disclosure is not limited thereto, and in some embodiments, the inkjet head 300 may also include multiple units including the discharge part 370 in which the nozzle 350 is formed. The multiple discharge parts 370 may be disposed to be spaced apart from each other and may be connected to the base part 310.

The inner pipe 330 may be disposed in the base part 310 and may be connected to an inner flow path of the print head unit 100, and may be supplied with the ink 90 from the ink circulation unit 500. The print head unit 100 may be supplied with the ink 90 through the first connection pipe IL1 connected to the ink circulation unit 500, and the ink 90 remaining after being discharged from the nozzles 350 may be supplied to the ink circulation unit 500 through the second connection pipe IL12. The inner pipe 330 of the inkjet head 300 may be supplied with the ink 90 at an inlet 331 connected to the inner flow path of the print head unit 100, and the ink 90 remaining after being discharged may exit to the inner flow path through an outlet 333.

The inkjet head 300 may include a filter F disposed in the inner pipe 330. The filter F may prevent materials other than the bipolar element 95 from being introduced into the nozzles 350 when the ink 90 flowing along the inner pipe 330 is introduced into the nozzles 350. Accordingly, it is possible to prevent the nozzles 350 from being clogged by foreign materials or foreign materials from being mixed in the ink 90 discharged from the nozzles 350.

The base part 310 may have a shape in which it extends in a direction, and the inner pipe 330 may be formed along the extension direction of the base part 310. The ink 90 supplied from the print head unit 100 may flow through the inner pipe 330 and may then be discharged through the nozzles 350 of the inkjet head 300.

The multiple nozzles 350 may be disposed on the discharge part 370 positioned on a surface, for example, a lower surface, of the base part 310. The nozzles 350 may be spaced apart from each other, may be arranged along the extension direction of the base part 310, may penetrate through the discharge part 370 of the base part 310, and may be connected to the inner pipe 330 to discharge the ink 90. Although not illustrated in the drawing, the nozzles 350 may be arranged in a row or multiple rows. It has been illustrated in the drawing that four nozzles 350 are formed in the inkjet head 300, but the disclosure is not limited thereto. In some embodiments, the number of nozzles 350 included in the inkjet head 300 may be 128 to 1800. The nozzles 350 may discharge the ink 90 introduced from the inner pipe 330. An amount of the ink 90 jetted through the nozzles 350 may be adjusted based on a voltage applied to each nozzle 350. In an embodiment, an amount of the ink 90 discharged in one spray from each nozzle 350 may be 1 to 50 pl (pico-litter), but is not limited thereto.

According to an embodiment, the nozzle 350 may include an inlet 351 and an outlet 353. The inlet 351 may be a portion which is directly connected to the inner pipe 330 and through which the ink 90 flowing from the inner pipe 330 is supplied to the nozzle 350. The outlet 353 may be a portion which is connected to the inlet 351 and through which the ink 90 supplied from the inlet 351 is discharged from the nozzle 350. The inlet 351 and the outlet 353 of the nozzle 350 may have the same diameter, but are not limited thereto. Diameters of the inlet 351 and the outlet 353 of the nozzle 350 may be different from each other depending on a shape of the discharge part 370. The discharge part 370 may have different shapes depending on a diameter of the nozzle 350 by including portions divided from each other.

The ink 90 discharged through the nozzle 350 may include the solvent 91 and the bipolar elements 95 dispersed in the solvent 91. According to an embodiment, the bipolar element 95 may have a shape in which it extends in a direction. The bipolar elements 95 may be randomly dispersed in the ink 90, flow along the inner pipe 330, and then be supplied to the nozzle 350. As the bipolar element 95 has a shape in which it extends in a direction, the bipolar element 95 may have an orientation direction, which is a direction to which a longitudinal axis is directed. The bipolar element 95 may include portions having partially different polarities. For example, the bipolar element 95 may include a first end having a first polarity and a second end having a second polarity, and the first end and the second end may be both ends of the bipolar element 95 in the longitudinal axis direction. The orientation direction of the bipolar element 95 extending in a direction may be defined based on a direction to which the first end is directed. The bipolar elements 95 flowing in the inner pipe 330 and the nozzle 350 of the inkjet head 300 may be dispersed in random orientation directions rather than a constant orientation direction. However, the disclosure is not limited thereto, and the bipolar elements 95 may flow in the inner pipe 330 and the nozzle 350 in a state in which they have specific orientation directions.

The actuator 390 may be disposed on the discharge part 370 of the base part 310. The actuator 390 may be disposed to surround the nozzle 350. The actuator 390 may apply a hydraulic pressure to the ink 90 introduced into the nozzle 350 so that the ink 90 may be uniformly discharged through the nozzle 350. The actuator 390 may have substantially the same length as the discharge part 370, but is not limited thereto. The actuator 390 may be disposed to correspond to the nozzle 350, may surround the nozzle 350, and may be disposed to be spaced apart from other actuators 390 by a distance by which the nozzles 350 are spaced apart from each other.

According to an embodiment, the actuator 390 may control an amount of the ink 90 discharged through the nozzle 350. The actuator 390 may adjust the hydraulic pressure applied to the ink 90, and may adjust droplets of the ink 90 discharged to a unit space during a printing process of the inkjet printing device 1000. For example, an amount of the ink 90 discharged once from the nozzle 350 may be 1 to 50 pl (Pico-litter), and a discharge amount of the ink 90 required for a unit space in one printing process may be 50 pl or more. The actuator 390 may control droplets of the ink 90 discharged from the nozzle 350 in one printing process by adjusting strength, a frequency, or the like, of the hydraulic pressure.

Multiple bipolar elements 95 may be dispersed in the ink 90 discharged from the inkjet head 300. The ink 90 discharged once from the nozzle 350 may include a specific number of bipolar elements 95 according to a dispersion degree of the bipolar elements 95. However, the bipolar elements 95 may include a material having a relatively high specific gravity, and in a circulation system of the inkjet head 300 and the ink circulation unit 500, the bipolar elements 95 may sink in the ink 90. Accordingly, the dispersion degree of the bipolar elements 95 in the ink 90 may be not kept constant, and the number of bipolar elements 95 in the ink 90 discharged once may change.

According to an embodiment, the inkjet printing device 1000 may include the sensing part 400 capable of measuring the number of bipolar elements 95 included in the ink 90 discharged from the nozzle 350. The sensing part 400 may sense the number of bipolar elements 95 discharged from the nozzle 350 per unit time or a change in the number of bipolar elements 95, and may feedback the sensed number or the sensed change to the actuator 390. The actuator 390 may sense the feedback signal received from the sensing part 400 to adjust droplets of the ink 90 discharged from the nozzle 350 per unit time or during a unit process. The inkjet printing device 1000 may include the sensing part 400 and the actuator 390 to uniformly maintain the number of bipolar elements 95 discharged from the inkjet head 300 during a printing process.

The sensing part 400 may be disposed in the inkjet head 300. The sensing part 400 may measure the number of bipolar elements 95 in the ink 90 discharged from the nozzle 350. For example, the sensing part 400 may be disposed on the base part 310 of the inkjet head 300, and may be disposed on the inlet 331 of the inner pipe 330 through which the ink 90 is introduced. In some embodiments, the sensing part 400 may be disposed in a form in which it is inserted into the base part 310 of the inkjet head 300. However, the disclosure is not limited thereto, and the sensing part 400 may be disposed on another position within the inkjet head 300.

The sensing part 400 may include a first sensor 410 and a second sensor 420. The first sensor 410 and the second sensor 420 may be disposed to be spaced apart from each other with a space in which the ink 90 flows, for example, the inlet 331 of the inner pipe 330 therebetween. The first sensor 410 and the second sensor 420 may be inserted into the base part 310 and may be disposed in contact with an outer wall of the inner pipe 330, but are not limited thereto. The first sensor 410 and the second sensor 420 may be disposed to be spaced apart from an outer wall of the space through which the ink 90 flows.

The first sensor 410 and the second sensor 420 may measure the number of bipolar elements 95 in a unit space or a unit volume of the ink 90. The first sensor 410 and the second sensor 420 may generate or receive a specific signal for measuring the number of bipolar elements 95 in the ink 90, and accordingly, may measure the number of bipolar elements 95.

A method for the sensing part 400 to measure the number of bipolar elements 95 may be variously modified. For example, the sensing part 400 may measure the number of bipolar elements 95 included in a unit volume by capturing an image of the ink 90 flowing in the inner pipe 330. The first sensor 410 may be an image capturing part for capturing an image of the ink 90, and the second sensor 420 may be a processing part measuring the number of bipolar elements 95 per unit volume through the image captured by the first sensor 410.

Figure 6:
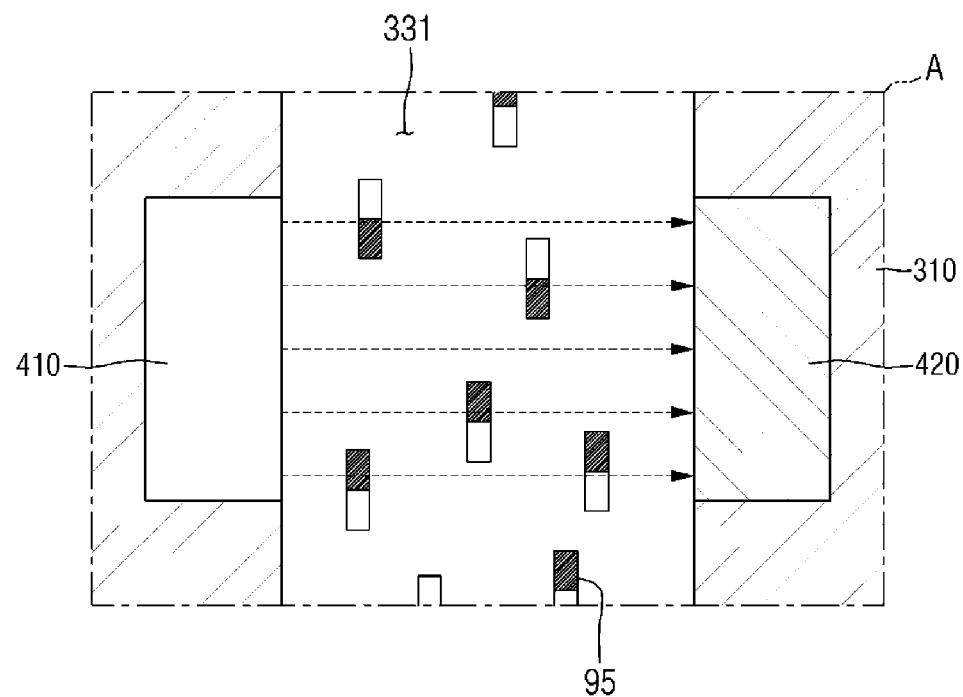
FIG. 6 is an enlarged view of part A of FIG. 5.
Figure 7:
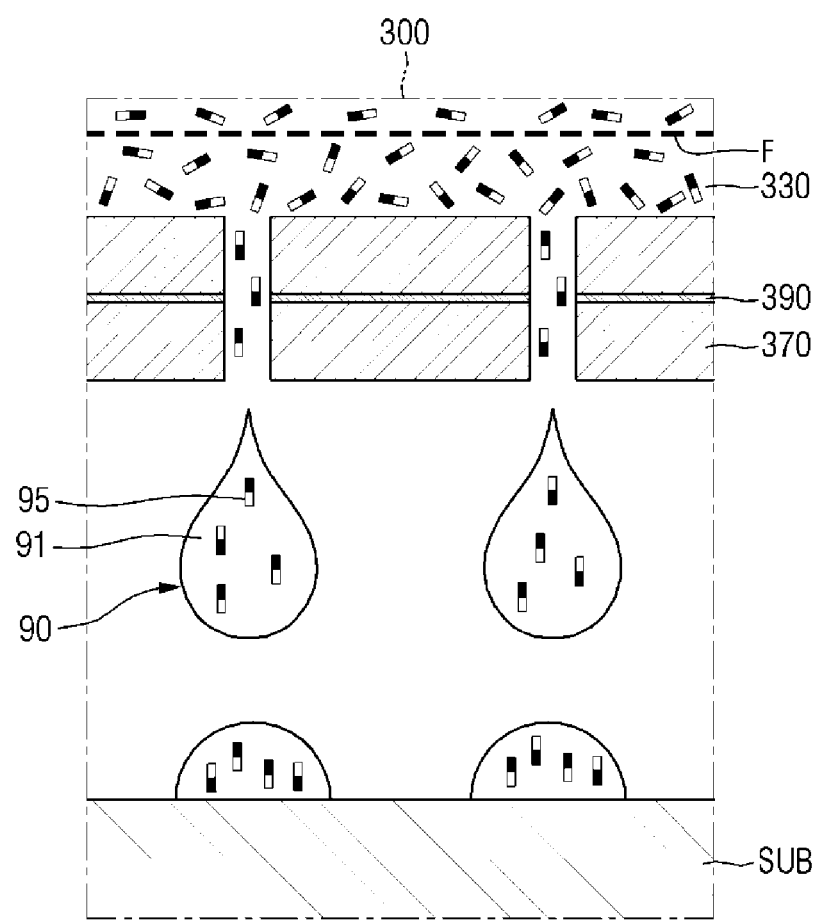
FIG. 7 is a schematic view illustrating that ink discharged from the inkjet head is jetted onto a target substrate according to an embodiment.

FIG. 6 is an enlarged view of part A of FIG. 5. FIG. 7 is a schematic view illustrating that ink discharged from the inkjet head is jetted onto a target substrate according to an embodiment.

Referring to FIGS. 6 and 7 in addition to FIG. 5, the first sensor 410 of the sensing part 400 may capture an image of the ink 90 flowing in the inlet 331 of the inner pipe 330, and may transfer the captured image to the second sensor 420. The second sensor 420 may calculate or count the number of bipolar elements 95 in the ink 90 from the image. The sensing part 400 disposed adjacent to the inlet 331 of the inner pipe 330 may measure the number of bipolar elements 95 per unit droplet of the ink 90 discharged from the nozzle 350 of the inkjet head 300 from the number of bipolar elements 95 measured at the inlet 331.

The ink 90 discharged from the inkjet head 300 may be jetted onto the target substrate SUB. The target substrate SUB may be a substrate providing a space on which the bipolar elements 95 are printed using the inkjet printing device 1000. The ink 90 and the bipolar element 95 discharged from the inkjet head 300 may be seated on the target substrate SUB. The sensing part 400 may measure the number of bipolar elements 95 included in the ink 90 flowing in the inkjet head 300, and may calculate the number of bipolar elements 95 seated on the target substrate SUB from droplets of the ink 90 discharged from the nozzle 350. For example, the ink 90 discharged from any one nozzle 350 of the inkjet head 300 in the printing process may be positioned in a predetermined (or selectable) area partitioned on the target substrate SUB. The inkjet printing device 1000 may measure the number of bipolar elements 95 positioned in the predetermined (or selectable) area on the target substrate SUB from the number of bipolar elements 95 in the ink 90 measured by the sensing part 400 and the droplets of the ink 90 discharged from the nozzle 350 per unit process time from the actuator 390.

During the printing process in which the inkjet head 300 discharges the ink 90, the ink 90 may be continuously circulated between the inkjet head 300 and the ink circulation unit 500. In this process, the bipolar elements 95 having a large specific gravity may sink in the ink 90, and the number of bipolar elements 95 per unit volume or unit flow rate of the ink 90 introduced into the inner pipe 330 of the inkjet head 300 may decrease. In case that the droplets of the ink 90 discharged from the actuator 390 per unit time or per unit process are constant, the number of bipolar elements 95 positioned in the predetermined (or selectable) area on the target substrate SUB may decrease.

Figure 8:
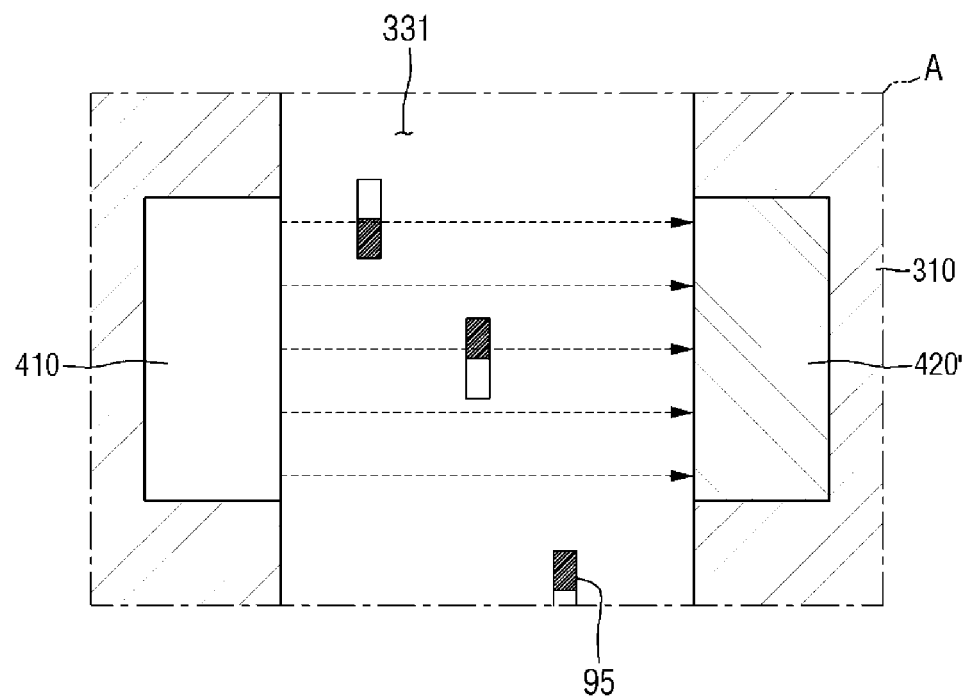
FIG. 8 is a schematic view illustrating that the number of bipolar elements flowing in the inkjet head changes.

FIG. 8 is a schematic view illustrating that the number of bipolar elements flowing in the inkjet head changes.

Referring to FIG. 8, the sensing part 400 may sense a change in the number of bipolar elements 95 in the ink 90 introduced into the inkjet head 300. In case that an image is captured by the first sensor 410, a second sensor 420' may sense a change in the number of bipolar elements 95 in the ink 90 from a change in the captured image. In case that the number of bipolar elements 95 per unit volume or unit flow rate in the ink 90 introduced into the inner pipe 330 decreases, the number of bipolar elements 95 discharged from the nozzle 350 may also decrease. For example, in case that the bipolar elements 95 sink in the circulation system between the ink circulation unit 500 and the inkjet head 300, the number of bipolar elements 95 in the ink 90 introduced from the ink circulation unit 500 to the inkjet head 300 may decrease. However, the disclosure is not limited thereto, and various causes may exist for the change in the number of bipolar elements 95. The inkjet printing device 1000 may include a larger number of sensing parts 400 to provide accurate feedback with respect to the change in the number of bipolar elements 95. The inkjet printing device 1000 may uniformly maintain the number of bipolar elements 95 in the ink 90 discharged from the inkjet head 300 from the feedback provided from the sensing part 400.

The sensing part 400 may measure the number of bipolar elements 95 in the discharged ink 90 at the same time the inkjet printing device 1000 discharges the ink 90, and may sense a dispersion degree and a change in the number of bipolar elements 95 per unit droplet of the ink 90 during the printing process. In case that the change in the number of bipolar elements 95 exceeds a reference set value, the sensing part 400 may feedback the change in the number of bipolar elements 95 to the actuator 390 in real time.

According to an embodiment, in the inkjet printing device 1000, the sensing part 400 may sense the change in the number of bipolar elements 95 in the ink 90 introduced into the inkjet head 300 during the printing process, and may transfer a feedback signal of the sensed change to the actuator 390. The actuator 390 may adjust the droplets of the ink 90 discharged from the nozzle 350 so that the number of bipolar elements 95 discharged per unit time or per unit process is constant based on the feedback signal.

Figure 9:
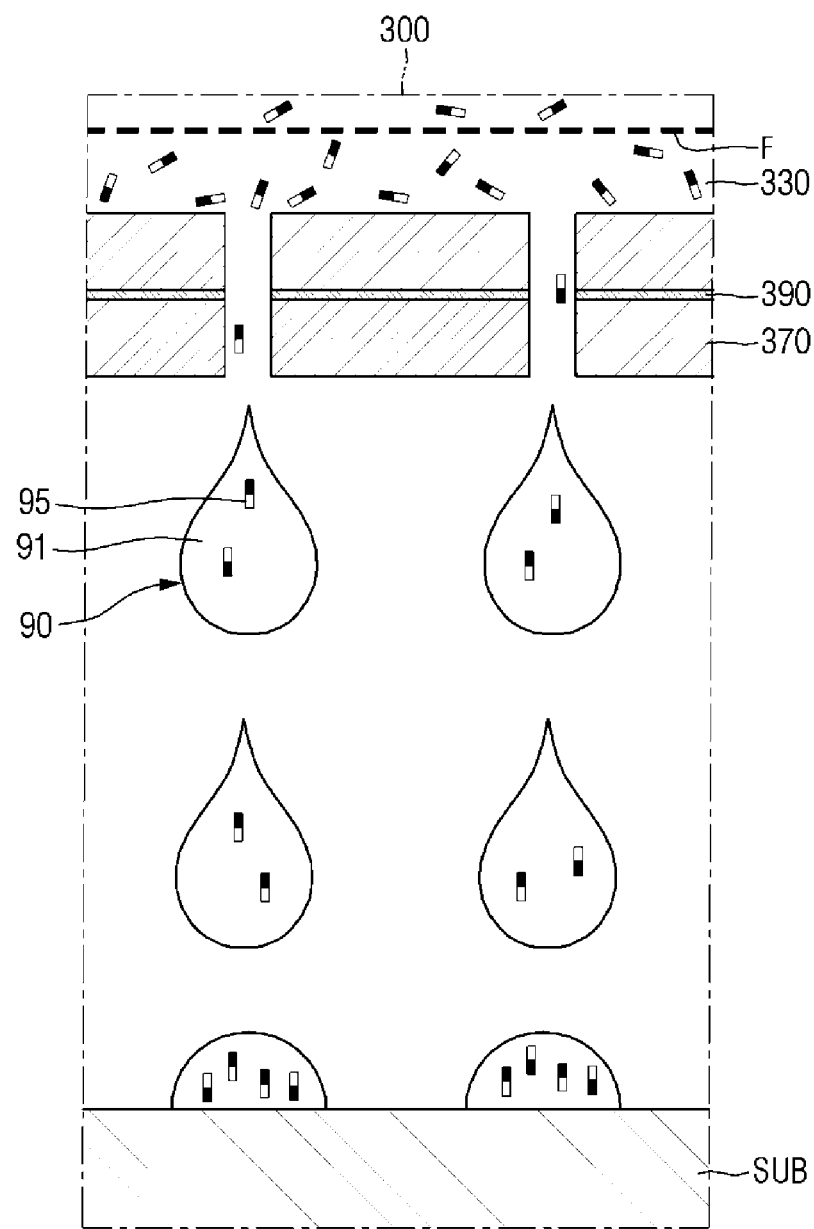
FIG. 9 is a schematic view illustrating that an amount of ink discharged from the inkjet head changes according to an embodiment.

FIG. 9 is a schematic view illustrating that an amount of ink discharged from the inkjet head changes according to an embodiment.

Referring to FIG. 9 in conjunction with FIG. 7, the actuator 390 of the inkjet head 300 may control the droplets of the ink 90 discharged per unit time or per unit process based on the feedback signal transferred from the sensing part 400. For example, in case that the sensing part 400 senses the change in the number of bipolar elements 95, the actuator 390 may adjust a hydraulic pressure or the like to the ink 90 to adjust droplets of the ink 90 discharged once from the nozzle 350 or adjust droplets or the number of drops discharged from the nozzle 350 per unit time. Accordingly, even though the number of bipolar elements 95 introduced into the inkjet head 300 during the printing process decreases, the number of bipolar elements 95 seated on the target substrate SUB during the unit process may be uniformly maintained. In particular, in case that the target substrate SUB includes multiple areas that are uniformly partitioned, the inkjet printing device 1000 may discharge a constant number of bipolar elements 95 for each area.

The inkjet printing device 1000 according to an embodiment may include the sensing part 400 and the actuator 390 to sense the change in the number of bipolar elements 95, and may adjust the droplets of the ink 90 discharged from the nozzle 350 per unit process in response to the sensed change. Accordingly, the inkjet printing device 1000 may print or jet a uniform number of bipolar elements 95 in a predetermined (or selectable) area. As described later, the inkjet printing device 1000 may minimize an error in the number of bipolar elements 95 for each area of a device including the bipolar elements 95, and may improve reliability of a product.

The bipolar elements 95 may be jetted onto the target substrate SUB while having orientation directions, and may be then seated on the target substrate SUB while having a constant orientation direction by the electric field generated by the probe device 700. For example, the bipolar elements 95 may be aligned in a direction on the target substrate SUB by the electric field generated by the probe device 700. Hereinafter, the probe device 700 will be described with reference to other drawings.

Figure 10:
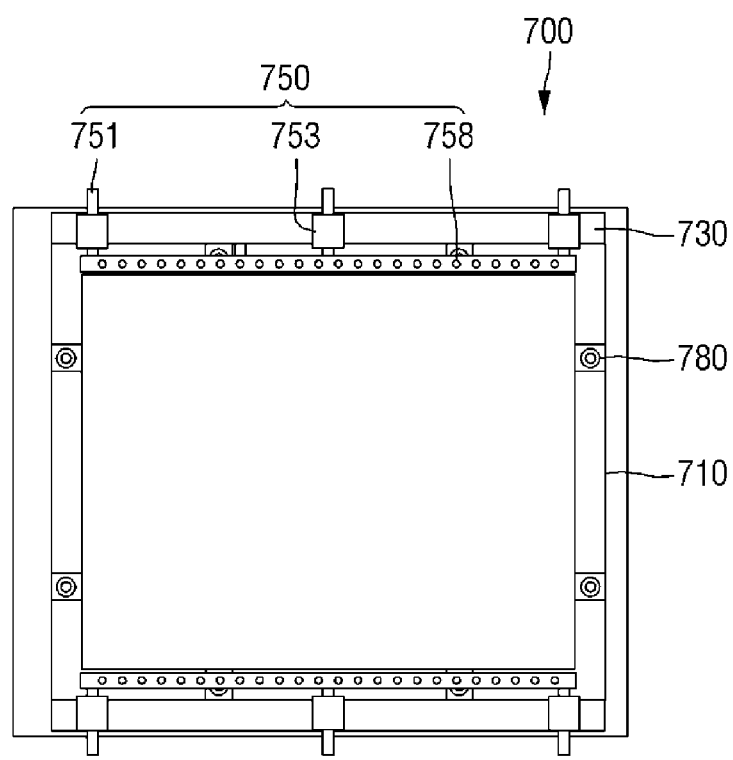
FIG. 10 is a schematic plan view of a probe device according to an embodiment.
Figure 10:
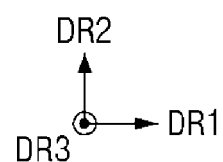

FIG. 10 is a schematic plan view of a probe device according to an embodiment.

Referring to FIGS. 1 and 10, the probe device 700 may include a sub-stage 710, probe supports 730, probe units 750, and aligners 780.

The probe device 700 may be disposed on the stage STA, and may move together with the stage STA in the second direction DR2. The ink 90 may be jetted onto the probe device 700 while the probe device 700 on which the target substrate SUB is disposed moves with the stage STA. While the ink 90 is jetted, the probe device 700 may generate an electric field on the target substrate SUB. However, the disclosure is not limited thereto. In some embodiments, the stage STA may not move, and the print head unit 100 may jet the ink 90 onto the stage STA while moving along the second direction DR2.

The sub-stage 710 may provide a space in which the target substrate SUB is disposed. The probe supports 730, the probe units 750, and the aligners 780 may be disposed on the sub-stage 710. A shape of the sub-stage 710 is not particularly limited, and in an embodiment, the sub-stage 710 may have a rectangular shape with both sides extending in the first direction DR1 and the second direction DR2 as illustrated in the drawings. The sub-stage 710 may include long sides extending in the first direction DR1 and short sides extending in the second direction DR2. However, an overall shape of the sub-stage 710 in a plan view may change depending on a shape of the target substrate SUB in a plan view. For example, in case that the target substrate SUB has a rectangular shape in a plan view, the sub-stage 710 may have a rectangular shape as illustrated in the drawings, and in case that the target substrate SUB has a circular shape in a plan view, the sub-stage 710 may have a circular shape in a plan view. However, the disclosure is not limited thereto, and the sub-stage 710 and the target substrate SUB may have different shapes.

At least one aligner 780 may be disposed on the sub-stage 710. The aligners 780 may be disposed on each side of the sub-stage 710, and an area surrounded by multiple aligners 780 may be an area in which the target substrate SUB is disposed. It has been illustrated in the drawings that two aligners 780 are disposed to be spaced apart from each other on each side of the sub-stage 710, and a total of eight aligners 780 are disposed on the sub-stage 710. However, the disclosure is not limited thereto, and the number, positions, and the like, of aligners 780 may change depending on a shape or a type of the target substrate SUB.

The probe supports 730 and the probe units 750 may be disposed on the sub-stage 710. The probe supports 730 may provide a space in which the probe units 750 are disposed on the sub-stage 710. For example, the probe support 730 may be disposed on at least one side of the sub-stage 710, and may extend in a direction in which a side portion extends. In an embodiment, as illustrated in the drawings, the probe supports 730 may be disposed to extend in the second direction DR2 on left and right side portions of the sub-stage 710. However, the disclosure is not limited thereto, and a larger number of probe supports 730 may be included, and in some cases, the probe supports 730 may also be disposed on the upper and lower sides of the sub-stage 710. For example, structures of the probe supports 730 may change depending on the number, positions, structures, or the like, of probe units 750 included in the probe device 700.

The probe units 750 may be disposed on the probe supports 730 to form electric fields on the target substrate SUB prepared on the sub-stage 710. The probe units 750 may extend in a direction, for example, in the second direction DR2, like the probe supports 730, and an extension length of the probe units 750 may cover an entire area of the target substrate SUB. For example, sizes and shapes of the probe supports 730 and the probe units 750 may change depending on the target substrate SUB.

In an embodiment, the probe unit 750 may include probe drivers 753 disposed on the probe support 730, probe jigs 751 disposed on the probe drivers 753 and receiving an electrical signal, and probe pads 758 connected to the probe jigs 751 and transferring the electrical signal to the target substrate SUB.

The probe driver 753 may be disposed on the probe support 730 to move the probe jig 751 and the probe pad 758. In an embodiment, the probe driver 753 may move the probe jig 751 in a horizontal direction and a vertical direction, for example, the first direction DR1 which is the horizontal direction and the third direction DR3 which is the vertical direction. The probe pad 758 may be connected to or disconnected from the target substrate SUB by driving the probe driver 753. Among processes of the inkjet printing device 1000, in a step of forming an electric field in the target substrate SUB, the probe driver 753 may be driven to connect the probe pad 758 to the target substrate SUB, and in other steps, the probe driver 753 may be driven again to disconnect the probe pad 758 from the target substrate SUB. This will be described in detail below with reference to other drawings.

The probe pad 758 may form an electric field on the target substrate SUB through the electrical signal transferred from the probe jig 751. The probe pad 758 may be connected to the target substrate SUB and may transfer the electrical signal to the target substrate SUB to form the electric field on the target substrate SUB. For example, the probe pad 758 may be in contact with an electrode, a power source pad, or the like, of the target substrate SUB, and the electrical signal of the probe jig 751 may be transferred to the electrode or the power source pad. The electrical signal transferred to the target substrate SUB may form the electric field on the target substrate SUB.

However, the disclosure is not limited thereto, and the probe pad 758 may be a member forming the electric field through the electrical signal transferred from the probe jig 751. For example, in case that the probe pad 758 forms the electric field by receiving the electrical signal, the probe pad 758 may not be connected to the target substrate SUB.

A shape of the probe pad 758 is not particularly limited, but in an embodiment, the probe pad 758 may have a shape in which it extends in a direction to cover the entire area of the target substrate SUB.

The probe jig 751 may be connected to the probe pad 758 and may be connected to a separate voltage applying device. The probe jig 751 may transfer an electrical signal transferred from the voltage applying device to the probe pad 758 to form the electric field on the target substrate SUB. The electrical signal transferred to the probe jig 751 may be a voltage for forming the electric field, for example, an alternating current (AC) voltage.

The probe unit 750 may include multiple probe jigs 751, and the number of probe jigs 751 is not particularly limited. It has been illustrated in the drawings that three probe jigs 751 and three probe drivers 753 are disposed, but the probe unit 750 may include a larger number of probe jigs 751 and a larger number of probe drivers 753 to form an electric field having a higher density on the target substrate SUB.

The probe unit 750 according to an embodiment is not limited thereto. It has been illustrated in the drawings that the probe unit 750 is disposed on the probe support 730, that is, the probe device 700, but in some cases, the probe unit 750 may also be disposed as a separate device. As long as the probe device 700 forms an electric field on the target substrate SUB by including a device capable of forming the electric field, a structure or a disposition of the probe device 700 is not limited.

Figure 11:
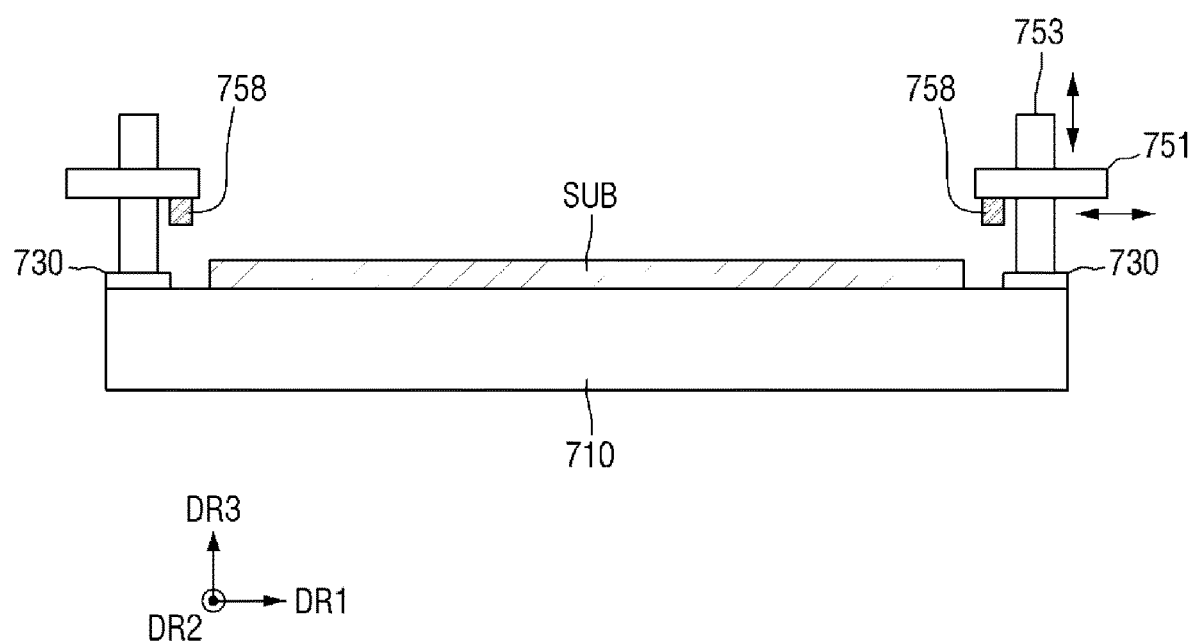
FIGS. 11 and 12 are schematic cross-sectional views illustrating an operation of a probe unit according to an embodiment.
Figure 12:
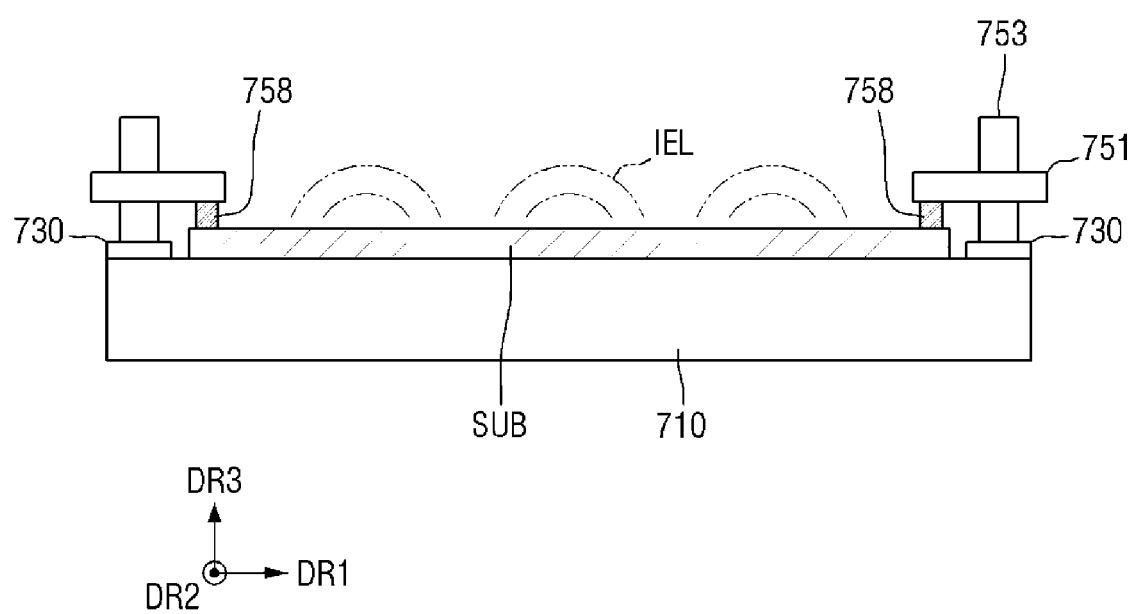

FIGS. 11 and 12 are schematic cross-sectional views illustrating an operation of a probe unit according to an embodiment.

As described above, the probe driver 753 of the probe unit 750 may operate according to a process step of the inkjet printing device 1000. Referring to FIGS. 11 and 12, in a first state in which the electric field is not formed in the probe device 700, the probe unit 750 may be disposed on the probe support 730 to be spaced apart from the target substrate SUB. The probe driver 753 of the probe unit 750 may drive in the second direction DR2, which is the horizontal direction, and the third direction DR3, which is the vertical direction, to place the probe pad 758 to be spaced apart from the target substrate SUB.

In a second state in which the electric field is formed on the target substrate SUB, the probe driver 753 of the probe unit 750 may drive to connect the probe pad 758 to the target substrate SUB. The probe driver 753 may drive in the third direction DR3, which is the vertical direction, and the first direction DR1, which is the horizontal direction, so that the probe pad 758 may come into contact with the target substrate SUB. The probe jig 751 of the probe unit 750 may transfer the electrical signal to the probe pad 758, and the electric field may be formed on the target substrate SUB.

It has been illustrated in the drawings that one probe unit 750 is disposed on each of both sides of the probe device 700, and two probe units 750 are simultaneously connected to the target substrate SUB. However, the disclosure is not limited thereto, and multiple probe units 750 may drive separately. For example, in case that the target substrate SUB is prepared on the sub-stage 710 and the ink 90 is jetted onto the target substrate SUB, a first probe unit 750 may first form an electric field on the target substrate SUB, and a second probe unit 750 may not be connected to the target substrate SUB. Thereafter, the first probe unit 750 may be disconnected from the target substrate SUB, and the second probe unit 750 may be connected to the target substrate SUB to form an electric field. For example, the probe units 750 may simultaneously drive to form the electric fields, or may sequentially drive to sequentially form the electric fields.

Figure 13:
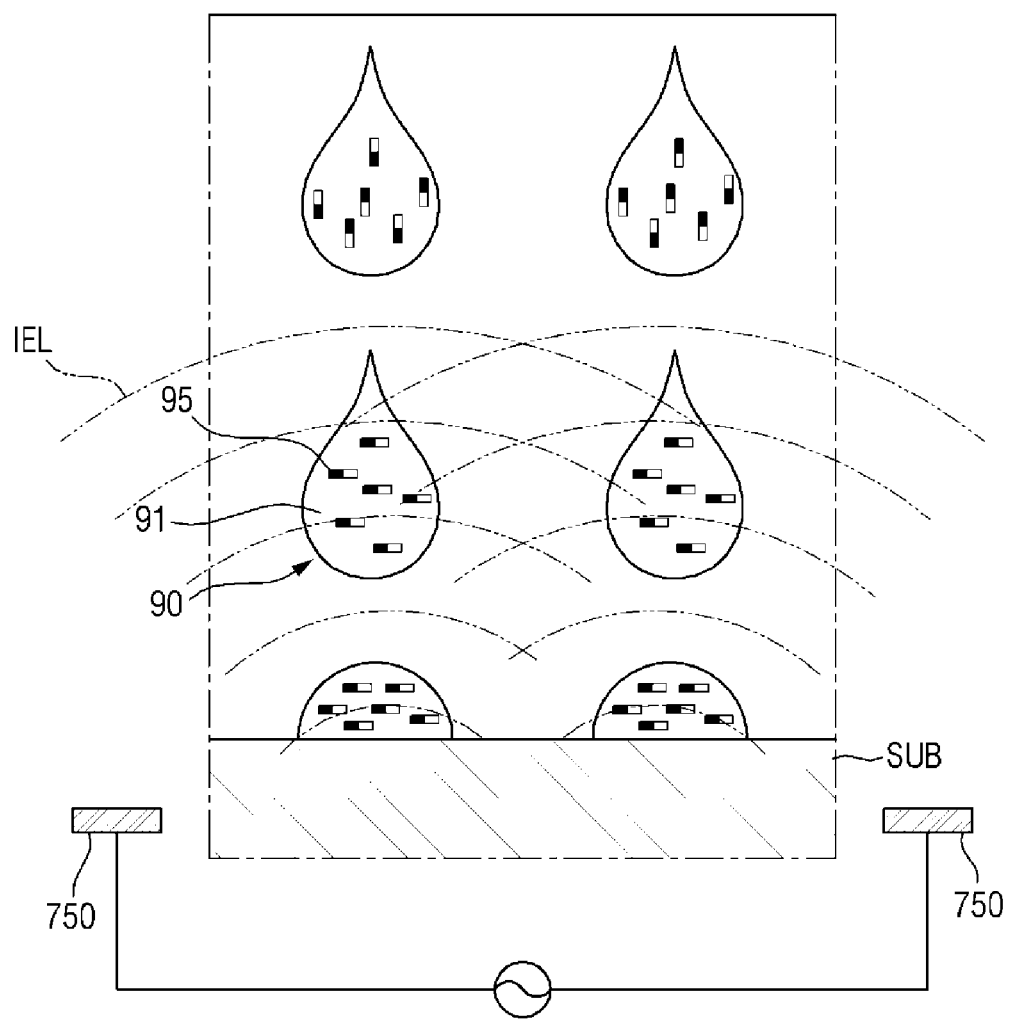
FIG. 13 is a schematic view illustrating that an electric field is generated on a target substrate by a probe device according to an embodiment.

FIG. 13 is a schematic view illustrating that an electric field is generated on a target substrate by a probe device according to an embodiment.

Referring to FIG. 13, as described above, the bipolar element 95 may include a first end and a second end that have the polarities, and in case that the bipolar element 95 is put in a predetermined (or selectable) electric field, a dielectrophoretic force may be applied to the bipolar element 95, such that a position or an orientation direction of the bipolar element 95 may change. The bipolar elements 95 in the ink 90 jetted onto the target substrate SUB may be seated on the target substrate SUB while their positions and orientation directions change by an electric field IEL generated by the probe device 700.

The probe device 700 may generate the electric field IEL on the target substrate SUB, and the ink 90 discharged from the nozzle 350 of the inkjet head 300 may pass through the electric field IEL and be jetted onto the target substrate SUB. The bipolar elements 95 may receive a dielectrophoretic force by the electric field IEL until the ink 90 reaches the target substrate SUB or even after the ink 90 reaches the target substrate SUB. According to an embodiment, after the bipolar elements 95 are discharged from the inkjet head 300, orientation directions and positions of the bipolar elements 95 may change by the electric field IEL generated by the probe device 700.

The electric field IEL generated by the probe device 700 may be formed in a direction parallel to an upper surface of the target substrate SUB. The bipolar elements 95 jetted onto the target substrate SUB may be oriented so that a direction in which longitudinal axes of the bipolar elements 95 is directed to a direction horizontal to the upper surface of the target substrate SUB by the electric field IEL. The bipolar elements 95 may be seated on the target substrate SUB in a state in which first ends thereof having the polarity are oriented in a specific direction.

In case that the bipolar elements 95 are seated on the target substrate SUB, a degree of alignment may be measured in consideration of a deviation in orientation directions of the bipolar elements 95 or a deviation in positions of the bipolar elements 95 seated on the target substrate SUB. For the bipolar elements 95 seated on the target substrate SUB, a deviation in orientation directions and a deviation in seated positions of the other bipolar elements 95 with respect to any one bipolar element 95 may be measured, and the degree of alignment of the bipolar elements 95 may be measured by these deviations. The 'degree of alignment' of the bipolar elements 95 may refer to deviations in orientation directions and seated positions of the bipolar elements 95 aligned on the target substrate SUB. For example, it may be understood that in case that the deviations in the orientation directions and the seated positions of the bipolar elements 95 are large, the degree of alignment of the bipolar elements 95 may be low, and in case that the deviations in the orientation directions and the seated positions of the bipolar elements 95 are small, the degree of alignment of the bipolar elements 95 may be high or improved.

A point in time at which the probe device 700 generates the electric field IEL on the target substrate SUB is not particularly limited. It has been illustrated in the drawing that the probe unit 750 generates the electric field IEL while the ink 90 is discharged from the nozzle 350 and reaches the target substrate SUB. Accordingly, the bipolar elements 95 may receive a dielectrophoretic force by the electric field IEL until they are discharged from the nozzle 350 and reach the target substrate SUB. However, the disclosure is not limited thereto, and in other embodiment, the probe unit 750 may also generate the electric field IEL after the ink 90 is seated on the target substrate SUB. For example, the probe device 700 may generate the electric field IEL when or after the ink 90 is jetted from the inkjet head 300.

Although not illustrated in the drawings, an electric field generating member may be further disposed on the sub-stage 710 in some embodiments. The electric field generating member may form an electric field in an upward direction (i.e., the third direction DR3) or on the target substrate SUB like a probe unit 750 to be described later. In an embodiment, the electric field generating member may be an antenna unit, a device including multiple electrodes, or the like.

Although not illustrated in the drawings, the inkjet printing device 1000 according to an embodiment may further include a heat treatment unit which performs a process of volatilizing the ink 90 jetted onto the target substrate SUB. The heat treatment unit may irradiate the ink 90 jetted onto the target substrate SUB with heat, such that the solvent 91 of the ink 90 may be evaporated and removed, and the bipolar elements 95 may be disposed on the target substrate SUB. A process of removing the solvent 91 by irradiating the ink 90 with the heat may be performed using a general heat treatment unit. A detailed description thereof will be omitted.

Hereinafter, a method for printing the bipolar elements 95 using the inkjet printing device 1000 according to an embodiment will be described in detail.

Figure 14:
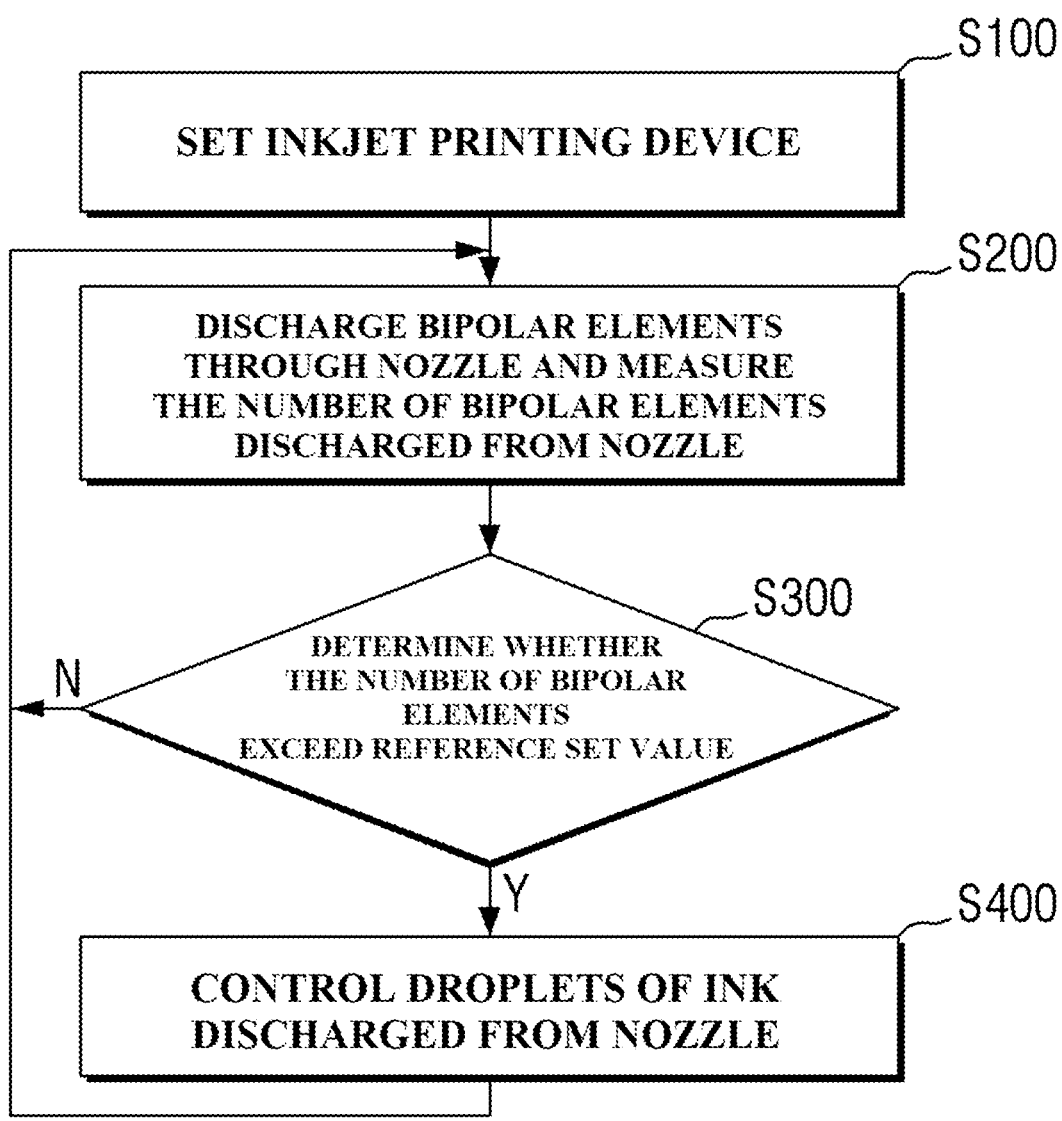
FIG. 14 is a flowchart illustrating a method for printing the bipolar elements according to an embodiment.

FIG. 14 is a flowchart illustrating a method for printing the bipolar elements according to an embodiment. FIGS. 15 to 22 are schematic cross-sectional views illustrating a method for printing the bipolar elements using the inkjet printing device according to an embodiment.

Referring to FIGS. 1 and 14 to 22, a method for aligning the bipolar elements 95 according to an embodiment may include setting the inkjet printing device 1000 (S100), discharging the bipolar elements 95 through the nozzle 350 and measuring the number of bipolar elements 95 discharged from the nozzle 350 (S200), determining whether or not the number of bipolar elements 95 exceeds a reference set value (S300), and controlling droplets of the ink 90 discharged from the nozzle 350 per unit process based on the determination (S400).

The method for printing the bipolar elements 95 according to an embodiment may be performed using the inkjet printing device 1000 described above with reference to FIG. 1, the number of bipolar elements 95 per unit droplet of the ink 90 discharged from the inkjet head 300 may be measured, and the bipolar elements 95 may be discharged. In the specification, 'printing' of the bipolar elements 95 may mean discharging or jetting the bipolar elements 95 to a predetermined (or selectable) object from the inkjet printing device 1000. For example, printing the bipolar elements 95 may mean directly discharging the bipolar elements 95 through the nozzle 350 of the inkjet head 300 or discharging the bipolar elements 95 in a state that the bipolar elements 95 are dispersed in the ink 90. The disclosure is not limited thereto, and printing the bipolar elements 95 may mean jetting the bipolar elements 95 or the ink 90 in which the bipolar elements 95 are dispersed onto the target substrate SUB (see FIG. 7) to seat the bipolar elements 95 or the ink 90 on the target substrate SUB.

The method for printing the bipolar elements 95 using the inkjet printing device 1000 may include measuring the number of bipolar elements 95 flowing in the inkjet head 300 and determining whether the number of bipolar elements 95 exceeds the reference set value. A change in the number of bipolar elements 95 discharged from the nozzle 350 may be sensed based on the determination, and the sensed change may be fed back to the actuator 390. In case that the number of bipolar elements 95 discharged from the nozzle 350 per unit process needs to be changed, the actuator 390 may control droplets of ink 90 discharged from the nozzle 350 per unit process based on the feedback signal.

First, the inkjet printing device 1000 may be set (S100). The step (S100) of setting the inkjet printing device 1000 may be a step of tuning the inkjet printing device 1000 according to a target process. For precise tuning, an inkjet print test process may be performed on an inspection substrate, and a set value of the inkjet printing device 1000 may be adjusted according to a test result.

The inspection substrate may be first prepared. The inspection substrate may have the same structure as the target substrate SUB, but a bare substrate such as a glass substrate may be used as the inspection substrate.

A water repellent treatment may be performed on an upper surface of the inspection substrate. The water repellent treatment may be performed by fluorine coating, a plasma surface treatment, or the like.

The ink 90 including the bipolar elements 95 may be jetted onto the upper surface of the inspection substrate using the inkjet printing device 1000, and droplets for each inkjet head 300 may be measured. The measurement of the droplets for each inkjet head 300 may be performed in a manner of confirming a size of a droplet at the moment of jetting the ink and a size of a droplet applied to the substrate using a camera. In case that the measured droplets are different from reference droplets, a voltage for each corresponding inkjet head 300 may be adjusted so that the reference droplets may be discharged. Such an inspection method may be repeated several times until each inkjet head 300 discharges accurate droplets.

Here, according to an embodiment, the step of setting the inkjet printing device 1000 may include a step of measuring the number of bipolar elements 95 in the droplet jetted onto the inspection substrate. The number of bipolar elements 95 included in the reference droplets jetted onto the inspection substrate may mean a reference set value of the number of bipolar elements 95 per unit droplet of the ink 90 in the inkjet printing device 1000. Based on the reference set value set in the inkjet printing device 1000, a change in the number of bipolar elements 95 may be sensed, and the droplets of ink 90 discharged from the nozzle 350 per unit process or the number of bipolar elements 95 discharged through the nozzle 350 may be controlled.

In the step of setting the inkjet printing device 1000, after the setting of the reference set value is completed, the ink 90 in which the bipolar elements 95 are dispersed may be prepared in the ink circulation unit 500, and may be supplied to the inkjet head 300. The ink circulation unit 500 and the inkjet head 300 may be maintained so that the bipolar elements 95 in the ink 90 have a uniform dispersion degree by the ink circulation system.

However, the disclosure is not limited thereto, and the step (S100) of setting of the inkjet printing device described above may be omitted.

Figure 15:
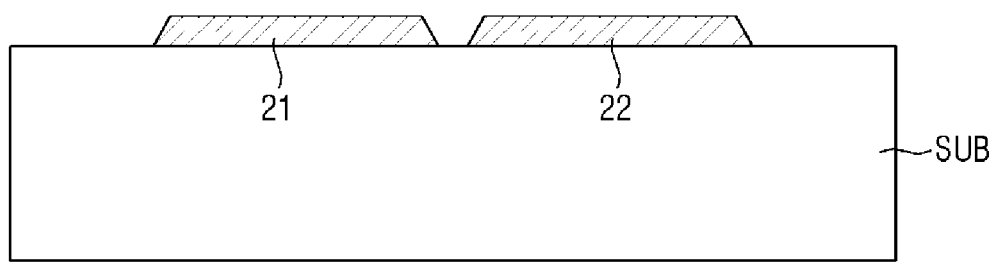
FIGS. 15 to 22 are schematic cross-sectional views illustrating a method for printing the bipolar elements using the inkjet printing device according to an embodiment.
Figure 15:
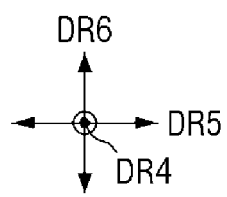

After the setting of the inkjet printing device 1000 is completed, the target substrate SUB may be prepared, as illustrated in FIG. 15. In an embodiment, a first electrode 21 and a second electrode 22 may be disposed on the target substrate SUB. It has been illustrated in the drawing that a pair of electrodes are disposed, but more than two electrodes may be formed on the target substrate SUB, and multiple inkjet heads 300 may jet the ink 90 onto each pair of electrodes in the same manner.

Figure 16:
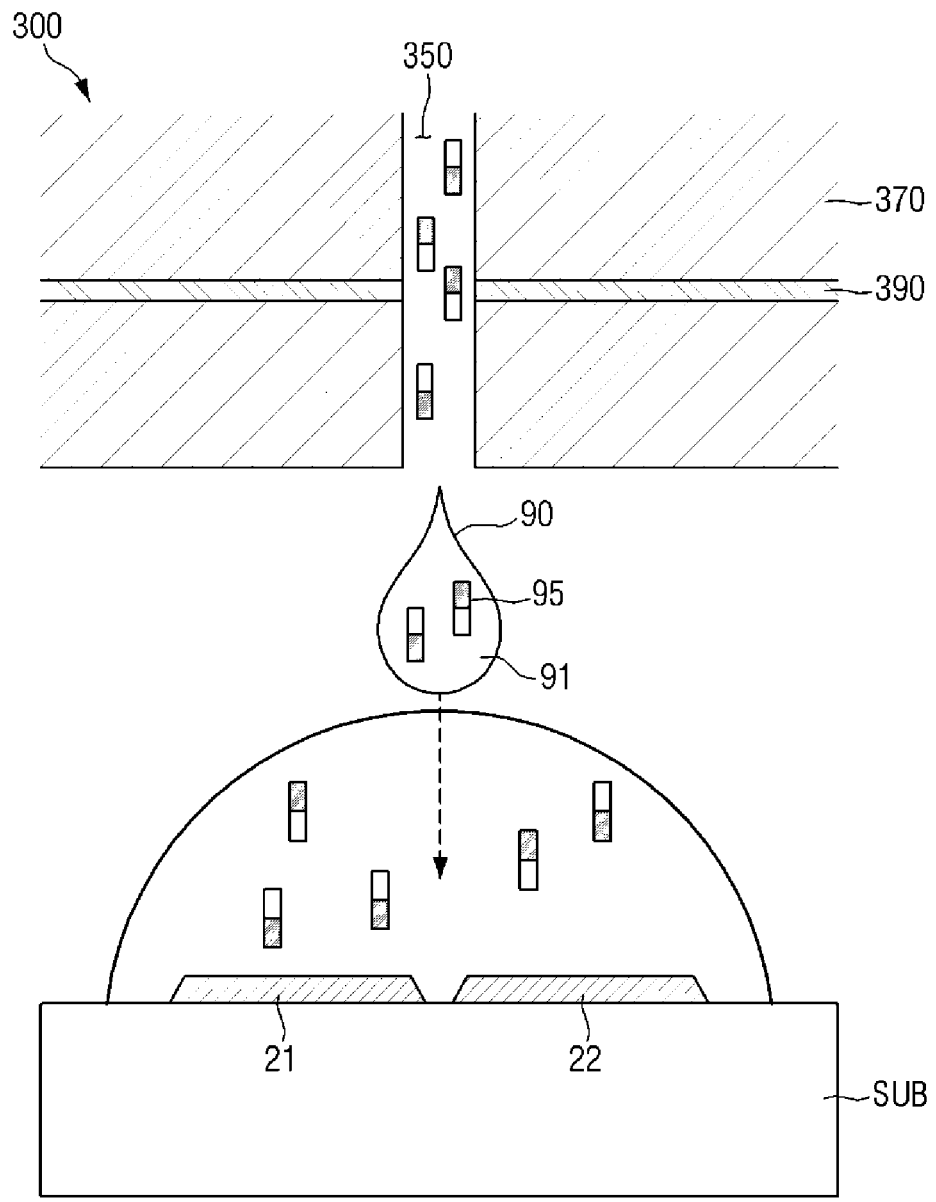
Figure 17:
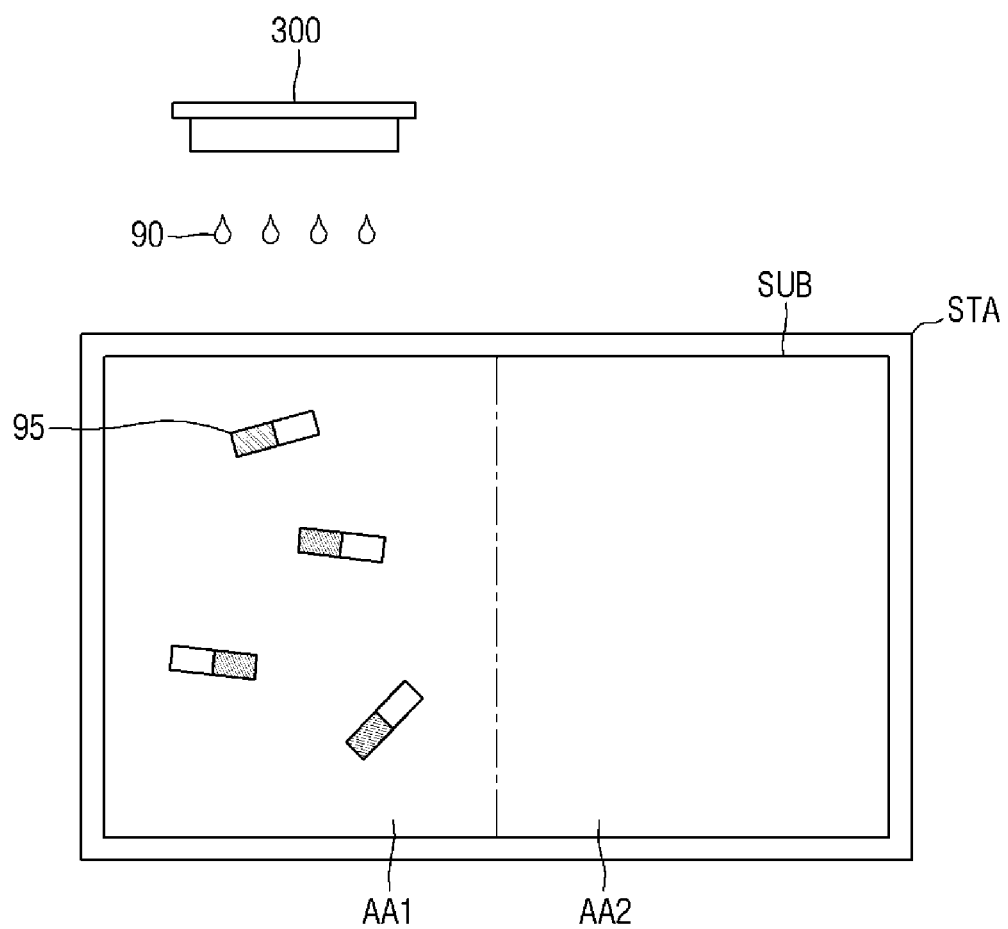

As illustrated in FIGS. 16 and 17, the ink 90 including the solvent 91 in which the bipolar elements 95 are dispersed may be jetted onto the target substrate SUB. The ink 90 may be discharged from the inkjet head 300, and may be jetted onto the first electrode 21 and the second electrode 22 disposed on the target substrate SUB. The ink 90 may be jetted onto the first electrode 21 and the second electrode 22 disposed on the target substrate SUB, and the bipolar elements 95 dispersed in the ink 90 may be jetted onto the target substrate SUB in a state in which they extend in a direction. In some embodiments, which the bipolar elements 95 dispersed in the ink 90 may be oriented so that a direction in which they extend may be directed to a direction perpendicular to an upper surface of the target substrate SUB. In some embodiments, the respective bipolar elements 95 may be jetted in a state in which they are aligned so that first ends thereof having a first polarity or second ends thereof having a second polarity have the same direction. However, the disclosure is not limited thereto.

As illustrated in FIG. 17, the ink 90 may be discharged to a first area AA1 defined on the target substrate SUB during a first printing process. The ink 90 may be seated in the first area AA1 together with the bipolar elements 95. The bipolar elements 95 corresponding to the droplets of the ink 90 discharged from the inkjet head 300 and the number of bipolar elements 95 per unit droplet in the ink 90 may be jetted into the first area AA1.

The inkjet printing device 1000 according to an embodiment may include the sensing part 400 to discharge or jet the ink 90 through the nozzle 350 and measure the number of bipolar element 95 discharged from the nozzle 350. The sensing part 400 may measure at least the number of bipolar elements 95 introduced into the inkjet head 300 to measure the number of bipolar elements 95 per unit droplet of the ink 90 discharged from the nozzle 350. However, the disclosure is not limited thereto, and in some embodiments, the sensing part 400 may also measure the number of bipolar elements 95 flowing in the inner pipe 330 and the number of bipolar elements 95 introduced into the nozzle 350, in addition to the bipolar elements 95 introduced into the inkjet head 300, in order to measure the number of bipolar elements 95 flowing in the inkjet head 300. Information on the measured number of bipolar elements 95 may be collected by each sensing part 400 and may be utilized to measure the number of bipolar elements 95 per unit droplet of the ink 90 discharged through the nozzle 350.

Figure 18:
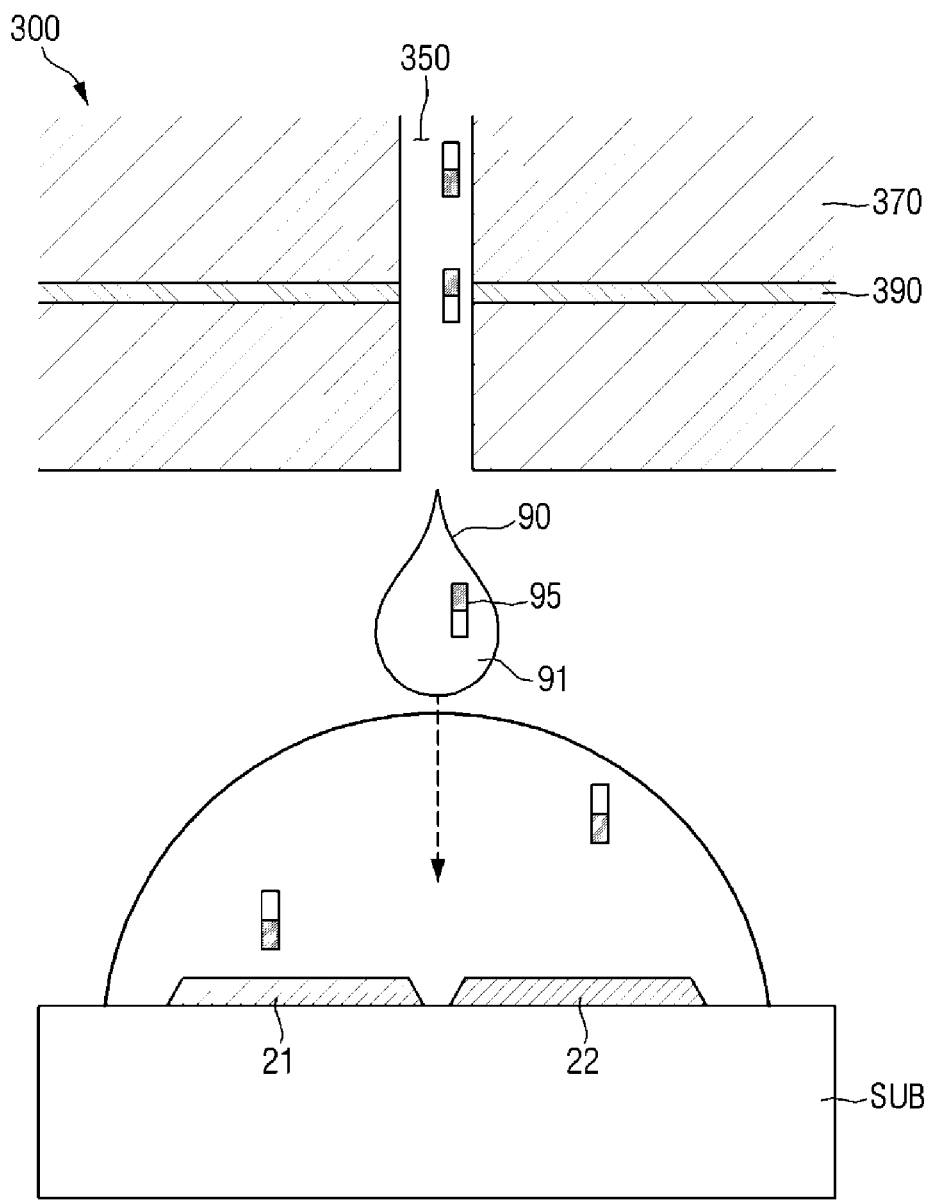

The sensing part 400 may measure the number of bipolar elements 95 discharged from the nozzle 350 and sense a change in the number of bipolar elements 95. For example, as illustrated in FIG. 18, in case that the number of bipolar elements 95 per unit droplet of the ink 90 discharged through the nozzle 350 decreases, the sensing part 400 may determine whether a decrease amount in the number of bipolar elements 95 exceeds a reference set value (S300). In case that the number of bipolar elements 95 per unit droplet of the ink 90 discharged through the nozzle 350 increases, the sensing part 400 may determine whether an increase amount in the number of bipolar elements 95 exceeds another reference set value (S300). As described above, the sensing part 400 may sense the change in the number of bipolar elements 95, determine whether number of bipolar elements 95 exceeds the reference set value based on the change in the number of bipolar elements 95, and feedback a determination result to the actuator 390. The actuator 390 may receive a feedback signal transferred from the sensing part 400 and adjust droplets of the ink 90 discharged from the nozzle 350 of the inkjet head 300.

Figure 19:
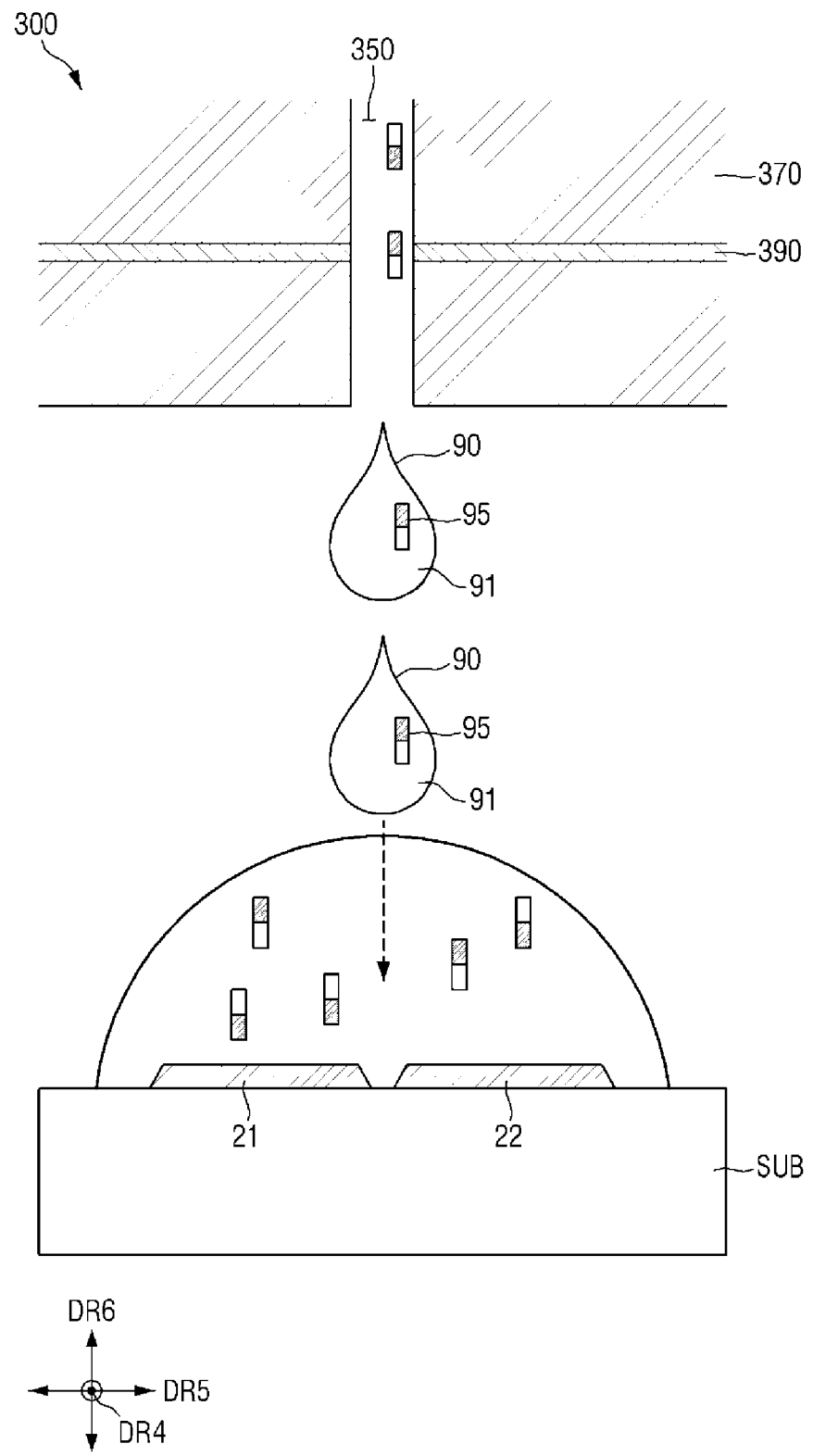
Figure 20:
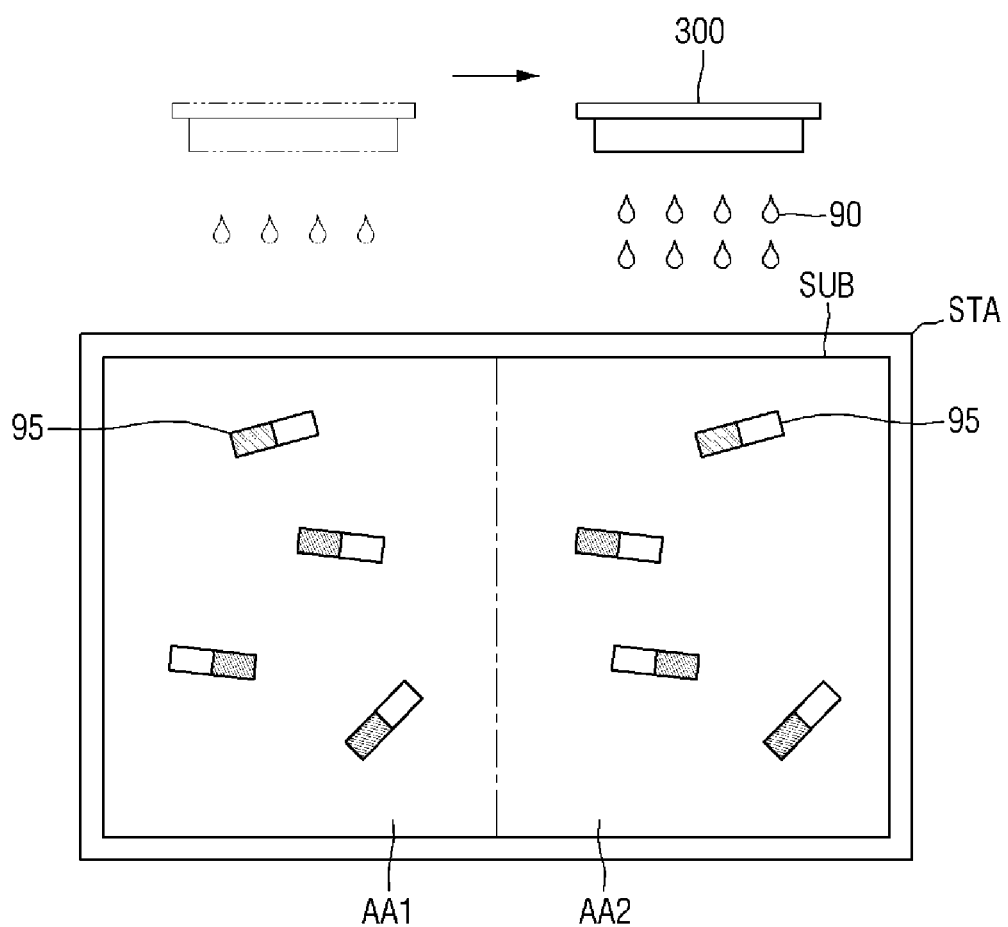

For example, as illustrated in FIGS. 19 and 20, the actuator 390 may receive the change in the number of bipolar elements 95 provided from the sensing part 400 and adjust droplets or the number of drops of the ink 90 discharged from the nozzle 350 per unit process. In case that the number of bipolar elements 95 in the ink 90 decreases, the actuator 390 may increase the number of drops of the ink 90 discharged from the nozzle 350 per unit process.

For example, the ink 90 may be discharged to a second area AA2 defined on the target substrate SUB during a second printing process. The ink 90 may be seated in the second area AA2 together with the bipolar elements 95. In a case where the number of bipolar elements 95 in the ink 90 decreases, in case that the same droplets of ink 90 as that in the first printing process is discharged from the nozzle 350, the number of bipolar elements 95 jetted into the second area AA2 may be smaller than the number of bipolar elements 95 jetted into the first area AA1. The actuator 390 may allow more droplets of ink 90 to be discharged so that the numbers of the bipolar elements 95 jetted into the first area AA1 and the second area AA2 may be uniform even though there is a change in the number of bipolar elements 95 in the ink 90. In the first printing process and the second printing process, the droplets of the discharged ink 90 may be different from each other, but the numbers of jetted bipolar elements 95 may be the same as each other. Therefore, the inkjet printing device 1000 according to an embodiment may uniformly maintain the number of bipolar elements 95 discharged onto the target substrate SUB per unit process, and improve reliability of a manufactured product.

As described above, the bipolar elements 95 may have a shape in which they extend in a direction, and the respective ends of the bipolar elements 95 in a longitudinal direction may have different polarities. The method for printing the bipolar element 95 according to an embodiment may further include seating the bipolar elements 95 so that the direction in which the bipolar elements 95 extend is directed to a direction.

Figure 21:
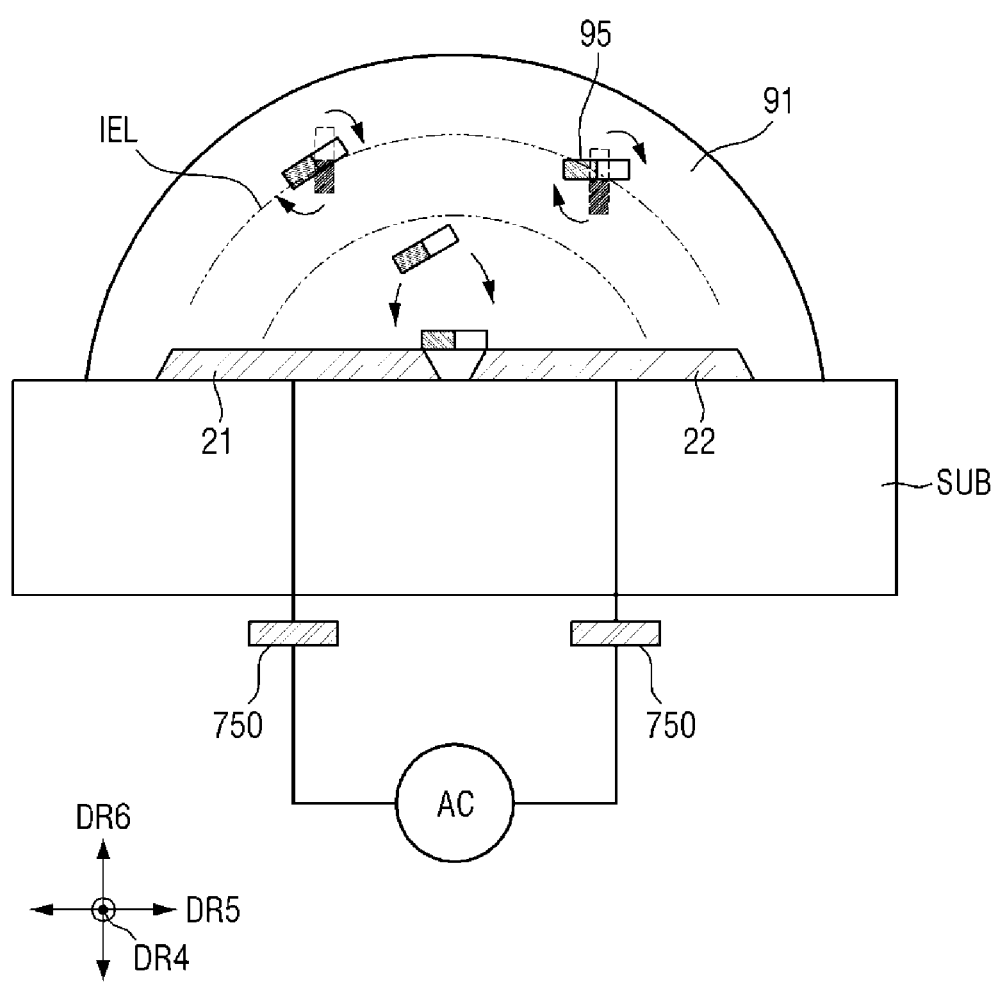

Referring to FIG. 21, during or after the ink 90 in which the bipolar elements 95 are dispersed is jetted onto the target substrate SUB, an electric field IEL may be generated on the target substrate SUB. The bipolar elements 95 may be seated on the target substrate SUB while being oriented in a direction by the electric field IEL. In some embodiments, the bipolar elements 95 may be disposed between the first electrode 21 and the second electrode 22 by receiving a dielectrophoretic force by the electric field IEL generated on the target substrate SUB.

An electrical signal may be applied to the first electrode 21 and the second electrode 22 using the probe units 750. The probe units 750 may be connected to predetermined (or selectable) pads provided on the target substrate SUB, and may apply the electrical signal to the first electrode 21 and the second electrode 22 connected to the pads. In an embodiment, the electrical signal may be an alternating current (AC) voltage or a direct current (DC) voltage. After the AC voltage is applied to the first electrode 21 and the second electrode 22, the electric field IEL may be formed between the first electrode 21 and the second electrode 22, and the bipolar elements 95 may receive a dielectrophoretic force by the electric field IEL2. The bipolar elements 95 to which the dielectrophoretic force is applied may be disposed between the first electrode 21 and the second electrode 22 while their orientation directions and positions change.

As illustrated in the drawing, orientation directions of the bipolar elements 95 extending in a direction in the ink 90 may change depending on a direction of the electric field IEL. According to an embodiment, the bipolar elements 95 may be aligned so that a direction in which they extend is directed to a direction to which the electric field IEL is directed. In case that the electric field IEL generated on the target substrate SUB is generated in parallel with the upper surface of the target substrate SUB, the bipolar element 95 may be aligned so that the direction in which they extend is parallel to the target substrate SUB and be disposed between the first electrode 21 and the second electrode 22. In some embodiments, a step of orienting the bipolar elements 95 may include a step of seating the bipolar elements 95 between the first electrode 21 and the second electrode 22, and at least one ends of the bipolar elements 95 may be disposed on at least one of the first electrode 21 or the second electrode 22. However, the disclosure is not limited thereto, and the bipolar elements 95 may be directly disposed on the target substrate SUB between the first electrode 21 and the second electrode 22.

Figure 22:
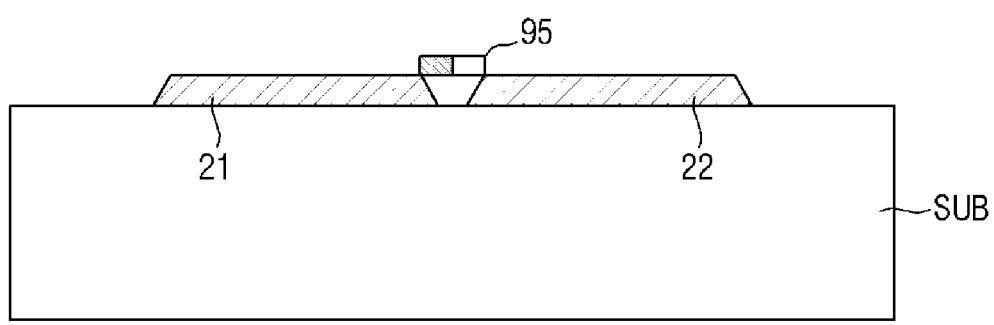
Figure 22:
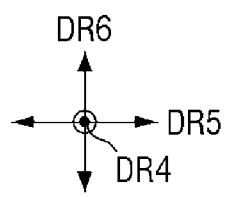

As illustrated in FIG. 22, the solvent 91 of the ink 90 jetted onto the target substrate SUB may be removed. A step of removing the solvent 91 may be performed by a heat treatment device, which may irradiate the target substrate SUB with heat or infrared rays. Since the solvent 91 is removed from the ink 90 jetted onto the target substrate SUB, a flow of the bipolar elements 95 may be prevented, and the bipolar elements 95 may be seated on the electrodes 21 and 22.

Through the method described above, the inkjet printing device 1000 according to an embodiment may print the bipolar elements 95 on the target substrate SUB. The method for printing the bipolar elements 95 according to an embodiment may uniformly maintain the number of bipolar elements 95 discharged per unit process using the inkjet printing device 1000 of FIG. 1. The method for printing the bipolar elements 95 may further include seating the bipolar elements 95 so that the bipolar elements 95 are oriented in a direction. The inkjet printing device 1000 may manufacture a device including bipolar elements 95 oriented in a direction, and the device may include a uniform number of bipolar elements 95 per unit area, such that reliability of a product may be improved.

Hereinafter, various embodiments of the inkjet printing device 1000 will be described.

As described above, the inkjet printing device 1000 may include the sensing part 400 disposed in the inkjet head 300. The sensing part 400 may measure the number of bipolar elements 95 per unit droplet of the ink 90 discharged from the nozzle 350 by the number of bipolar elements 95 per unit volume of the ink 90 flowing in the inkjet head 300. According to another embodiment, the sensing part 400 of the inkjet printing device 1000 may be disposed at another position within the inkjet head 300 and may precisely measure the number of bipolar elements 95.

Figure 23:
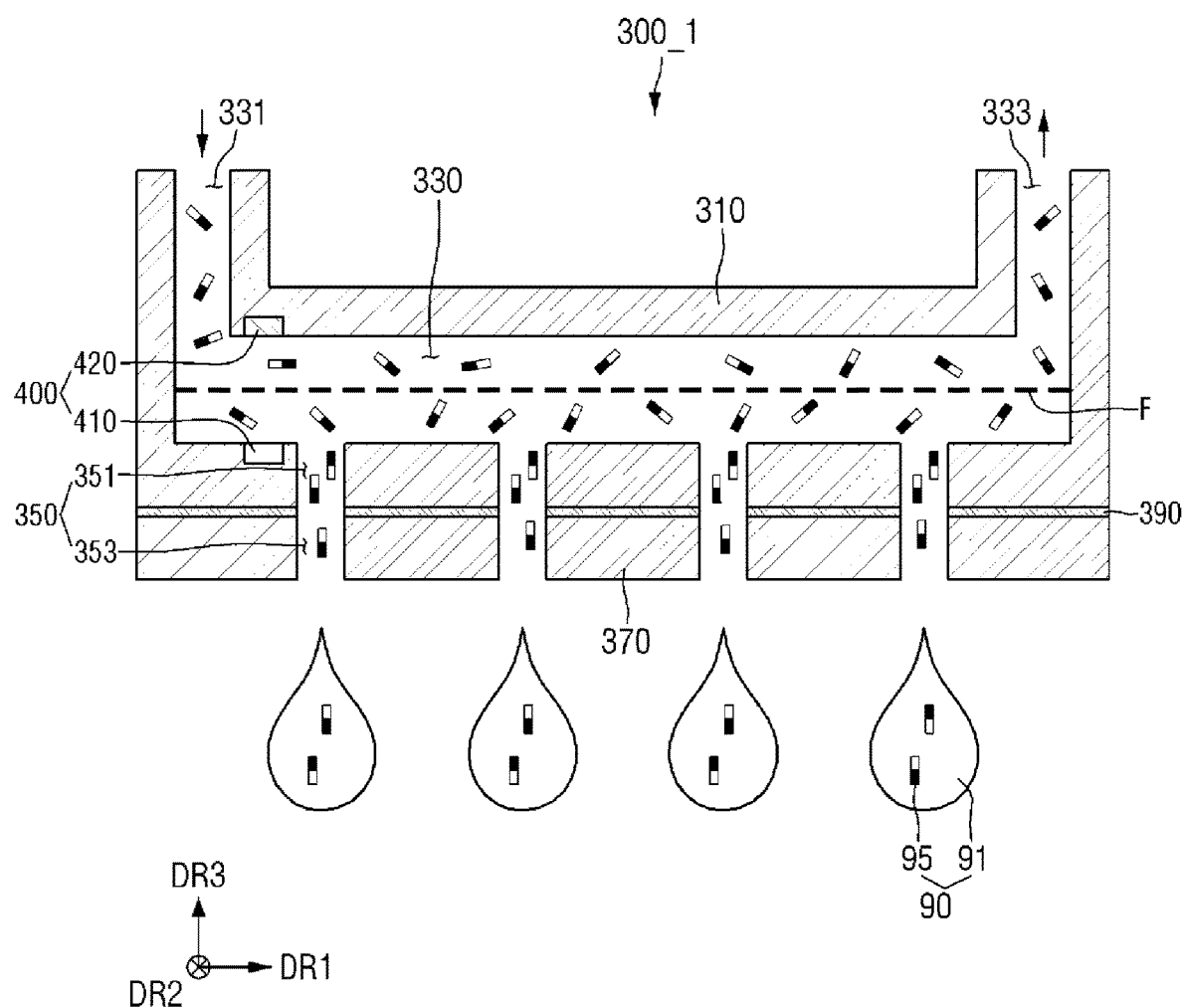
FIGS. 23 and 24 are schematic cross-sectional views of inkjet heads according to other embodiments.
Figure 24:
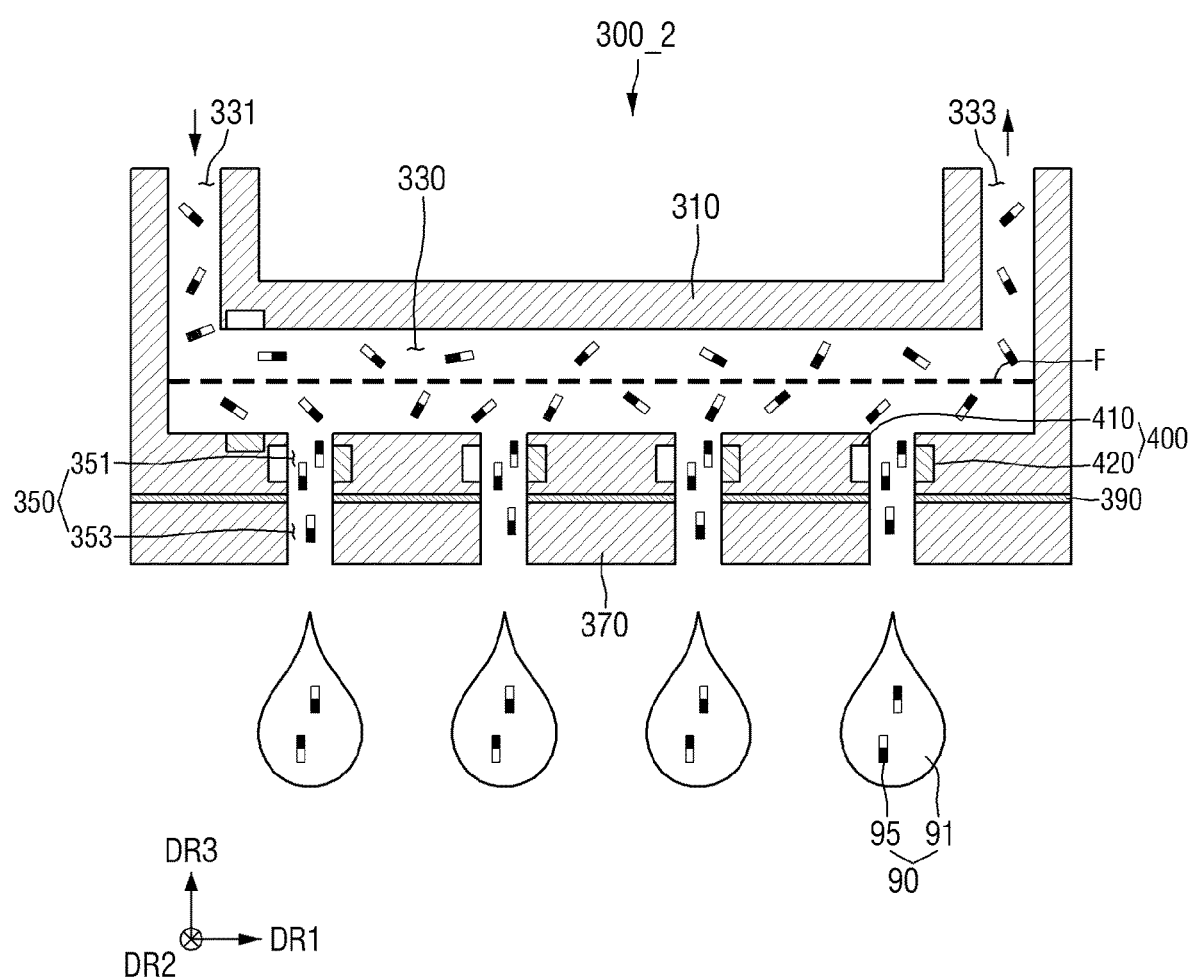

FIGS. 23 and 24 are schematic cross-sectional views of inkjet heads according to another embodiments.

Referring to FIG. 23, the sensing part 400 may be disposed between an inlet 331 of an inner pipe 330 and a nozzle 350 of an inkjet head 300_1. The sensing part 400 may be disposed in the inner pipe 330 in which the ink 90 flows, and may measure the number of bipolar elements 95 before the ink 90 supplied to the inlet 331 of the inner pipe 330 is introduced into the nozzle 350 through a filter F. An embodiment of FIG. 23 is different from an embodiment of FIG. 5 in a position of the sensing part 400. Hereinafter, an overlapping description will be omitted, and contents different from those described above will be described.

The sensing part 400 may be disposed in the inner pipe 330 in which the ink 90 flows before being introduced into the nozzle 350. The sensing part 400 may be disposed more adjacent to the nozzle 350, and may measure at least the number of bipolar elements 95 in the ink 90 introduced into the inlet 351 of the nozzle 350. In some embodiments, the inkjet head 300_1 may further include a sensing part 400 disposed at the inlet 331 of the inner pipe 330 as in an embodiment of FIG. 5, in addition to the sensing part 400 disposed on the inner pipe 330.

In the inkjet printing device 1000 according to an embodiment, the sensing part 400 may be disposed more adjacent to the nozzle 350 from which the ink 90 is discharged, and may more accurately measure a change in the number of bipolar elements 95 discharged from the inkjet head 300_1.

Similarly, in some embodiments, the sensing part 400 of the inkjet printing device 1000 may be disposed in the nozzle 350 from which the ink 90 is discharged.

Referring to FIG. 24, the sensing parts 400 of the inkjet printing device 1000 may be disposed on discharge parts 370 of an inkjet head 300_2. The sensing parts 400 may be provided on the discharge parts 370 and be disposed to correspond to the respective nozzles 350. The first sensor 410 and the second sensor 420 of the sensing part 400 may be disposed to be spaced apart from each other with the nozzle 350 interposed therebetween. The first sensor 410 may measure the number of bipolar elements 95 in the ink 90 introduced into the nozzle 350.

In some embodiments, the sensing parts 400 may be disposed in a form in which they are inserted into the discharge parts 370 so as to correspond to the respective nozzles 350 of the inkjet head 300_2, and may be arranged in the first direction DR1 along the nozzles 350 arranged in the first direction DR1. Multiple sensing parts 400 may also be arranged in the second direction DR2 along the nozzles 350 arranged in the second direction DR2. The sensing parts 400 may be disposed to be spaced apart from other neighboring sensing parts 400, and may be disposed to correspond to the respective nozzles 350.

According to an embodiment, the sensing part 400 may be disposed above the actuator 390 disposed in the discharge part 370. The sensing part 400 may be disposed adjacent to the inlet 351 of the nozzle 350 between the actuator 390 and the inner pipe 330, and may measure the number of bipolar elements 95 before the ink 90 passes through the actuator 390 and is discharged.

The bipolar elements 95 may have a shape in which they extend in a direction, and thus may be agglomerated at the inlet 351 of the nozzle 350, such that the number of bipolar elements 95 introduced into the nozzle 350 may decrease. The number of bipolar elements 95 introduced into the inner pipe 330 may not change, but the number of bipolar elements 95 discharged through the nozzle 350 may decrease. In case that the sensing part 400 is disposed only at the inlet 331 of the inner pipe 330, a decrease in the number of bipolar elements 95 at the inlet 351 of the nozzle 350 may not be sensed. In order to prevent such a problem, the sensing part 400 may be disposed on the discharge part 370 of the inkjet head 300, and may measure the number of bipolar elements 95 in the ink 90 immediately before being discharged from the nozzle 350. The sensing parts 400 may be disposed at the inlet 331 of the inner pipe 330 and the discharge part 370 in which the nozzle 350 is disposed, respectively, and may more accurately measure the change in the number of bipolar elements 95.

A method for the sensing part 400 to measure the number of bipolar elements 95 is not limited to an embodiment of FIG. 6. As described above, the bipolar elements 95 may have a small size and may have partially different polarities. The sensing part 400 may measure the number of bipolar elements 95 by a method other than a method for directly capturing an image in consideration of characteristics of the bipolar element 95.

Figure 25:
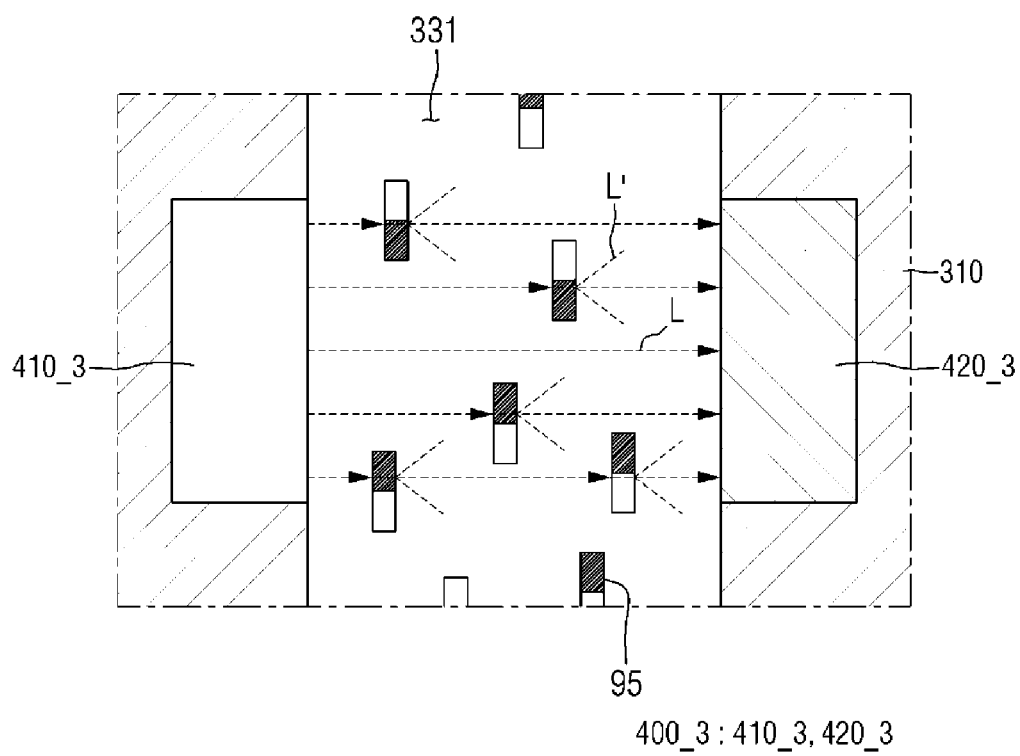
FIG. 25 is a schematic cross-sectional view illustrating that a sensing part detects the number of bipolar elements according to another embodiment.

FIG. 25 is a schematic cross-sectional view illustrating that a sensing part detects the number of bipolar elements according to another embodiment.

Referring to FIG. 25, in a sensing part 400_3, a first sensor 410_3 may emit light of a specific wavelength band, and the second sensor 420_3 may sense the light emitted from the first sensor 410_3 to measure the number of bipolar elements 95 in the ink 90. In the embodiment, the first sensor 410_3 may be a light emitting part, and the second sensor 420_3 may be a light receiving part. An embodiment of FIG. 25 is different from the embodiment of FIG. 6 in a method for the sensing part 400_3 to measure the number of bipolar elements 95. Hereinafter, an overlapping description will be omitted, and contents different from those described above will be described.

The first sensor 410_3 and the second sensor 420_3 of the sensing part 400_3 may be disposed to be spaced apart from each other with the inner pipe 330 or the nozzle 350 through which the ink 90 flows, interposed therebetween. The first sensor 410_3 and the second sensor 420_3 may be disposed in contact with an outer wall of the inner pipe 330 or the nozzle 350, but the disclosure is not limited thereto, and the first sensor 410_3 and the second sensor 420_3 may also be spaced apart from the outer wall.

The first sensor 410_3 may emit light of a specific wavelength band, and the light emitted from the first sensor 410_3 may be incident on the second sensor 420_3. A type of the first sensor 410_3 is not particularly limited. In some embodiments, the first sensor 410_3 may be an ultraviolet (UV) laser irradiation device or lamp capable of emitting ultraviolet light or may be a light irradiation device or lamp capable of emitting visible light or white light. However, the embodiment is not limited thereto, and the first sensor 410_3 may be a device capable of irradiating the ink 90 with light and may be variously modified as long as it may be adopted in the technical field. The first sensor 410_3 may irradiate the ink 90 with the light, and the light may pass through the ink 90 and may be incident on the second sensor 420_3.

As the ink 90 is introduced into the inkjet head 300, the light emitted from the first sensor 410_3 may be incident on the bipolar elements 95. The light may be partially scattered by interference of the bipolar elements 95, and the second sensor 420_3 may receive the light emitted from the first sensor 410_3 and the scattered light to measure the number of bipolar elements 95 per unit volume or unit droplet of the ink 90 flowing through the inner pipe 330.

The first sensor 410_3 of the sensing part 400_3 may radiate light L (see FIG. 25) toward the second sensor 420_3. The light L may be at least partially irradiated to the bipolar elements 95 while passing through the ink 90 and being incident on the second sensor 420_3. The bipolar elements 95 may have a small size, and as the light L is irradiated to the bipolar elements 95 dispersed in the ink 90, some of the light L may be scattered (L' of FIG. 25). In addition to the light L emitted from the first sensor 410_3, the light L' scattered by the bipolar elements 95 may be incident on the second sensor 420_3. The light L' scattered by the bipolar elements 95 may have a specific waveform according to a Brownian motion of the bipolar elements 95. The second sensor 420_3 may measure sizes of the bipolar element 95 by analyzing the waveform of the light L' scattered by the bipolar elements 95, and may measure the number of bipolar elements 95 per unit volume or unit droplet of the ink 90 through the measured sizes. The sensing part 400_3 may measure the number or a dispersion degree of bipolar elements 95 in the discharged ink 90 by the measured number of bipolar elements 95 and droplets of the ink 90 discharged from the nozzle 350.

According to an embodiment, the base part 310 of the inkjet head 300 may have an outer wall made of a transparent material so that the light emitted from the first sensor 410_3 of the sensing part 400_3 may be irradiated to the bipolar elements 95 in the ink 90. In another embodiment, the inner pipe 330 or the nozzle 350 of the inkjet head 300 may have an outer wall made of a transparent material. The first sensor 410_3 and the second sensor 420_3 may be positioned in contact with at least the outer wall of the inner pipe 330 or the nozzle 350, and due to the outer wall made of the transparent material, the light emitted from the first sensor 410_3 may pass through the ink 90 and be incident on the second sensor 420_3.

The bipolar element 95 may include portions having different polarities, and the bipolar element 95 itself may have a dipole moment directed to a direction. The bipolar elements 95 may form an electric field (E-field) due to the dipole moment, and as represented in the following Equation 1, a magnetic field may be generated by a change in the electric field while the bipolar elements 95 flow in the inner pipe 330 in a state in which they are dispersed in the ink 90.

$$\nabla \times B = \mu_0 \left( J + \varepsilon_0 \frac{\partial E}{\partial t} \right) \quad \text{[Equation 1]}$$

In Equation 1, 'B' is strength (or force) of the magnetic field, 'μ' is permeability, 'J' is a current density, 'ε' is permittivity, 'E' is strength of the electric field, and 't' is a time.

Referring to Equation 1, the strength of the magnetic field may have a value based on a change in the strength of the electric field per unit time. A change in strength of an electric field corresponding to the number of bipolar elements 95 per unit time may occur within a section while the bipolar elements 95 move. In case that the number of bipolar elements 95 in the ink 90 introduced into the inkjet head 300 changes, the change in the strength of the electric field per unit time within the section may change, and accordingly, strength of the magnetic field may change. According to an embodiment, the sensing part 400 may measure the magnetic field by the movement of the bipolar elements 95 to calculate the number of bipolar elements 95 per unit droplet of the ink 90.

Figure 26:
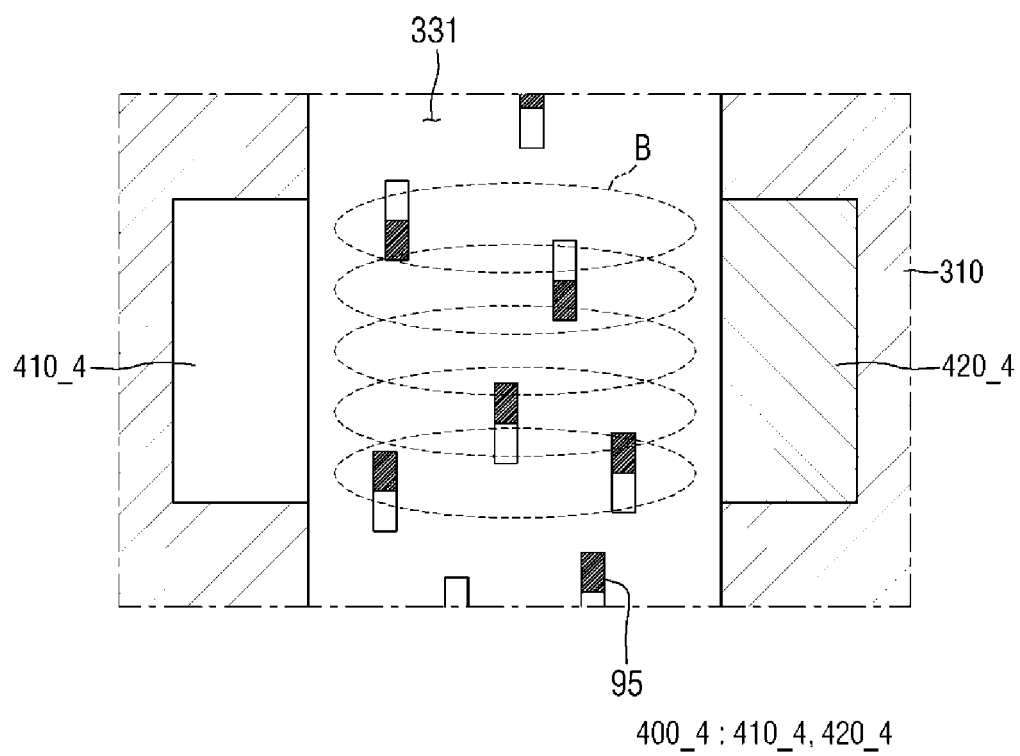
FIG. 26 is a schematic cross-sectional view illustrating that a sensing part detects the number of bipolar elements according to another embodiment.

FIG. 26 is a schematic cross-sectional view illustrating that a sensing part detects the number of bipolar elements according to another embodiment.

Referring to FIG. 26, as the bipolar elements 95 are supplied to the inlet 331 of the inner pipe 330, a magnetic field B due to the movement of the bipolar elements 95 may be generated at the inlet 331 of the inner pipe 330. According to an embodiment, a sensing part 400_4 may measure strength of the magnetic field B due to the movement of the bipolar elements 95. A first sensor 410_4 may measure strength of the magnetic field B generated in a predetermined (or selectable) section within the inner pipe 330, and a second sensor 420_4 may calculate the number of bipolar elements 95 based on the strength of the magnetic field B measured by the first sensor 410_4 and generate a feedback signal according to the calculated number of bipolar elements 95. However, the disclosure is not limited thereto.

The sensing part 400_4 may be disposed at the inlet 331 of the inner pipe 330 to which the ink 90 is supplied, and may measure the strength of the magnetic field B formed in a predetermined (or selectable) section of the inlet 331. The strength of the magnetic field B may change depending on a change in the strength of the electric field, for example, the number and the movement of bipolar elements 95. In case that the number of bipolar elements 95 in the ink 90 supplied to the inkjet head 300 changes, the change in the strength of the electric field by the bipolar elements 95 may change, and the strength of the magnetic field B formed in the predetermined (or selectable) section may change. The first sensor 410_4 of the sensing part 400_4 may sense such a change in the strength of the magnetic field, and the second sensor 420_4 of the sensing part 400_4 may measure a change in the number of bipolar elements 95 flowing in the predetermined (or selectable) section. Therefore, the sensing part 400_4 may transfer a feedback signal to the actuator 390, and the actuator 390 may control droplets of the ink 90 discharged per unit process.

The change in the strength of the magnetic field B formed in the predetermined (or selectable) section by the bipolar elements 95 may be due to the movement of the bipolar elements 95, and may change depending on a flow velocity of the ink 90. According to an embodiment, in order to more effectively measure the change in the strength of the magnetic field, the inkjet head 300 may partially include a portion in which the flow velocity of the ink 90 changes. The sensing part 400 may be disposed to correspond to a portion in which the flow velocity of the ink 90 changes, and may more precisely measure the change in the strength of the magnetic field by the bipolar elements 95.

Figure 27:
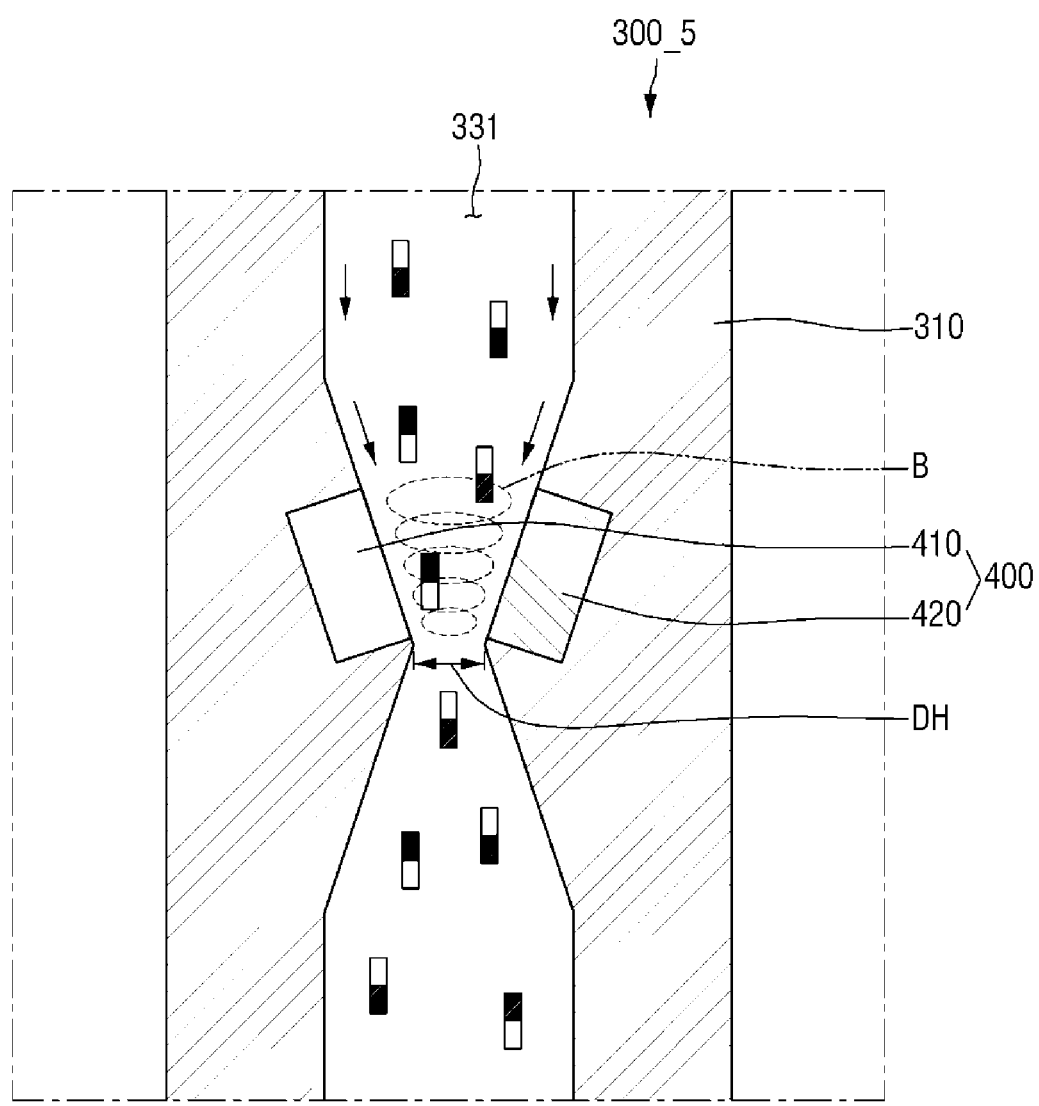
FIGS. 27 and 28 are schematic cross-sectional views illustrating portions of inkjet heads according to another embodiment.
Figure 28:
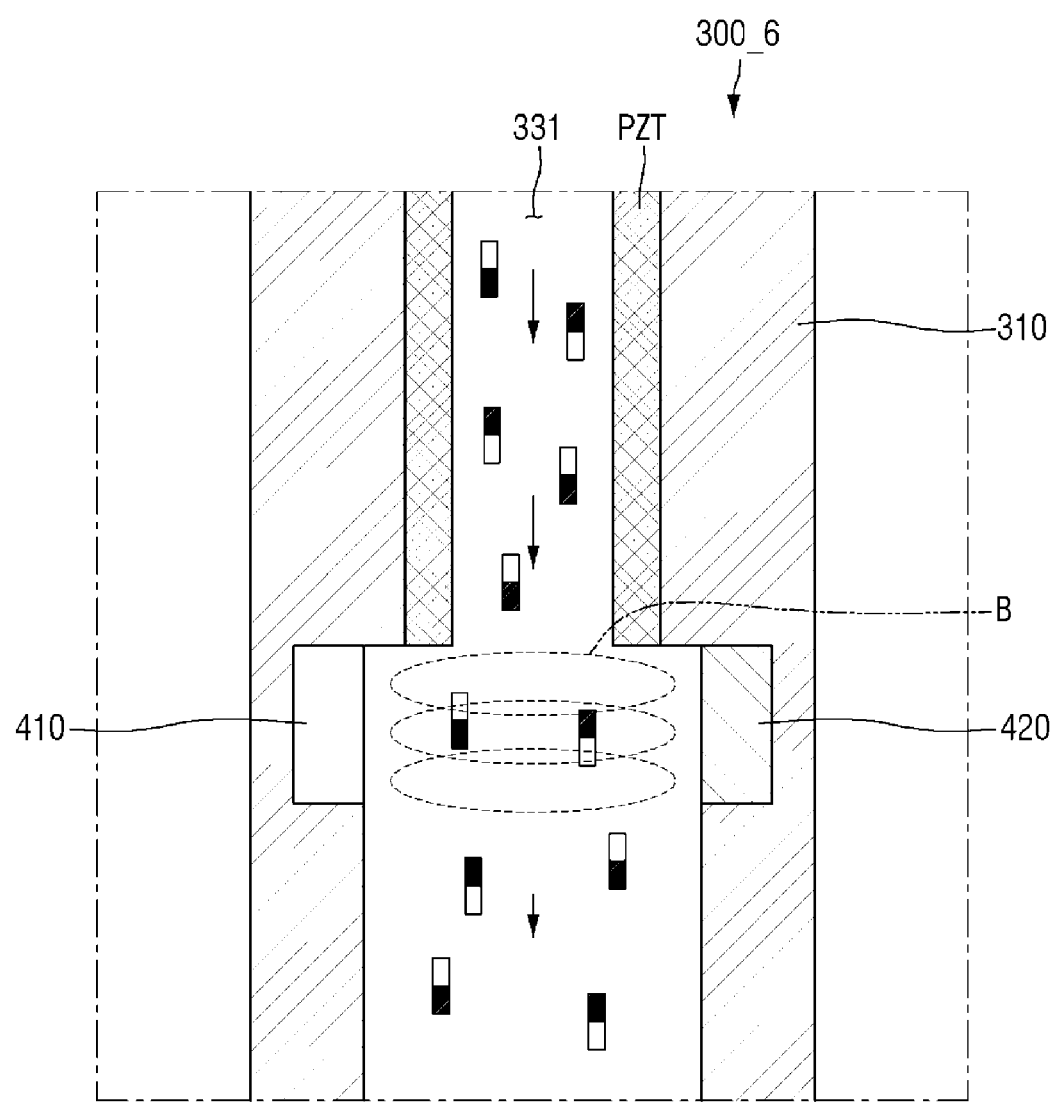

FIGS. 27 and 28 are schematic cross-sectional views illustrating portions of inkjet heads according to another embodiment.

First, referring to FIG. 27, in an inkjet head 300_5 according to the embodiment, the inner pipe 330 or the inlet 331 of the inner pipe 330 may have a smaller diameter DH at a portion where the sensing part 400 is disposed than other portions. As the ink 90 is supplied to the inlet 331 of the inner pipe 330 or flows in the inner pipe 330 and then passes through a section having a narrow diameter, a flow velocity of the ink 90 may increase. In case that the flow velocity of the ink 90 including the bipolar elements 95 increases, a change in strength of an electric field per unit time by the bipolar elements 95 within a predetermined (or selectable) section may increase, and strength of a magnetic field measured by the sensing part 400 may increase. In case that the strength of the magnetic field by the bipolar elements 95 increases, the change in the strength of the magnetic field according to the change in the number of bipolar elements 95 may be sensed.

According to the embodiment, in the inkjet head 300_5, the inner pipe 330 in which the ink 90 flows may include a portion of which a diameter is narrower, and the sensing part 400 may be disposed in the portion in which the diameter decreases. Even though the strength of the magnetic field generated by the bipolar elements 95 is weak, a flow velocity of the ink 90 flowing in an area having the narrow diameter increases, such that the strength of the magnetic field may increase, and the sensing part 400 may precisely measure a change in the strength of the magnetic field.

Similarly, the inkjet head 300 may further include a sub-actuator PZT changing the diameter of the inner pipe 330. Referring to FIG. 28, an inkjet head 300_6 according to the embodiment may further include a sub-actuator PZT disposed at the inner pipe 330 or the inlet 331 of the inner pipe 330 and decreasing a diameter of the inner pipe 330. The sub-actuator PZT may apply a hydraulic pressure to the inner pipe 330 in which the ink 90 flows, and a diameter of the inner pipe 330 may decrease. A flow velocity of the ink 90 may increase as the diameter of the inner pipe 330 decreases.

The sensing part 400 may be disposed adjacent to the sub-actuator PZT and may be disposed in a section where the flow velocity of the ink 90 increases. As the flow velocity of the ink 90 instantaneously increases by the sub-actuator PZT, a moving speed of the bipolar elements 95 also increases, and strength of the magnetic field B generated in a predetermined (or selectable) section may increase.

Figure 29:
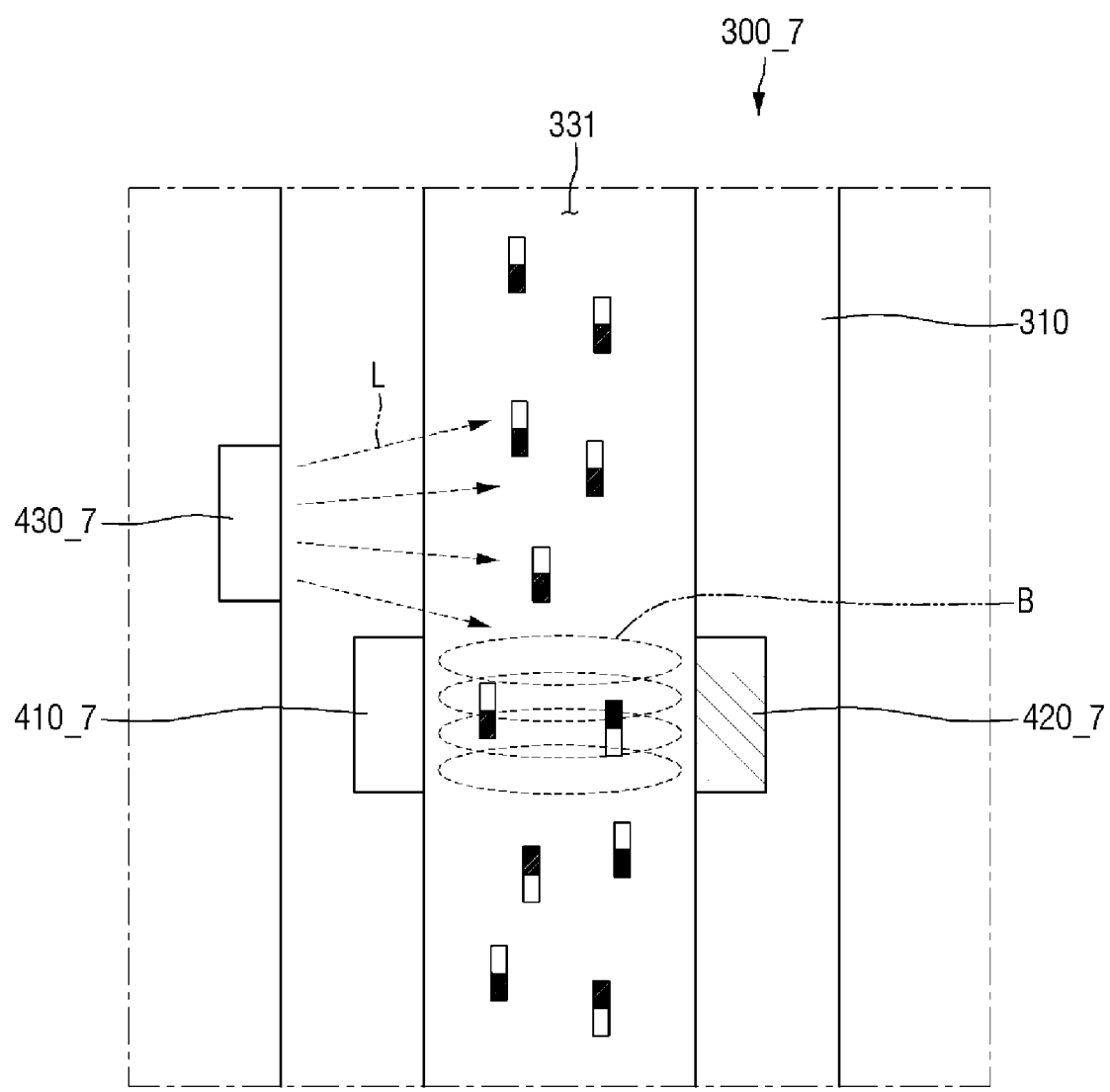
FIG. 29 is a schematic cross-sectional view illustrating that a sensing part detects the number of bipolar elements according to another embodiment.

FIG. 29 is a schematic cross-sectional view illustrating that a sensing part detects the number of bipolar elements according to another embodiment.

In some embodiments, strengths of dipole moments of the bipolar elements 95 may change by light irradiated to the bipolar elements 95. In case that the strengths of the dipole moments of the bipolar elements 95 change, strength of the electric field by the bipolar elements 95 may change, which means that strength of the magnetic field generated by the bipolar elements 95 within a predetermined (or selectable) section increases.

Referring to FIG. 29, a sensing part 400_7 according to an embodiment may further include a light emitting part 430_7 capable of irradiating the ink 90 with light. The light emitting part 430_7 may be disposed in the base part 310 together with a first sensor 410_7, and may irradiate the ink 90 and the bipolar elements 95 flowing in the inner pipe 330 or the nozzle 350 with light of a specific wavelength band. In some embodiments, in the sensing part 400_7, a first sensor 410_7 and the second sensor 420_7 may be disposed to be inserted into the base part 310, and the light emitting part 430_7 may be disposed on an outer surface of the base part 310. As described above, in some embodiments, the base part 310 of the inkjet head 300 may be made of a transparent material, and the light emitted from the light emitting part 430_7 may reach the ink 90 flowing in the inner pipe 330.

The dipole moments of the bipolar elements 95 may increase in response to the light irradiated from the light emitting part 430_7, and strength of an electric field by the bipolar elements 95 may increase. Accordingly, strength of a magnetic field generated by the bipolar elements 95 within the predetermined (or selectable) section may also increase, and the sensing part 400_7 may effectively sense a change in the strength of the magnetic field.

However, the method for measuring the number of bipolar elements 95 is not limited thereto. The bipolar elements 95 may have dipole moments, and accordingly, a capacity or a current may be formed within the predetermined (or selectable) section while the bipolar elements 95 move. The sensing part 400 may measure the capacity or the current of the bipolar elements 95, and may measure the number of bipolar elements 95 from the measured capacity or current.

The inkjet printing device 1000 according to an embodiment may include the sensing part 400 disposed in the inkjet head 300 and capable of measuring the number of bipolar elements 95. The sensing part 400 may directly or indirectly measure the number of bipolar elements 95 in the ink 90 discharged from the inkjet head 300 and sense a change in the number of bipolar elements 95. The change in the number of bipolar elements 95 may be transferred to the actuator 390 of the inkjet head 300, and the actuator 390 may adjust the droplets of the discharged ink 90 The inkjet printing device 1000 may uniformly maintain the number of bipolar elements 95 discharged per unit process by adjusting the droplets of the discharged ink 90. Accordingly, the inkjet printing device 1000 may improve reliability of a product manufactured to include the bipolar elements 95.

The above-described bipolar element 95 may be a light emitting element including multiple semiconductor layers, and according to an embodiment, a display device including the light emitting elements may be manufactured using the inkjet printing device 1000.

Figure 30:
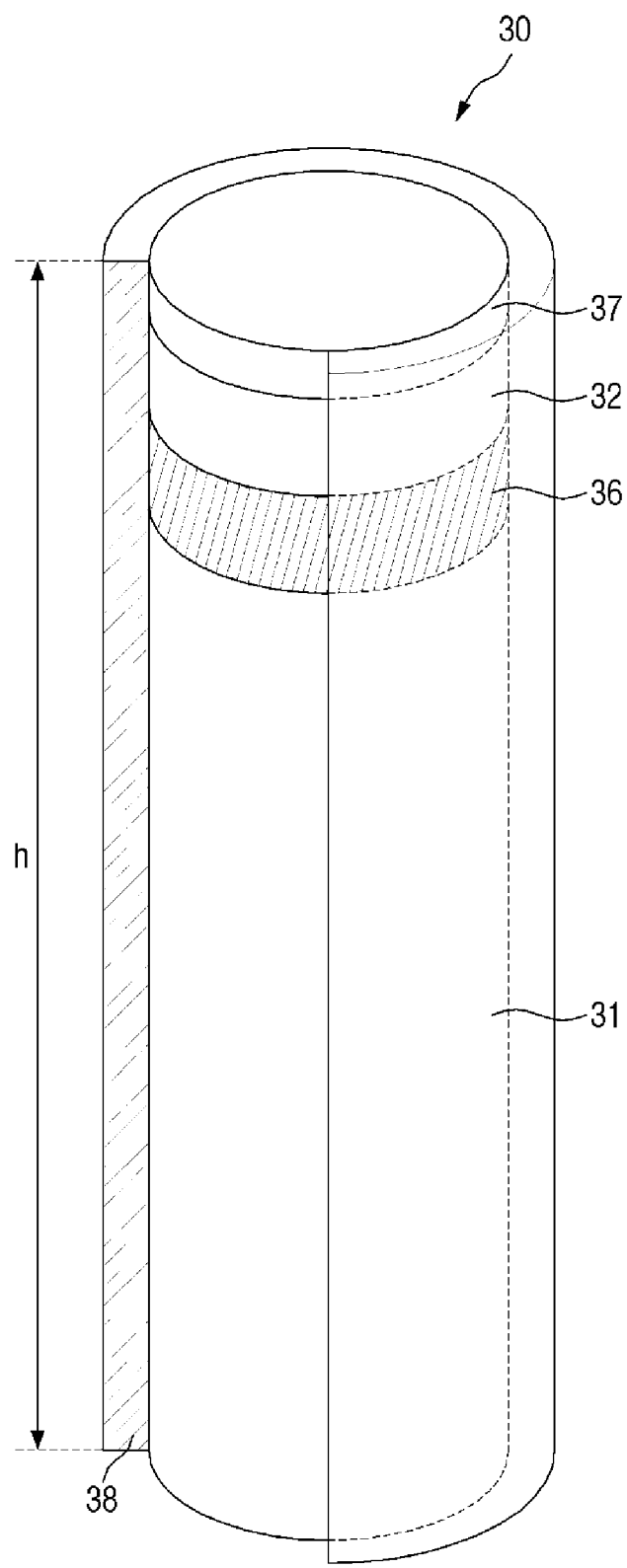
FIG. 30 is a schematic view of a light emitting element according to an embodiment.

FIG. 30 is a schematic view of a light emitting element according to an embodiment.

The light emitting element 30 may be a light emitting diode. For example, the light emitting element 30 may be an inorganic light emitting diode having a size of a micrometer or nanometer scale and made of an inorganic material. The inorganic light emitting diodes may be aligned between two electrodes in which polarities are formed in case that an electric field is formed in a specific direction between the two electrodes facing each other. The light emitting elements 30 may be aligned between the two electrodes by the electric field formed on the two electrodes.

Referring to FIG. 30, the light emitting element 30 according to an embodiment may have a shape in which it extends in a direction. The light emitting element 30 may have a shape such as a rod shape, a wire shape, or a tube shape. In an embodiment, the light emitting element 30 may have a cylindrical shape or a rod shape. However, the light emitting element 30 is not limited to the shape described above, and may have various shapes. For example, the light emitting element 30 may have a polygonal prismatic shape such as a cubic shape, a rectangular parallelepiped shape, or a hexagonal prismatic shape or have a shape in which it extends in a direction, but outer surfaces thereof are partially inclined.

The light emitting element 30 may include a semiconductor layer doped with any conductivity-type (e.g., p-type or n-type) impurities. The semiconductor layer may receive an electrical signal applied from an external power source to emit light of a specific wavelength band. Multiple semiconductors included in the light emitting element 30 may have a structure in which they are sequentially disposed or stacked each other along the direction.

The light emitting element 30 may include a first semiconductor layer 31, a second semiconductor layer 32, an active layer 36, an electrode layer 37, and an insulating film 38. FIG. 30 illustrates a state in which the insulating film 38 is partially removed to expose the semiconductor layers 31, 32, and 36 in order to visually illustrate the respective components of the light emitting element 30. However, as described later, the insulating film 38 may be disposed to surround outer surfaces of the semiconductor layers 31, 32, and 36.

The first semiconductor layer 31 may be an n-type semiconductor. For example, in case that the light emitting element 30 emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more of AlGaInN, GaN, AlGaN, InGaN, AlN, and InN doped with an n-type dopant. The first semiconductor layer 31 may be doped with an n-type dopant, which may include Si, Ge, Sn, or the like. In an embodiment, the first semiconductor layer 31 may be made of GaN doped with n-type Si. A length of the first semiconductor layer 31 may be in the range of about 1.5 μm to about 5 μm, but is not limited thereto.

The second semiconductor layer 32 may be disposed on an active layer 36 to be described later. The second semiconductor layer 32 may be a p-type semiconductor, and for example, in case that the light emitting element 30 emits light of a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may include one or more of AlGaInN, GaN, AlGaN, InGaN, AlN, and InN doped with a p-type dopant. The second semiconductor layer 32 may be doped with a p-type dopant, which may include Mg, Zn, Ca, Se, Ba, or the like. In an embodiment, the second semiconductor layer 32 may be made of GaN doped with p-type Mg. A length of the second semiconductor layer 32 may be in the range of about 0.05 μm to about 0.10 μm, but is not limited thereto.

It has been illustrated in the drawing that each of the first semiconductor layer 31 and the second semiconductor layer 32 is configured as one layer, the disclosure is not limited thereto. According to some embodiments, each of the first semiconductor layer 31 and the second semiconductor layer 32 may further include more layers, for example, a clad layer or a tensile strain barrier reducing (TSBR) layer, according to a material of the active layer 36.

The active layer 36 may be disposed between the first semiconductor layer 31 and the second semiconductor layer 32. The active layer 36 may include a material having a single or multiple quantum well structure. In case that the active layer 36 includes the material having the multiple quantum well structure, the active layer 36 may have a structure in which multiple quantum layers and well layers are alternately stacked each other. The active layer 36 may emit light by a combination of electron-hole pairs in response to electrical signals applied through the first semiconductor layer 31 and the second semiconductor layer 32. For example, in case that the active layer 36 emits light of a blue wavelength band, the active layer 36 may include a material such as AlGaN or AlGaInN. In particular, in case that the active layer 36 has the multiple quantum well structure, for example, the structure in which the quantum layers and the well layers are alternately stacked each other, the quantum layers may include a material such as AlGaN or AlGaInN, and the well layers may include a material such as GaN or AlInN. In an embodiment, the active layer 36 may include AlGaInN as a material of the quantum layers and AlInN as a material of the well layers to emit blue light having a central wavelength band of about 450 nm to about 495 nm.

However, the disclosure is not limited thereto, and the active layer 36 may have a structure in which semiconductor materials having large band gap energy and semiconductor materials having small band gap energy are alternately stacked each other, and may include Group III to Group V semiconductor materials depending on a wavelength band of emitted light. The light emitted by the active layer 36 is not limited to the light of the blue wavelength band, and in some embodiments, the active layer 36 may emit light of red or green wavelength bands. A length of the active layer 36 may be in the range of about 0.05 μm to about 0.10 μm, but is not limited thereto.

The light emitted from the active layer 36 may be emitted not only to outer surfaces of the light emitting element 30 in a length direction, but also to both side surfaces of the light emitting element 30. Directivity of the light emitted from the active layer 36 is not limited to one direction.

The electrode layer 37 may be an ohmic contact electrode. However, the disclosure is not limited thereto, and the electrode layer 37 may also be a Schottky contact electrode. The light emitting element 30 may include at least one electrode layer 37. It has been illustrated in FIG. 30 that the light emitting element 30 includes one electrode layer 37, but the disclosure is not limited thereto. In some embodiments, the light emitting element 30 may also include more electrode layers 37 or the electrode layer 37 may also be omitted. A description of a light emitting element 30 to be provided later may be equally applied even though the number of electrode layers 37 is changed or the light emitting element 30 further includes another structure.

The electrode layer 37 may decrease resistance between the light emitting element 30 and an electrode or a contact electrode in case that the light emitting element 30 is electrically connected to the electrode or the contact electrode in a display device 10 according to an embodiment. The electrode layer 37 may include a metal having conductivity. The electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 37 may include a semiconductor material doped with an n-type or p-type dopant. The electrode layer 37 may include the same material or include different materials. A length of the electrode layer 37 may be in the range of about 0.05 μm to about 0.10 μm, but is not limited thereto.

The insulating film 38 may be disposed to surround outer surfaces of the semiconductor layers and the electrode layers described above. In an embodiment, the insulating film 38 may be disposed to surround at least an outer surface of the active layer 36, and may extend in a direction in which the light emitting element 30 extends. The insulating film 38 may serve to protect these members. For example, the insulating film 38 may be formed to surround side surface portions of these members, but may be formed to expose both ends of the light emitting element 30 in a longitudinal direction.

It has been illustrated in the drawing that the insulating film 38 is formed to extend in the longitudinal direction of the light emitting element 30 to cover side surfaces of the first semiconductor layer 31 to the electrode layer 37, but the disclosure is not limited thereto. The insulating film 38 may cover only outer surfaces of some of the semiconductor layers as well as the active layer 36 or cover only a portion of an outer surface of the electrode layer 37, such that the outer surface of each electrode layer 37 may be partially exposed. The insulating film 38 may also be formed so that an upper surface thereof is rounded in cross-sectional view in an area adjacent to at least one end of the light emitting element 30.

A thickness of the insulating film 38 may be in the range of about 10 nm to about 1.0 μm, but is not limited thereto. The thickness of the insulating film 38 may be about 40 nm.

The insulating film 38 may include materials having insulating properties, such as silicon oxide ($SiO_x$), silicon nitride ($SiN_x$), silicon oxynitride ($SiO_xN_y$), aluminum nitride (AlN), and aluminum oxide ($Al_2O_3$). Accordingly, an electrical short circuit that may occur in case that the active layer 36 is in direct contact with an electrode through which an electrical signal is transferred to the light emitting element 30 may be prevented. The insulating film 38 may protect an outer surface of the light emitting element 30 as well as the active layer 36, and may thus prevent a decrease in luminous efficiency.

In some embodiments, an outer surface of the insulating film 38 may be surface-treated. The light emitting elements 30 may be jetted and aligned onto electrodes in a state in which they are dispersed in a predetermined (or selectable) ink when the display device 10 is manufactured. Here, in order to maintain the light emitting elements 30 in a state in which the light emitting elements 30 are dispersed without being agglomerated with other adjacent light emitting elements 30 in the ink, a hydrophobic or hydrophilic treatment may be performed on a surface of the insulating film 38.

The light emitting element 30 may have a length h in a range of about 1 μm to about 10 μm, about 2 μm to about 6 μm, or about 3 μm to about 5 μm. A diameter of the light emitting element 30 may be in the range of about 30 nm to about 700 nm, and an aspect ratio of the light emitting element 30 may be about 1.2 to about 100. However, the disclosure is not limited thereto, and multiple light emitting elements 30 included in the display device 10 may have different diameters according to a difference in composition between the active layers 36. The diameter of the light emitting element 30 may be about 500 nm.

According to an embodiment, the inkjet printing device 1000 may disperse the light emitting elements 30 of FIG. 30 in the ink 90 and jet or discharge the ink 90 in which the light emitting elements 30 are dispersed onto the target substrate SUB to manufacture the display device 10 including the light emitting elements 30.

Figure 31:
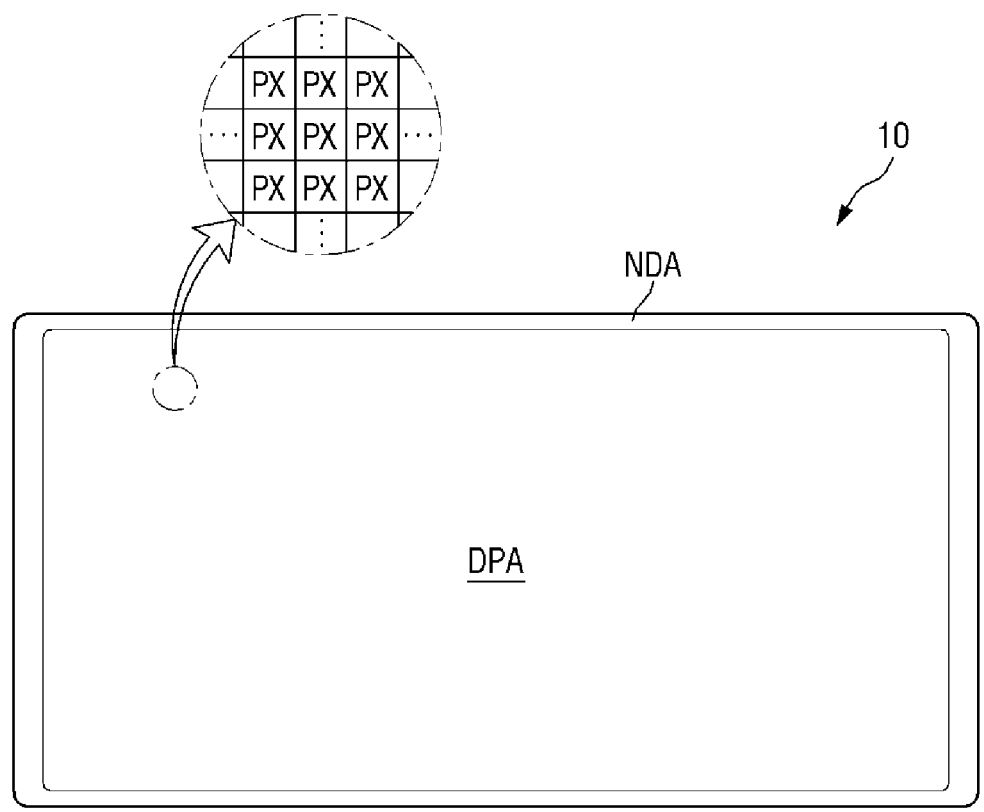
FIG. 31 is a schematic plan view of a display device according to an embodiment.

FIG. 31 is a schematic plan view of a display device according to an embodiment.

Referring to FIG. 31, a display device 10 may display a moving image or a still image. The display device 10 may include all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

A shape of the display device 10 may vary. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 31, the display device 10 and the display area DPA having the rectangular shape with the width greater than the length are illustrated.

The display device 10 may include a display area DPA and non-display areas NDA. The display area DPA may be an area in which a screen may be displayed, and the non-display areas NDA may be areas in which the screen is not displayed. The display area DPA may also be referred to as an active area, and the non-display area NDA may also be referred to as a non-active area.

The display area DPA may occupy substantially the center of the display device 10. The display area DPA may include multiple pixels PX. The pixels PX may be arranged in a matrix direction. A shape of each pixel PX may be a rectangular shape or a square shape in a plan view, but is not limited thereto, and may also be a rhombic shape of which each side is inclined with respect to one direction. Each of the pixels PX may include one or more light emitting elements 30 emitting light of a specific wavelength band to display a specific color.

Figure 32:
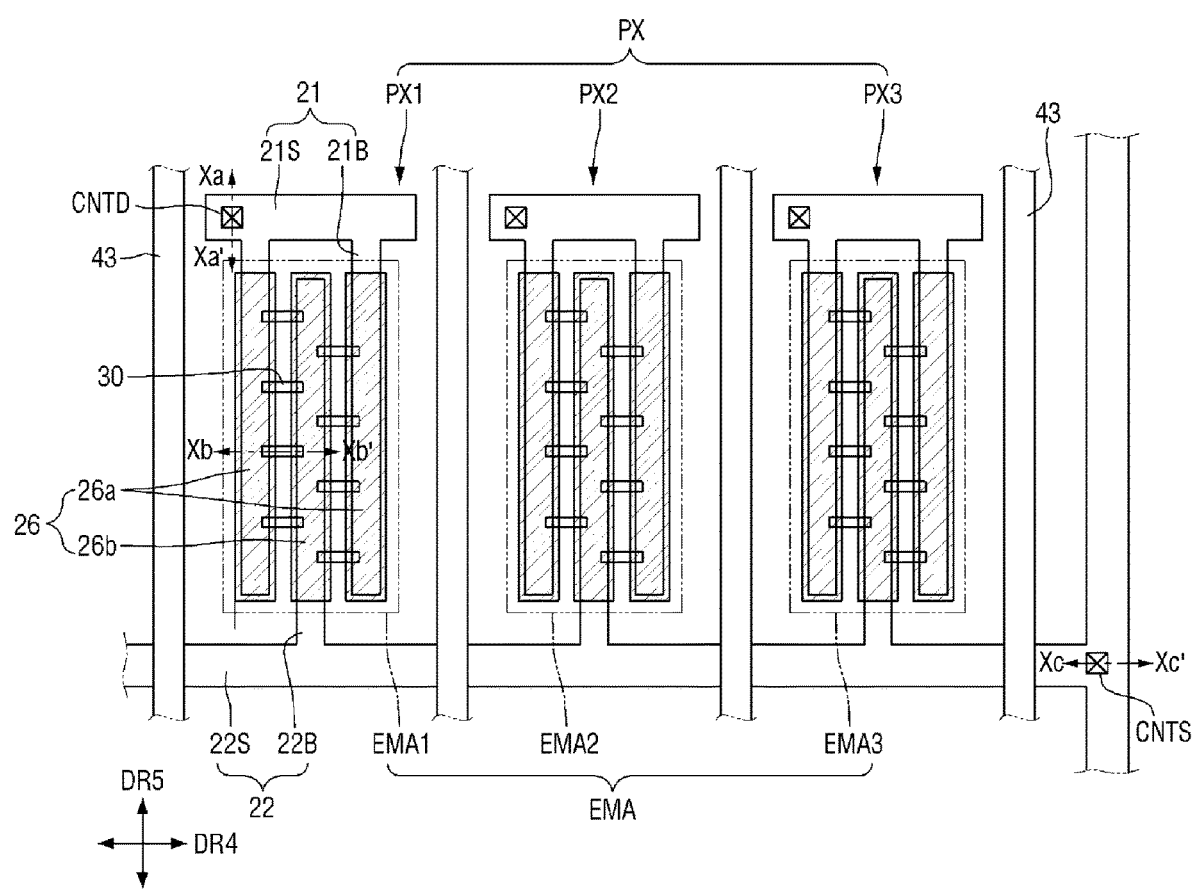
FIG. 32 is a plan view illustrating a pixel of the display device according to an embodiment.

FIG. 32 is a schematic plan view of a pixel of the display device according to an embodiment.

Referring to FIG. 32, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the disclosure is not limited thereto, and the respective sub-pixels PXn may emit light of the same color. It has been illustrated in FIG. 32 that the pixel PX includes three sub-pixels PXn, but the disclosure is not limited thereto, and the pixel PX may include more than three sub-pixels PXn.

Each of the sub-pixels PXn of the display device 10 may include an area defined as an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as an area in which the light emitting elements 30 included in the display device 10 are disposed to emit light of a specific wavelength band.

Each of the sub-pixels PXn of the display device 10 may include a non-emission area defined as an area other than the emission area EMA. The non-emission area may be an area in which the light emitting elements 30 are not disposed and the light emitted from the light emitting elements 30 does not arrive, and thus, the light is not emitted.

Figure 33:
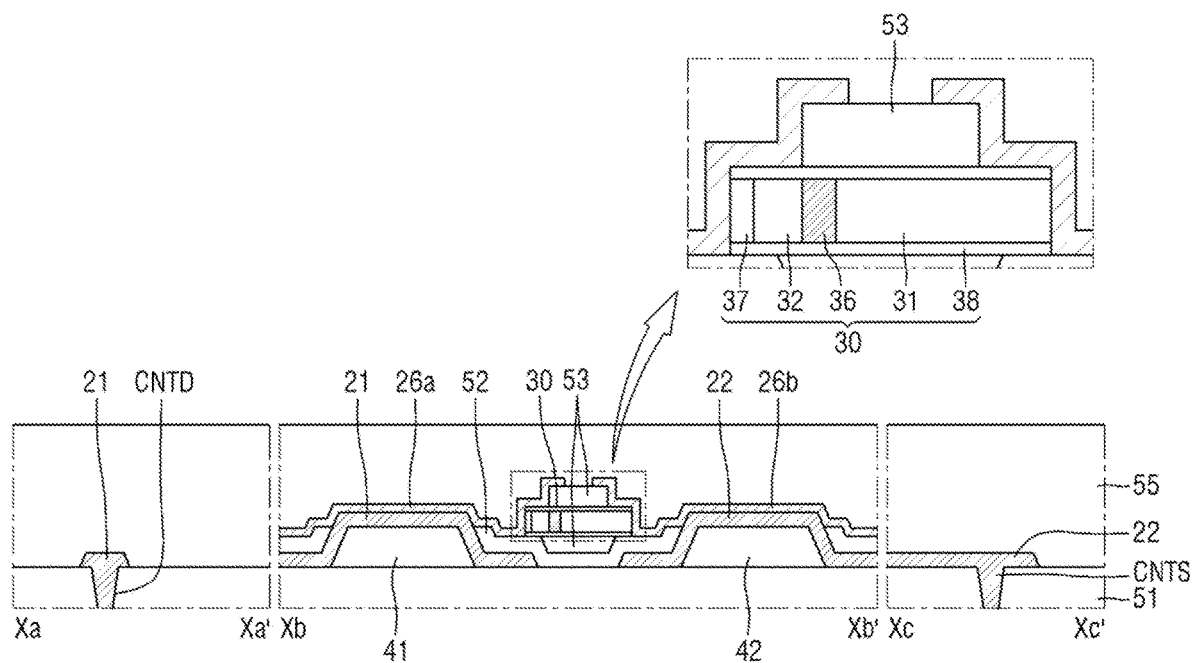
FIG. 33 is a schematic cross-sectional view taken along line Xa-Xa', line Xb-Xb', and line Xc-Xc' of FIG. 32.

Each sub-pixel PXn of the display device 10 may include multiple electrodes 21 and 22, light emitting elements 30, multiple contact electrodes 26, and multiple internal banks 41 and 42 (see FIG. 33), an external bank 43, and at least one insulating layers 51, 52, 53, and 55 (see FIG. 33).

The electrodes 21 and 22 may be electrically connected to the light emitting elements 30, and may receive a predetermined (or selectable) voltage applied thereto so that the light emitting elements 30 emits light of a specific wavelength band. At least a portion of each of the electrodes 21 and 22 may be utilized to form an electric field in the sub-pixel PXn in order to align the light emitting elements 30.

The electrodes 21 and 22 may include a first electrode 21 and a second electrode 22. In an embodiment, the first electrode 21 may be a pixel electrode separated for each sub-pixel PXn, and the second electrode 22 may be a common electrode commonly connected to each sub-pixel PXn. One of the first electrode 21 and the second electrode 22 may be an anode electrode of the light emitting element 30, and the other of the first electrode 210 and the second electrode 220 may be a cathode electrode of the light emitting element 30. However, the first electrode 21 and the second electrode 22 are not limited thereto, and vice versa.

The first electrode 21 and the second electrode 22 may include, respectively, electrode stem parts 21S and 22S disposed to extend in a fourth direction DR4 and at least one electrode branch parts 21B and 22B extending and branching from the electrode stem parts 21S and 22S in a fifth direction DR5, which is a direction crossing the fourth direction DR4.

The first electrode 21 may include a first electrode stem part 21S disposed to extend in the fourth direction DR4 and at least one first electrode branch parts S21B branching from the first electrode stem part 210S and extending in the fifth direction DR5.

The first electrode stem part 21S of any one pixel may have both ends spaced apart from each other and terminated between the respective sub-pixels PXn, but the first electrode stem parts 21S may be disposed on substantially the same straight line as a first electrode stem part 21S in the same row (e.g., in the fourth direction DR4). The first electrode stem parts 21S disposed in the respective sub-pixels PXn may have both ends spaced apart from each other to apply different electrical signals to the respective first electrode branch parts 21B, and the first electrode branch parts 21B may be separately driven.

The first electrode branch parts 21B may branch from at least portions of the first electrode stem part 21S and may be disposed to extend in the fifth direction DR5, but may be terminated in a state in which they are spaced apart from the second electrode stem part 22S disposed to face the first electrode stem part 21S.

The second electrode 22 may include a second electrode stem part 22S extending in the fourth direction DR4 and spaced apart from and facing the first electrode stem part 21S in the fifth direction DR5 and a second electrode branch part 22B branching from the second electrode stem part 22S and extending in the fifth direction DR5. The second electrode stem part 22S may have an end extended to a second electrode stem part 22S of adjacent sub-pixel PXn in the fourth direction DR4. For example, the second electrode stem part 22S may be disposed to extend in the fourth direction DR4 to cross the respective sub-pixels PXn, unlike the first electrode stem part 21S. The second electrode stem part 22S crossing the respective sub-pixels PXn may be connected to a portion extending in a direction in an outer portion of the display area DPA in which the respective pixels PX or sub-pixels PXn are disposed or the non-display area NDA.

The second electrode branch part 22B may be spaced apart from and face the first electrode branch part 21B, and may be terminated in a state in which it is spaced apart from the first electrode stem part 21S. The second electrode branch part 22B may be connected to the second electrode stem part 22S, and an end of the second electrode branch part 22B in an extension direction may be disposed in the sub-pixel PXn in a state in which it is spaced apart from the first electrode stem part 21S.

The first electrode 21 and the second electrode 22 may be electrically connected to a circuit element layer of the display device 10 through contact holes, for example, a first electrode contact hole CNTD and a second electrode contact hole CNTS, respectively. It has been illustrated in the drawing that the first electrode contact hole CNTD is formed for each of the first electrode stem parts 21S of the respective sub-pixels PXn and only one second electrode contact hole CNTS is formed in one second electrode stem part 22S crossing the respective sub-pixels PXn. However, the disclosure is not limited thereto, and in some embodiments, the second electrode contact hole CNTS may also be formed for each sub-pixel PXn.

The external bank 43 may be disposed at boundaries between the respective sub-pixels PXn, and the internal banks 41 and 42 may be adjacent to a central portion of each sub-pixel PXn and may be disposed below the respective electrodes 21 and 22. The internal banks 41 and 42 have not been illustrated in the drawings, but a first internal bank 41 and a second internal bank 42 may be disposed below the first electrode branch part 21B and the second electrode branch part 22B, respectively.

The external bank 43 may be disposed at the boundaries between the respective sub-pixels PXn. Respective ends of multiple first electrode stem parts 21S may be spaced apart from each other and terminated by the external banks 43. The external bank 43 may extend in the fifth direction DR5 and be disposed at the boundaries between the sub-pixels PXn arranged in the fourth direction DR4. However, the disclosure is not limited thereto, and the external bank 43 may also extend in the fourth direction DR4 and may also be disposed at boundaries between sub-pixels PXn arranged in the fifth direction DR5. The external bank 43 and the internal banks 41 and 42 may include the same material and may be formed simultaneously in one process.

The light emitting elements 30 may be disposed between the first electrode 21 and the second electrode 22. One ends of the light emitting elements 30 may be electrically connected to the first electrode 21, and the other ends of the light emitting elements 30 may be electrically connected to the second electrode 22. The light emitting elements 30 may be electrically connected to the first electrode 21 and the second electrode 22 through contact electrodes 26 to be described later, respectively.

The light emitting elements 30 may be disposed to be spaced apart from each other, and may be aligned substantially parallel to each other. A distance between the light emitting elements 30 spaced apart from each other is not particularly limited. In some cases, multiple light emitting elements 30 may be disposed adjacent to each other and may be grouped, and other multiple light emitting elements 30 may be grouped in a state in which they are spaced apart from the light emitting elements 30 by a predetermined (or selectable) distance or multiple light emitting elements 30 may have a non-uniform density, but may be oriented and aligned in a direction. In an embodiment, the light emitting elements 30 may have a shape in which they extend in a direction, and a direction in which the respective electrodes, for example, the first electrode branch part 21B and the second electrode branch part 22B extend, and the direction in which the light emitting elements 30 extend may be substantially perpendicular to each other. However, the disclosure is not limited thereto, and the light emitting elements 30 may be not perpendicular to the direction in which the first electrode branch part 21B and the second electrode branch part 22B extend, and may be disposed to be oblique with respect to the direction in which the first electrode branch part 210B and the second electrode branch part 220B extend.

The light emitting elements 30 according to an embodiment may include active layers 36 including different materials to emit light of different wavelength bands to the outside. In the display device 10, the light emitting elements 30 of the first sub-pixel PX1 may emit first light of which a central wavelength band is a first wavelength, the light emitting elements 30 of the second sub-pixel PX2 may emit second light of which a central wavelength band is a second wavelength, and the light emitting elements 30 of the third sub-pixel PX3 may emit third light of which a central wavelength band is a third wavelength. Accordingly, the first light may be emitted from the first sub-pixel PX1, the second light may be emitted from the second sub-pixel PX2, and the third light may be emitted from the third sub-pixel PX3. In some embodiments, the first light may be blue light having a central wavelength band in the range of about 450 nm to about 495 nm, the second light may be green light having a central wavelength band in the range of about 495 nm to about 570 nm, and the third light may be red light having a central wavelength band in the range of about 620 nm to about 750 nm. However, the disclosure is not limited thereto.

Although not illustrated in FIG. 30, the display device 10 may include a second insulating layer 52 covering at least portions of the first electrode 21 and the second electrode 22.

The second insulating layer 52 may be disposed in each sub-pixel PXn of the display device 10. The second insulating layer 52 may be disposed to substantially entirely cover each sub-pixel PXn, and may also be disposed to extend to adjacent sub-pixels PXn. The second insulating layer 52 may be disposed to cover at least portions of the first electrode 21 and the second electrode 22. The second insulating layer 52 may be disposed to expose portions of the first electrode 21 and the second electrode 22, for example, partial areas of the first electrode branch part 21B and the second electrode branch part 22B.

The contact electrodes 26 may have a shape in which at least partial areas thereof extend in a direction. Each of the contact electrodes 26 may be in contact with the light emitting elements 30 and the electrodes 21 and 22, and the light emitting elements 30 may receive electrical signals from the first electrode 21 and the second electrode 22 through the contact electrodes 26.

The contact electrode 26 may include first contact electrodes 26*a* and a second contact electrode 26*b*. The first contact electrodes 26*a* and the second contact electrode 26*b* may be disposed on the first electrode branch parts 21B and the second electrode branch part 22B, respectively.

The first contact electrode 26*a* may be disposed on the first electrode 21 or the first electrode branch part 21B and may extend in the fifth direction DR5. The first contact electrode 26*a* may be in contact with one ends of the light emitting elements 30. The first contact electrode 26*a* may be in contact with the first electrode 21 exposed without the second insulating layer 52 disposed thereon. Accordingly, the light emitting elements 30 may be electrically connected to the first electrode 21 through the first contact electrode 26*a*.

The second contact electrode 26*b* may be disposed on the second electrode 22 or the second electrode branch part 22B and may extend in the fifth direction DR5. The second contact electrode 26*b* may be spaced apart from the first contact electrode 26*a* in the fourth direction DR4. The second contact electrode 26*b* may be in contact with the other ends of the light emitting elements 30. The second contact electrode 26*b* may be in contact with the second electrode 22 exposed without the second insulating layer 52 disposed thereon. Accordingly, the light emitting elements 30 may be electrically connected to the second electrode 22 through the second contact electrode 26*b*. It has been illustrated in the drawings that two first contact electrodes 26*a* and one second contact electrode 26*b* are disposed in one sub-pixel PXn, but the disclosure is not limited thereto. The numbers of first contact electrodes 26*a* and second contact electrodes 26*b* may change depending on the numbers of first electrodes 21 and second electrodes 22 disposed in each sub-pixel PXn or first electrode branch parts 21B and second electrode branch parts 22B.

In some embodiments, widths of the first contact electrode 26*a* and the second contact electrode 26*b* measured in a direction may be greater than widths of the first electrode 21 and the second electrode 22 or the first electrode branch part 21B and the second electrode branch part 22B measured in the direction, respectively. However, the disclosure is not limited thereto, and in some embodiments, the first contact electrode 26*a* and the second contact electrode 26*b* may be disposed to cover only one side portions of the first electrode branch part 21B and the second electrode branch part 22B, respectively.

The display device 10 may include a circuit element layer positioned below the respective electrodes 21 and 22, and a third insulating layer 53 (see FIG. 33) and a passivation layer 55 (see FIG. 33) disposed to cover at least portions of the respective electrodes 21 and 22 and the light emitting element 30, in addition to the second insulating layer 52. Hereinafter, a structure of the display device 10 will be described in detail with reference to FIG. 33.

FIG. 33 is a schematic cross-sectional view taken along line Xa-Xa', line Xb-Xb', and line Xc-Xc' of FIG. 32.

FIG. 33 illustrates only a cross section of the first sub-pixel PX1, which may be equally applied to other pixels PX or sub-pixels PXn. FIG. 33 illustrates a schematic cross section crossing an end and another end of the light emitting element 30 disposed in the first sub-pixel PX1.

Although not illustrated in FIG. 33, the display device 10 may further include a circuit element layer positioned below the respective electrodes 21 and 22. The circuit element layer may include multiple semiconductor layers and multiple conductive patterns, and may include at least one transistor and a power line.

Referring to FIGS. 32 and 33, the display device 10 may include a first insulating layer 51, the electrodes 21 and 22, the light emitting elements 30, and the like, disposed on the first insulating layer 51. A circuit element layer (not illustrated) may be further disposed below the first insulating layer 51. The first insulating layer 51 may include an organic insulating material to perform a surface planarization function.

The internal banks 41 and 42, the external bank 43, the electrodes 21 and 22, and the light emitting elements 30 may be disposed on the first insulating layer 51.

The external bank 43 may serve to prevent the ink in which the light emitting elements 30 are dispersed from crossing the boundaries between the sub-pixels PXn when the ink is jetted using the inkjet printing device of FIG. 1 described above, at the time of manufacturing the display device 10. The external bank 43 may separate inks in which different light emitting elements 30 are dispersed for each of the different sub-pixels PXn from each other so that these inks are not mixed with each other. However, the disclosure is not limited thereto.

The internal banks 41 and 42 may include a first internal bank 41 and a second internal bank 42 disposed adjacent to a central portion of each sub-pixel PXn.

The first internal bank 41 and the second internal bank 42 may be disposed to be spaced apart from and face each other. The first electrode 21 may be disposed on the first internal bank 41, and the second electrode 22 may be disposed on the second internal bank 42. Referring to FIGS. 32 and 33, it may be understood that the first electrode branch part 21B may be disposed on the first internal bank 41 and the second electrode branch part 22B may be disposed on the second internal bank 42.

The first internal bank 41 and the second internal bank 42 may be disposed to extend in the fifth direction DR5 in each sub-pixel PXn. However, the disclosure is not limited thereto, and the first internal bank 41 and the second internal bank 42 may be disposed for each sub-pixel PXn to form a pattern in the entirety of the display device 10. The internal banks 41 and 42 and the external banks 43 may include polyimide (PI), but are not limited thereto.

The first internal bank 41 and the second internal bank 42 may have a structure in which at least portions thereof protrude with respect to the first insulating layer 51. The first internal bank 41 and the second internal bank 42 may protrude upward with respect to a plane on which the light emitting elements 30 are disposed, and at least portions of the protruding portions may have an inclination. Since the internal banks 41 and 42 protrude with respect to the first insulating layer 51 and have inclined side surfaces, light emitted from the light emitting elements 30 may be reflected from the inclined side surfaces of the internal banks 41 and 42. As described later, in case that the electrodes 21 and 22 disposed on the internal banks 41 and 42 include a material having high reflectivity, the light emitted from the light emitting elements 30 may be reflected by the electrodes 21 and 22 and travel in an upward direction of the first insulating layer 51.

The external bank 43 may be disposed at the boundaries between the adjacent sub-pixels PXn to form a lattice pattern, but the internal banks 41 and 42 may be disposed within each sub-pixel PXn and have a shape in which they extend in a direction.

The electrodes 21 and 22 may be disposed on the first insulating layer 51 and the internal banks 41 and 42, respectively. As described above, the electrodes 21 and 22 may include the electrode stem parts 21S and 22S and the electrode branch parts 21B and 22B, respectively.

Partial areas of the first electrode 21 and the second electrode 22 may be disposed on the first insulating layer 51, and the other partial areas of the first electrode 21 and the second electrode 22 may be disposed on the first internal bank 41 and the second internal bank 42, respectively. As described above, the first electrode stem part 21S of the first electrode 21 and the second electrode stem part 22S of the second electrode 22 may extend in the fourth direction DR4, and the first internal bank 41 and the second internal bank 42 may extend in the fifth direction DR5 and may also be disposed in adjacent sub-pixels PXn in the fifth direction DR5.

The first electrode contact hole CNTD penetrating through the first insulating layer 51 and exposing a portion of the circuit element layer may be formed in the first electrode stem part 21S of the first electrode 21. The first electrode 21 may be electrically connected to a transistor of the circuit element layer through the first electrode contact hole CNTD. A predetermined (or selectable) electrical signal may be transferred from the transistor to the first electrode 21.

The second electrode stem part 22S of the second electrode 22 may extend in a direction and may also be disposed in the non-emission area in which the light emitting elements 30 are not disposed. The second electrode contact hole CNTS penetrating through the first insulating layer 51 and exposing a portion of the circuit element layer may be formed in the second electrode stem part 22S. The second electrode 22 may be electrically connected to a power source electrode through the second electrode contact hole CNTS. A predetermined (or selectable) electrical signal may be transferred from the power source electrode to the second electrode 22.

Partial areas of the first electrode 21 and the second electrode 22, for example, the first electrode branch part 21B and the second electrode branch part 22B may be disposed on the first internal bank 41 and the second internal bank 42, respectively. The light emitting elements 30 may be disposed in an area between the first electrode 21 and the second electrode 22, for example, in a space where the first electrode branch part 21B and the second electrode branch part 22B are spaced apart from and face each other.

Each of the electrodes 21 and 22 may include a transparent conductive material. For example, each of the electrodes 21 and 22 may include a material such as indium tin oxide (ITO), indium zinc oxide (IZO), or indium tin zinc oxide (ITZO), but is not limited thereto. In some embodiments, each of the electrodes 21 and 22 may include a conductive material having high reflectivity. For example, each of the electrodes 21 and 22 may include a metal such as silver (Ag), copper (Cu), or aluminum (Al) as the material having the high reflectivity. Light incident on each of the electrodes 21 and 22 may be reflected to be emitted in an upward direction of each sub-pixel PXn.

The electrodes 21 and 22 may have a structure in which one or more layers made of the transparent conductive material and one or more layers made of the metal having the high reflectivity are stacked each other or may be formed as one layer including the transparent conductive material and the metal having the high reflectivity. In an embodiment, each of the electrodes 21 and 22 may have a stacked structure of ITO/silver (Ag)/ITO/IZO or be made of an alloy including aluminum (Al), nickel (Ni), lanthanum (La), and the like. However, the disclosure is not limited thereto.

The second insulating layer 52 may be disposed on the first insulating layer 51, the first electrode 21, and the second electrode 22. The second insulating layer 52 may be disposed to partially cover the first electrode 21 and the second electrode 22. The second insulating layer 52 may be disposed to cover most of upper surfaces of the first electrode 21 and the second electrode 22, but may expose portions of the first electrode 21 and the second electrode 22. The second insulating layer 52 may be disposed so that portions of the upper surfaces of the first electrode 21 and the second electrode 22, for example, portions of an upper surface of the first electrode branch part 21B disposed on the first internal bank 41 and an upper surface of the second electrode branch part 22B disposed on the second internal bank 42 are exposed. For example, the second insulating layer 52 may be substantially entirely formed on the first insulating layer 51, but may include openings partially exposing the first electrode 21 and the second electrode 22.

In an embodiment, the second insulating layer 52 may have a step formed so that a portion of an upper surface thereof is recessed between the first electrode 21 and the second electrode 22. In some embodiments, the second insulating layer 52 may include an inorganic insulating material, and a portion of the upper surface of the second insulating layer 52 disposed to cover the first electrode 21 and the second electrode 22 may be recessed due to a step of a member disposed below the second insulating layer 52. The light emitting element 30 disposed on the second insulating layer 52 between the first electrode 21 and the second electrode 22 may form an empty space between the light emitting element 30 and the recessed upper surface of the second insulating layer 52. The light emitting element 30 may be disposed to be partially spaced apart from the upper surface of the second insulating layer 52, and a material constituting a third insulating layer 53 to be described later may be filled in the space. However, the disclosure is not limited thereto. The second insulating layer 52 may form a flat upper surface on which the light emitting element 30 is disposed thereon.

The second insulating layer 52 may insulate the first electrode 21 and the second electrode 22 from each other while protecting the first electrode 21 and the second electrode 22. The second insulating layer 52 may prevent the light emitting elements 30 disposed on the second insulating layer 52 from being in direct contact with and being damaged by other members. However, a shape and a structure of the second insulating layer 52 are not limited thereto.

The light emitting elements 30 may be disposed on the second insulating layer 52 between the respective electrodes 21 and 22. For example, at least one light emitting element 30 may be disposed on the second insulating layer 52 disposed between the respective electrode branch parts 21B and 22B. However, the disclosure is not limited thereto, and although not illustrated in the drawings, at least some of the light emitting elements 30 disposed in each sub-pixel PXn may also be disposed in an area other than an area between the electrode branch parts 21B and 22B. The light emitting elements 30 may be disposed on respective ends of the first electrode branch part 21B and the second electrode branch part 22B facing each other, and may be electrically connected to the respective electrodes 21 and 22 through the contact electrodes 26.

The light emitting element 30 may include multiple layers disposed in a direction parallel to the first insulating layer 51. The light emitting element 30 of the display device 10 according to an embodiment may have a shape in which it extends in a direction, and may have a structure in which multiple semiconductor layers are sequentially disposed in the direction. As described above, in the light emitting element 30, the first semiconductor layer 31, the active layer 36, the second semiconductor layer 32, and the electrode layer 37 may be sequentially disposed along the direction, and the insulating film 38 may surround outer surfaces of the first semiconductor layer 31, the active layer 36, the second semiconductor layer 32, and the electrode layer 37. The light emitting element 30 disposed in the display device 10 may be disposed so that the direction in which the light emitting element 30 extends is parallel to the first insulating layer 51, and the semiconductor layers included in the light emitting element 30 may be sequentially disposed along the direction parallel to an upper surface of the first insulating layer 51. However, the disclosure is not limited thereto. In some embodiments, in case that the light emitting element 30 has another structure, the layers may also be disposed in a direction perpendicular to the first insulating layer 51.

An end of the light emitting element 30 may be in contact with the first contact electrode 26a, and another end of the light emitting element 30 may be in contact with the second contact electrode 26b. According to an embodiment, end surfaces of the light emitting element 30 extending in the direction are exposed without the insulating film 38, and thus, the light emitting element 30 may be in contact with the first contact electrode 26a and the second contact electrode 26b to be described later in the exposed areas. However, the disclosure is not limited thereto. In some embodiments, at least partial areas of the insulating film 38 of the light emitting element 30 are removed, such that both end surfaces of the light emitting element 30 may be partially exposed.

The third insulating layer 53 may be partially disposed on the light emitting element 30 disposed between the first electrode 21 and the second electrode 22. The third insulating layer 53 may be disposed to partially surround an outer surface of the light emitting element 30. The third insulating layer 53 may protect the light emitting element 30 and may serve to fix the light emitting element 30 in a process of manufacturing the display device 10. In an embodiment, a portion of the third insulating layer 53 may be disposed between a lower surface of the light emitting element 30 and an upper surface of the second insulating layer 52. As described above, the third insulating layer 53 may be formed to fill a space between the second insulating layer 52 and the light emitting element 30 formed during the process of manufacturing the display device 10. Accordingly, the third insulating layer 53 may be formed to surround the outer surface of the light emitting element 30. However, the disclosure is not limited thereto.

The third insulating layer 53 may be disposed to extend in the fifth direction DR5 between the first electrode branch part 21B and the second electrode branch part 22B in a plan view. For example, the third insulating layer 53 may have an island shape or a linear shape in a plan view on the first insulating layer 51. According to an embodiment, the third insulating layer 53 may be disposed on the light emitting element 30.

The first contact electrode 26a and the second contact electrode 26b may be disposed on the electrodes 21 and 22, respectively, and may be disposed on the third insulating layer 53. The first contact electrode 26a and the second contact electrode 26b may be disposed to be spaced apart from each other on the third insulating layer 53. The third insulating layer 53 may insulate the first contact electrode 26a and the second contact electrode 26b from each other so that the first contact electrode 26a and the second contact electrode 26b are not in direct contact with each other.

The first contact electrode 26a may be in contact with the exposed partial area of the first electrode 21 on the first internal bank 41, and the second contact electrode 26b may be in contact with the exposed partial area of the second electrode 22 on the second internal bank 42. The first contact electrode 26a and the second contact electrode 26b may transfer the electrical signals transferred from the respective electrodes 21 and 22 to the light emitting element 30.

The contact electrode 26 may include a conductive material. For example, the contact electrode 26 may include ITO, IZO, ITZO, aluminum (Al), or the like. However, the disclosure is not limited thereto.

The passivation layer 55 may be disposed on the contact electrode 26 and the third insulating layer 53. The passivation layer 55 may serve to protect members disposed on the first insulating layer 51 from an external environment.

Each of the second insulating layer 52, the third insulating layer 53, and the passivation layer 55 described above may include an inorganic insulating material or an organic insulating material. In an embodiment, the second insulating layer 52, the third insulating layer 53, and the passivation layer 55 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). The second insulating layer 52, the third insulating layer 53, and the passivation layer 55 may include an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethylmethacrylate, polycarbonate, a polymethylmethacrylate-polycarbonate synthetic resin, and the like, as the organic insulating material. However, the disclosure is not limited thereto.

Figure 34:
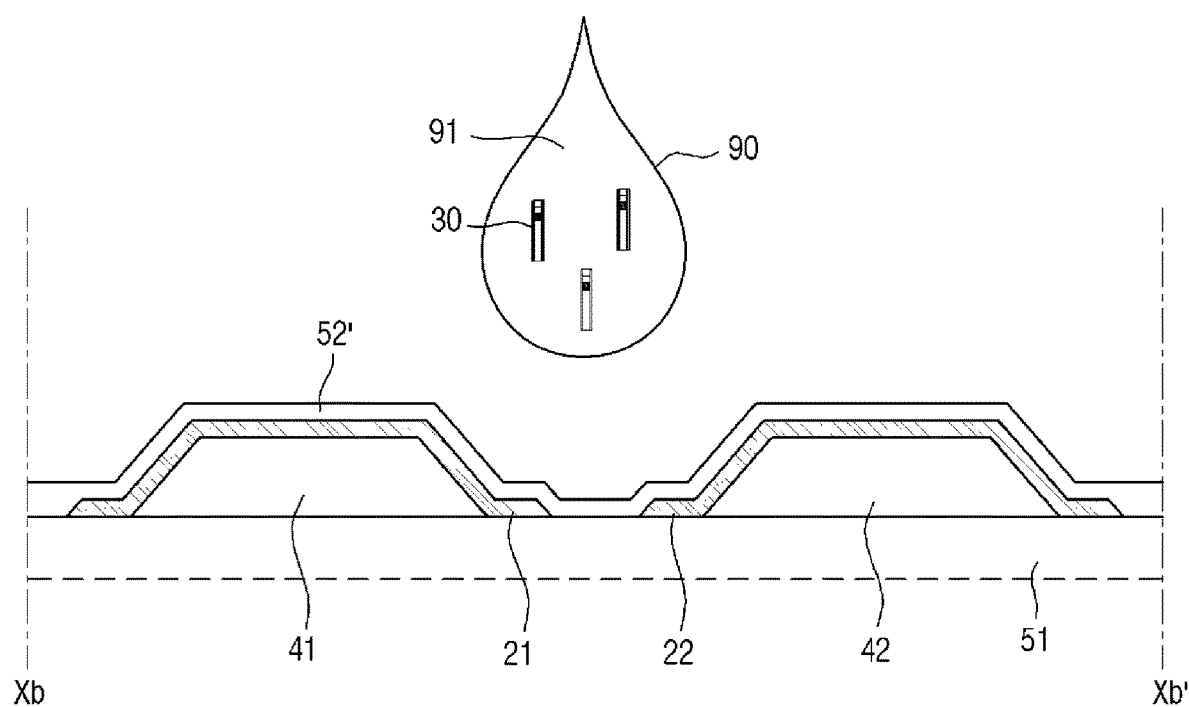
FIGS. 34 to 36 are schematic cross-sectional views illustrating some processes of a method for manufacturing the display device according to an embodiment.
Figure 35:
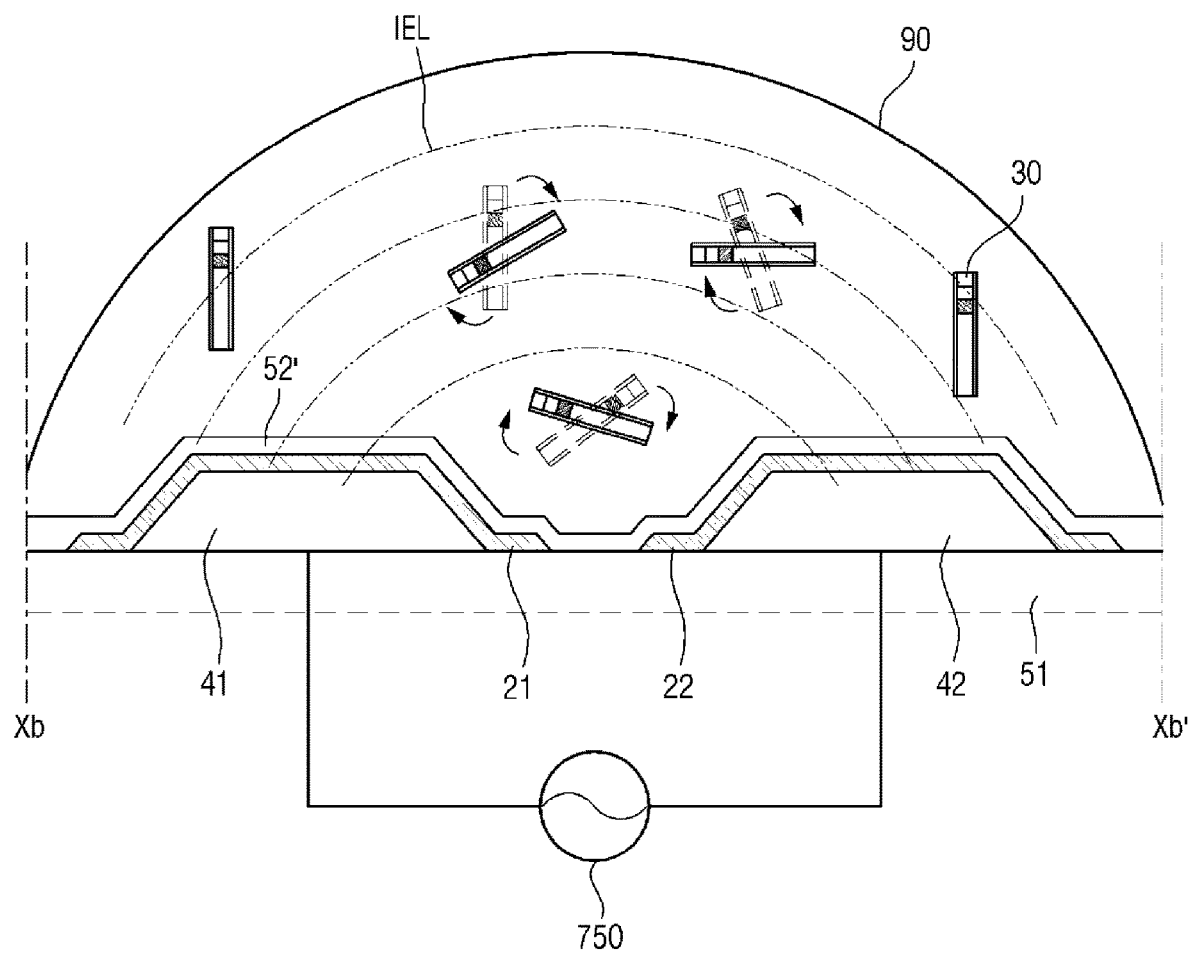
Figure 36:
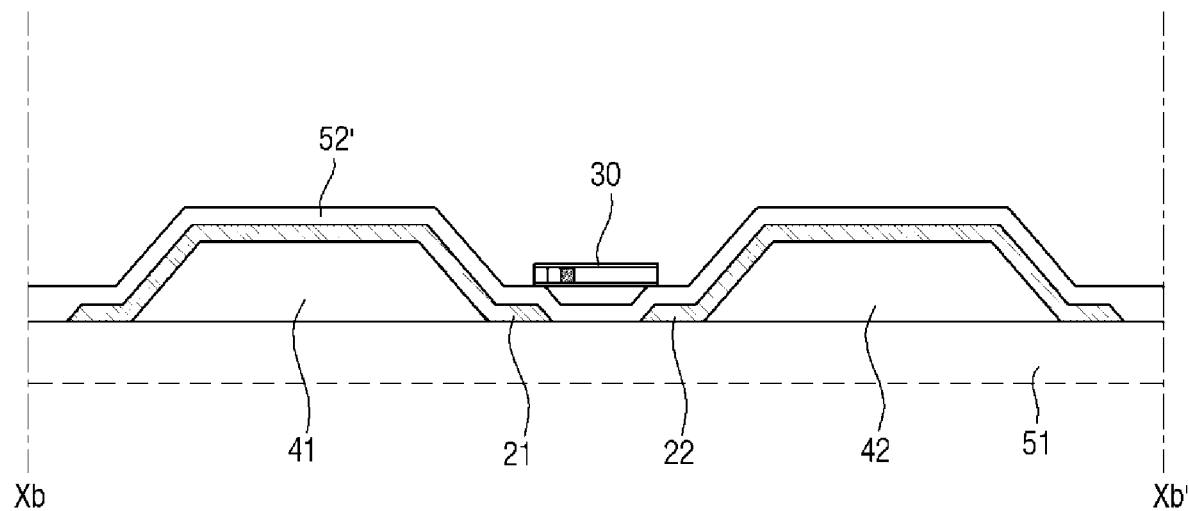

FIGS. 34 to 36 are schematic cross-sectional views illustrating some processes of a method for manufacturing the display device according to an embodiment.

Referring to FIGS. 34 to 36, the display device 10 according to an embodiment may be manufactured using the inkjet printing device 1000 described above with reference to FIG. 1. The inkjet printing device 1000 may jet the ink 90 in which the light emitting elements 30 are dispersed, and the light emitting elements 30 may be disposed between the first electrode 21 and the second electrode 22 of the display device 10.

First, as illustrated in FIG. 34, the first insulating layer 51, the first internal bank 41 and the second internal bank 42 disposed spaced apart from each other on the first insulating layer 51, the first electrode 21 and the second electrode 22 disposed on the first internal bank 41 and the second internal bank 42, respectively, and a second insulating material layer 52' covering the first electrode 21 and the second electrode 22 may be prepared. The second insulating material layer 52' may be partially patterned in a subsequent process to form the second insulating layer 52 of the display device 10. The members described above may be formed by patterning a metal, an inorganic material, an organic material, or the like by a general mask process.

The ink 90 in which the light emitting elements 30 are dispersed may be jetted onto the first electrode 21 and the second electrode 22. The light emitting element 30 may be a type of bipolar element, and the ink 90 in which the light emitting elements 30 are dispersed may be jetted using the inkjet printing device 1000 and the method for printing the bipolar elements described above. As illustrated in the drawing, the inkjet printing device 1000 according to an embodiment may discharge the ink 90 while uniformly maintaining the number of light emitting elements 30 in the ink 90. A description thereof is the same as that described above, and a detailed description will thus be omitted.

As illustrated in FIG. 35, an electrical signal may be applied to the first electrode 21 and the second electrode 22 to generate an electric field IEL in the ink 90 in which the light emitting elements 30 are dispersed. The light emitting elements 30 may receive a dielectrophoretic force transferred by the electric field IEL, and may be seated on the first electrode 21 and the second electrode 22 while their orientation directions and positions change.

As illustrated in FIG. 36, the solvent 91 of the ink 90 may be removed. The light emitting elements 30 may be disposed between the first electrode 21 and the second electrode 22 through the processes described above. Thereafter, although not illustrated in the drawings, the second insulating material layer 52' may be patterned to form the second insulating layer 52, and the third insulating layer 53, the first contact electrode 26a, the second contact electrode 26b, and the passivation layer 55 may be formed to manufacture the display device 10.

A shape and a material of the light emitting element 30 are not limited to those of FIG. 30. In some embodiments, the light emitting element 30 may include more layers or may have other shapes.

Figure 37:
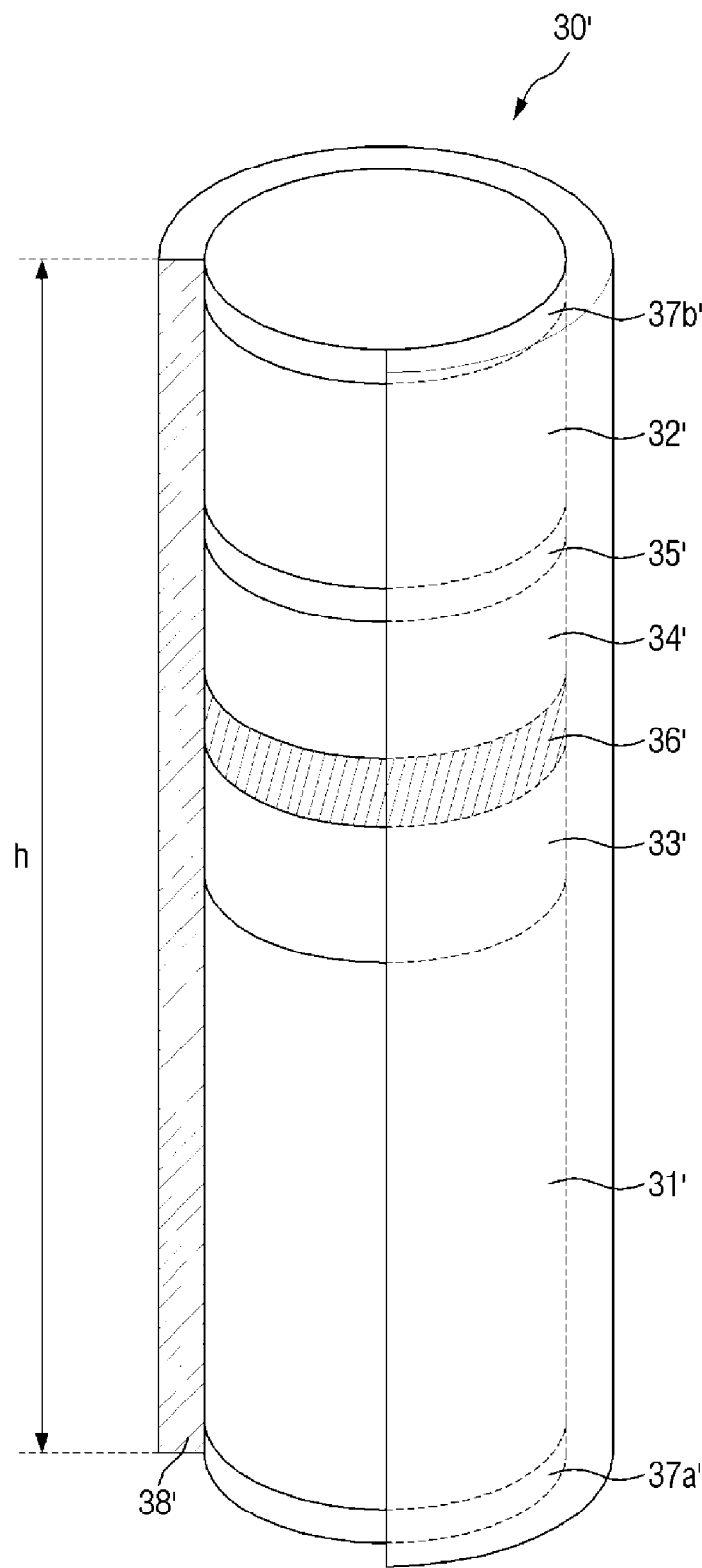
FIGS. 37 and 38 are schematic views of light emitting elements according to another embodiment.
Figure 38:
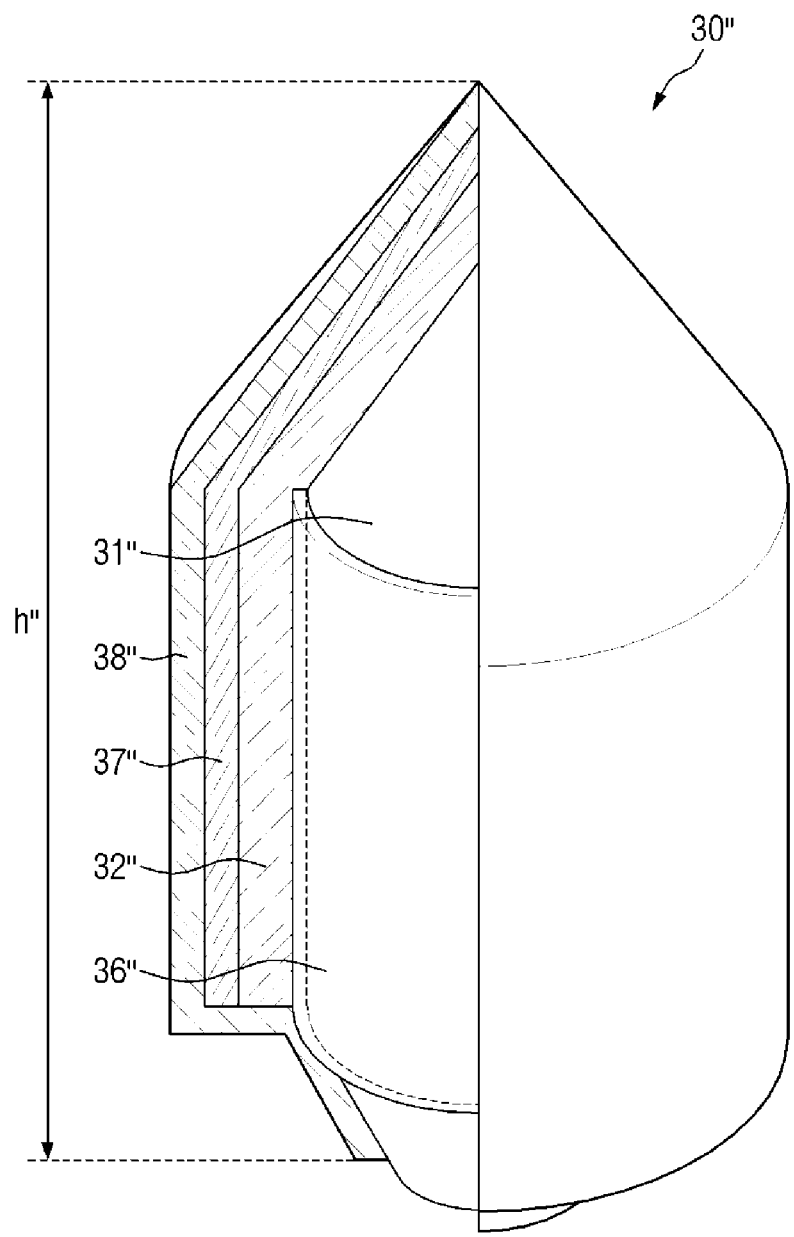

FIGS. 37 and 38 are schematic views of light emitting elements according to another embodiment.

Referring to FIG. 37, a light emitting element 30' according to the embodiment may further include a third semiconductor layer 33' disposed between a first semiconductor layer 31' and an active layer 36', and a fourth semiconductor layer 34' and a fifth semiconductor layer 35' disposed between the active layer 36' and a second semiconductor layer 32'. The light emitting element 30' is different from the light emitting element according to the embodiment of FIG. 30 in that multiple semiconductor layers 33', 34', and 35' and electrode layers 37a' and 37b' are further disposed and the active layer 36' contains other elements. A disposition and a structure of an insulating film 38' is substantially the same as those in FIG. 30.

As described above, in the light emitting element 30 of FIG. 30, the active layer 36 may include nitrogen (N) to emit the blue or green light. On the other hand, in the light emitting element 30' of FIG. 37, the active layer 36' and other semiconductor layers may be semiconductors including at least phosphorus (P), respectively. For example, the light emitting element 30' according to the embodiment may emit red light having a central wavelength band in the range of about 620 nm to about 750 nm. However, it is to be understood that the central wavelength band of the red light is not limited to the above-described range and may include all wavelength ranges that may be recognized as red in the technical field.

The first semiconductor layer 31' may be an n-type semiconductor layer, and in case that the light emitting element 30' emits red light, the first semiconductor layer 31' may include a semiconductor material having a chemical formula of $In_xAl_yGa_{1-x-y}P$ ($0 \le x \le 1$, $0 \le y \le 1$, and $0 \le x+y \le 1$). For example, the first semiconductor layer 31' may be made of one or more of InAlGaP, GaP, AlGaP, InGaP, AlP, and InP doped with an n-type dopant. The first semiconductor layer 31' may be doped with an n-type dopant, which may include Si, Ge, Sn, or the like. In an embodiment, the first semiconductor layer 31' may be made of AlGaInP doped with n-type Si. A length of the first semiconductor layer 31' may be in the range of about 1.5 μm to about 5 μm, but is not limited thereto.

The second semiconductor layer 32' may be a p-type semiconductor layer, and in case that the light emitting element 30' emits red light, the second semiconductor layer 32' may include a semiconductor material having a chemical formula of $In_xAl_yGa_{1-x-y}P$ ($0 \le x \le 1$, $0 \le y \le 1$, and $0 \le x+y \le 1$). For example, the second semiconductor layer 32' may be made of one or more of InAlGaP, GaP, AlGaNP, InGaP, AlP, and InP doped with a p-type dopant. The second semiconductor layer 32' may be doped with a p-type dopant, which may include Mg, Zn, Ca, Se, Ba, or the like. In the embodiment, the second semiconductor layer 32' may be made of GaN doped with p-type Mg. A length of the second semiconductor layer 32' may be in the range of about 0.08 μm to about 0.25 μm, but is not limited thereto.

The active layer 36' may be disposed between the first semiconductor layer 31' and the second semiconductor layer 32'. Like the active layer 36 of FIG. 30, the active layer 36' of FIG. 37 may include a material having a single or multiple quantum well structure to emit light of a specific wavelength band. For example, in case that the active layer 36' emits light of a red wavelength band, the active layer 36' may include a material such as AlGaP or AlInGaP. In particular, in case that the active layer 36' has the multiple quantum well structure, for example, a structure in which quantum layers and well layers are alternately stacked each other, the quantum layers may include a material such as AlGaP or AlInGaP, and the well layers may include a material such as GaP or AlInP. In the embodiment, the active layer 36' may include AlGaInP as a material of the quantum layers and AlInP as a material of the well layers to emit red light having a central wavelength band of about 620 nm to about 750 nm.

The light emitting element 30' may include clad layers disposed adjacent to the active layer 36'. As illustrated in drawing, the third semiconductor layer 33' and the fourth semiconductor layer 34' disposed between the first semiconductor layer 31' and the second semiconductor layer 32' below and above the active layer 36', respectively, may be the clad layers.

The third semiconductor layer 33' may be disposed between the first semiconductor layer 31' and the active layer 36'. The third semiconductor layer 33' may be an n-type semiconductor like the first semiconductor layer 31', and may include a semiconductor material having a chemical formula of $In_xAl_yGa_{1-x-y}P$ ($0 \le x \le 1$, $0 \le y \le 1$, and $0 \le x+y \le 1$). In an embodiment, the first semiconductor layer 31' may be made of n-AlGaInP, and the third semiconductor layer 33' may be made of n-AlInP. However, the disclosure is not limited thereto.

The fourth semiconductor layer 34' may be disposed between the active layer 36' and the second semiconductor layer 32'. The fourth semiconductor layer 34' may be an n-type semiconductor like the second semiconductor layer 32', and may include a semiconductor material having a chemical formula of $In_xAl_yGa_{1-x-y}P$ ($0 \le x \le 2$, $0 \le y \le 1$, and $0 \le x+y \le 1$). In an embodiment, the second semiconductor layer 32' may be made of p-GaP, and the fourth semiconductor layer 34' may be made of p-AlInP.

The fifth semiconductor layer 35' may be disposed between the fourth semiconductor layer 34' and the second semiconductor layer 32'. The fifth semiconductor layer 35' may be a semiconductor doped with a p-type dopant like the second semiconductor layer 32' and the fourth semiconductor layer 34'. In some embodiments, the fifth semiconductor layer 35' may serve to reduce a difference in lattice constant between the fourth semiconductor layer 34' and the second semiconductor layer 32'. For example, the fifth semiconductor layer 35' may be a tensile strain barrier reducing (TSBR) layer. For example, the fifth semiconductor layer 35' may include p-GaInP, p-AlInP, p-AlGaInP, or the like, but is not limited thereto. Lengths of the third semiconductor layer 33', the fourth semiconductor layer 34', and the fifth semiconductor layer 35' may be in the range of about 0.08 μm to about 0.25 μm, but are not limited thereto.

A first electrode layer 37a' and a second electrode layer 37b' may be disposed on the first semiconductor layer 31' and the second semiconductor layer 32', respectively. The first electrode layer 37a' may be disposed on a lower surface of the first semiconductor layer 31', and the second electrode layer 37b' may be disposed on an upper surface of the second semiconductor layer 32'. However, the disclosure is not limited thereto, and at least one of the first electrode layer 37a' and the second electrode layer 37b' may be omitted. For example, in the light emitting element 30', the first electrode layer 37a' may not be disposed on the lower surface of the first semiconductor layer 31', and only one second electrode layer 37b' may be disposed on the upper surface of the second semiconductor layer 32'.

Referring to FIG. 38, a light emitting element 30" may have a shape in which it extends in a direction, but may have a shape in which side surfaces thereof are partially inclined. For example, the light emitting element 30" according to the embodiment may have a partially conical shape.

The light emitting element 30" may be formed so that multiple layers are not stacked each other in a direction and the respective layers surround an outer surface of another layer. The light emitting element 30" may be formed so that the semiconductor layers surround at least a portion of an outer surface of another layer. The light emitting element 30" may include a semiconductor core of which at least a partial area extends in a direction and an insulating film 38" formed to surround the semiconductor core. The semiconductor core may include a first semiconductor layer 31", an active layer 36", a second semiconductor layer 32", and an electrode layer 37". The light emitting element 30" is the same as the light emitting element 30 of FIG. 30 except that shapes of the respective layers are partially different. Hereinafter, a description of the same content will be omitted, and contents different from those described above will be described.

According to the embodiment, the first semiconductor layer 31" may be formed to extend in a direction and to have both ends inclined toward a central portion. The first semiconductor layer 31" may have a body portion having a rod shape or a cylindrical shape and ends formed at upper and lower portions of the body portion, respectively, and formed to have inclined side surfaces. An upper end of the body portion may have a steeper inclination than a lower end of the body portion.

The active layer 36" may be disposed to surround an outer surface of the body portion of the first semiconductor layer 31". The active layer 36" may have a ring shape in which it extends in a direction. The active layer 36" may not be formed on an upper end and a lower end of the first semiconductor layer 31". The active layer 36" may be formed only on non-inclined side surfaces of the first semiconductor layer 31". However, the disclosure is not limited thereto. Accordingly, light emitted from the active layer 36" may be emitted not only to both ends of the light emitting element 30" in a length direction, but also to both side surfaces of the light emitting element 30" with respect to the length direction. The active layer 36" of the light emitting element 30" of FIG. 38 may have a greater area than that of the light emitting element 30 of FIG. 30 to emit a greater amount of light than that of the light emitting element 30 of FIG. 28.

The second semiconductor layer 32" may be disposed to surround an outer surface of the active layer 36" and the upper end of the first semiconductor layer 31". The second semiconductor layer 32" may include a body portion extending in a direction and having a ring shape and an upper end formed to have inclined side surfaces. For example, the second semiconductor layer 32" may be in direct contact with parallel side surfaces of the active layer 36" and the inclined upper end of the first semiconductor layer 31". However, the second semiconductor layer 32" may be not formed on the lower end of the first semiconductor layer 31".

The electrode layer 37" may be disposed to surround an outer surface of the second semiconductor layer 32". For example, a shape of the electrode layer 37" may be substantially the same as that of the second semiconductor layer 32". For example, the electrode layer 37" may be in entirely contact with the outer surface of the second semiconductor layer 32".

The insulating film 38" may be disposed to surround outer surfaces of the electrode layer 37" and the first semiconductor layer 31". The insulating film 38" may be in direct contact with the lower end of the first semiconductor layer 31" and exposed lower ends of the active layer 36" and the second semiconductor layer 32" as well as the electrode layer 37".

The display device 10 in which the number of light emitting elements 30 disposed per pixel PX and sub-pixel PXn is uniform may be manufactured using the inkjet printing device 1000 according to an embodiment. In the display device 10, a deviation in the number of light emitting elements 30 per pixel PX and sub-pixel PXn may be minimized, and light emission reliability for each pixel PX may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. An inkjet printing device comprising:
an inkjet head positioned above a stage and comprising a plurality of nozzles through which ink including bipolar elements having areas doped with partially different polarities is discharged;
an actuator disposed on the inkjet head and adjusting an amount of droplet of the ink discharged through the plurality of nozzles; and
at least one sensing part disposed on the inkjet head and measuring a number of bipolar elements discharged through the plurality of nozzles.

2. The inkjet printing device of claim 1, wherein the inkjet head further comprises:
a base part,
a discharge part disposed on the base part, and
an inner pipe to which the ink is supplied,
the plurality of nozzles are disposed on the discharge part,
the ink is supplied to and flows in the inner pipe, and
the ink is discharged through the plurality of nozzles.

3. The inkjet printing device of claim 2, wherein the at least one sensing part comprises:
a first sensor measuring a magnetic force in the ink generated due to movement of the bipolar elements, and
a second sensor transferring a signal based on the number of the bipolar elements calculated from the magnetic force measured by the first sensor to the actuator.

4. The inkjet printing device of claim 3, wherein the actuator receives the signal based on the number of bipolar elements measured by the at least one sensing part and adjusts the amount of droplet of the ink discharged through the plurality of nozzles.

5. The inkjet printing device of claim 3, wherein the at least one sensing part is disposed at an inlet of the inner pipe to which the ink is supplied.

6. The inkjet printing device of claim 5, wherein the inlet of the inner pipe has a first portion and a second portion,
a diameter of the first portion is smaller than a diameter of the second portion, and
the at least one sensing part is disposed on the first portion of the inlet of the inner pipe.

7. The inkjet printing device of claim 5, further comprising:
a sub-actuator disposed on the inkjet head and adjusting a diameter of the inner pipe,
wherein the sub-actuator increases a flow velocity of the ink in the inner pipe.

8. The inkjet printing device of claim 3, wherein the at least one sensing part is disposed between an inlet of the inner pipe and the plurality of nozzles.

9. The inkjet printing device of claim 3, wherein the at least one sensing part is disposed on the discharge part.

10. The inkjet printing device of claim 3, wherein the at least one sensing part further comprises a light emitting part irradiating the bipolar elements with light.

11. The inkjet printing device of claim 10, wherein the base part of the inkjet head includes a transparent material.

12. A method for printing bipolar elements, comprising:
preparing ink in which a plurality of bipolar elements are dispersed;
supplying the ink to an inkjet head;
discharging the ink from the inkjet head;
measuring a number of the plurality of bipolar elements in the discharged ink; and
adjusting an amount of droplet of the discharged ink from the inkjet head in case that the number of the plurality of bipolar elements in the discharged ink exceeds a reference value.

13. The method for printing bipolar elements of claim 12, wherein
the measuring of the number of the plurality of bipolar elements in the discharged ink is performed by at least one sensing part disposed on the inkjet head, and
the at least one sensing part measures a magnetic force in the ink generated due to movement of the plurality of bipolar elements.

14. The method for printing bipolar elements of claim 13, wherein the adjusting of the amount of droplet of the discharged ink comprises:
sensing a change in the number of the plurality of bipolar elements by the at least one sensing part, and
adjusting the amount of droplet of the discharged ink per unit process based on the change in the number of the plurality of bipolar elements.

15. The method for printing bipolar elements of claim 14, wherein
the ink discharged from the inkjet head is provided onto a target substrate, and
the method for printing bipolar elements further comprises seating the plurality of bipolar elements on the target substrate.

16. The method for printing bipolar elements of claim 15, wherein
a plurality of areas are defined on the target substrate, and
the amount of droplet of the discharged ink is adjusted so that the numbers of the plurality of bipolar elements provided onto the areas are uniform based on the sensed change in the number of the plurality of bipolar elements.

17. The method for printing bipolar elements of claim 13, wherein
the measuring of the number of the plurality of bipolar elements in the discharged ink is performed using an inkjet printing device, and
the inkjet printing device comprises:
the inkjet head positioned above a stage and comprising a plurality of nozzles through which the ink comprising the plurality of bipolar elements having areas doped with partially different polarities is discharged; and
an actuator disposed on the inkjet head and adjusting the amount of droplet of the discharged ink through the plurality of nozzle; and
the at least one sensing part measures the number of the plurality of bipolar elements discharged through the plurality of nozzles.

18. The method for printing bipolar elements of claim 17, wherein the actuator adjusts the amount of droplet of the ink discharged through the plurality of nozzles based on a change in the number of the plurality of bipolar elements measured by the at least one sensing part.

19. A method for manufacturing a display device, comprising:
preparing a target substrate comprising a plurality of areas divided from each other and having a first electrode and a second electrode, each of the first electrode and the second electrode disposed in one of the plurality of areas;
discharging ink onto the plurality of areas while controlling an amount of droplet of the discharged ink based on a number of light emitting elements dispersed in the ink; and
seating the light emitting elements on one of the first electrode and the second electrode.

20. The method for manufacturing a display device of claim 19, further comprising:
measuring the number of light emitting elements in the discharged ink, and
controlling the number of light emitting elements in the discharged ink by adjusting the amount of droplet of the discharged ink in case that the number of the light emitting elements in the discharged ink exceeds a reference value.

21. The method for manufacturing a display device of claim 20, wherein the light emitting element comprises:
a first semiconductor layer doped with a first polarity,
a second semiconductor layer doped with a second polarity different from the first polarity, and
an active layer disposed between the first semiconductor layer and the second semiconductor layer.

22. The method for manufacturing a display device of claim 21, wherein the measuring of the number of light emitting elements in the discharged ink comprises measuring a magnetic force in the ink due to movement of the light emitting elements.

* * * * *